(12) United States Patent
Kubouchi

(10) Patent No.: US 12,057,497 B2
(45) Date of Patent: Aug. 6, 2024

(54) SEMICONDUCTOR DEVICE

(71) Applicant: FUJI ELECTRIC CO., LTD., Kanagawa (JP)

(72) Inventor: Motoyoshi Kubouchi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 452 days.

(21) Appl. No.: 17/356,589

(22) Filed: Jun. 24, 2021

(65) Prior Publication Data

US 2021/0351284 A1    Nov. 11, 2021

Related U.S. Application Data

(63) Continuation of application No. PCT/JP2020/018838, filed on May 11, 2020.

(30) Foreign Application Priority Data

Jul. 12, 2019   (JP) ................................ 2019-130017

(51) Int. Cl.
  *H01L 29/73*   (2006.01)
  *H01L 29/10*   (2006.01)
  (Continued)

(52) U.S. Cl.
  CPC ...... *H01L 29/7397* (2013.01); *H01L 29/1095* (2013.01); *H01L 29/861* (2013.01)

(58) Field of Classification Search
  CPC ............. H01L 29/7397; H01L 29/1095; H01L 29/861; H01L 29/0619; H01L 29/0638;
  (Continued)

(56) References Cited

U.S. PATENT DOCUMENTS

2011/0012195 A1    1/2011   Momota
2013/0037853 A1    2/2013   Onozawa
  (Continued)

FOREIGN PATENT DOCUMENTS

JP   2011238681 A   11/2011
JP   2015135954 A    7/2015
  (Continued)

OTHER PUBLICATIONS

Office Action issued for counterpart Japanese Application No. 2022-158641, transmitted from the Japanese Patent Office on Nov. 28, 2023 (drafted on Nov. 21, 2023).
  (Continued)

*Primary Examiner* — Mohammed Shamsuzzaman

(57) ABSTRACT

A semiconductor device includes: an inner region including a base region of a second conductivity type provided between an upper surface of the semiconductor substrate and the drift region; and well regions having a higher doping concentration than that of the base region, provided from the upper surface of the semiconductor substrate to a depth position greater than a lower end of the base region, and arranged with the inner region interposed therebetween at the upper surface of the semiconductor substrate. The inner region includes a longitudinal side in a predetermined longitudinal direction at the upper surface of the semiconductor substrate and a plurality of trench portions which extend from the upper surface of the semiconductor substrate to the drift region. At least one of the trench portions is separated into two or more partial trenches in the longitudinal direction, in a region which does not overlap the well regions.

20 Claims, 36 Drawing Sheets

(51) Int. Cl.
*H01L 29/739* (2006.01)
*H01L 29/861* (2006.01)

(58) Field of Classification Search
CPC ............. H01L 29/0696; H01L 29/0603; H01L 29/083; H01L 29/0834; H01L 29/407; H01L 29/417; H01L 29/4238; H01L 29/8613; H01L 21/8234; H01L 27/06; H01L 29/78
See application file for complete search history.

(56) References Cited

U.S. PATENT DOCUMENTS

| | | | | |
|---|---|---|---|---|
| 2016/0141400 | A1* | 5/2016 | Takahashi | H01L 29/7391 257/140 |
| 2016/0336404 | A1* | 11/2016 | Naito | H01L 29/42368 |
| 2017/0018548 | A1 | 1/2017 | Laven | |
| 2017/0025410 | A1* | 1/2017 | Cheng | H01L 29/0834 |
| 2018/0337233 | A1* | 11/2018 | Naito | H01L 29/7396 |
| 2018/0350960 | A1 | 12/2018 | Naito | |
| 2018/0366578 | A1* | 12/2018 | Naito | H01L 29/66348 |
| 2019/0096878 | A1 | 3/2019 | Arakawa | |
| 2019/0096989 | A1* | 3/2019 | Yoshida | H01L 27/0761 |
| 2019/0139772 | A1 | 5/2019 | Kodama | |
| 2020/0058735 | A1* | 2/2020 | Naito | H01L 29/0834 |
| 2020/0161423 | A1* | 5/2020 | Naito | H01L 29/404 |
| 2020/0335497 | A1* | 10/2020 | Mitsuzuka | H01L 29/8613 |
| 2020/0388611 | A1* | 12/2020 | Onozawa | H01L 29/407 |
| 2020/0395215 | A1* | 12/2020 | Kubouchi | H01L 29/0611 |
| 2021/0111253 | A1* | 4/2021 | Kubouchi | H01L 29/407 |
| 2022/0278202 | A1* | 9/2022 | Naito | H01L 29/4238 |
| 2023/0261044 | A1* | 8/2023 | Sawa | H01L 29/32 257/327 |

FOREIGN PATENT DOCUMENTS

| | | | | |
|---|---|---|---|---|
| JP | 2016096222 | A | 5/2016 | |
| JP | 2016219772 | A | 12/2016 | |
| JP | 2016219774 | A | 12/2016 | |
| JP | 2017022381 | A | 1/2017 | |
| JP | 2017224685 | A | 12/2017 | |
| JP | 6477885 | B2 * | 3/2019 | ......... H01L 27/0664 |
| JP | 2019068036 | A | 4/2019 | |
| JP | 2019121786 | A * | 7/2019 | ......... H01L 21/8249 |
| WO | 2009096412 | A1 | 8/2009 | |
| WO | 2011111500 | A1 | 9/2011 | |
| WO | 2018105299 | A1 | 6/2018 | |
| WO | 2018110703 | A1 | 6/2018 | |
| WO | 2019098271 | A1 | 5/2019 | |

OTHER PUBLICATIONS

International Search Report and (ISA/237) Written Opinion of the International Search Authority for International Patent Application No. PCT/JP2020/018838, mailed by the Japan Patent Office on Jul. 21, 2020.

* cited by examiner

SEMICONDUCTOR DEVICE

The contents of the following Japanese patent applications are incorporated herein by reference:
NO. 2019-130017 filed in JP on Jul. 12, 2019, and
PCT/JP2020/018838 filed in WO on May 11, 2020

BACKGROUND

1. Technical Field

The present invention relates to the semiconductor device.

2. Related Art

Conventionally, a semiconductor apparatus which includes a semiconductor device such as an IGBT (insulated gate bipolar transistor) and an FWD (free wheel diode) has been known. (For example, refer to Patent Document 1.)
Patent Document 1: WO2018/105299

DESCRIPTION OF EXEMPLARY EMBODIMENTS

Figure 1:
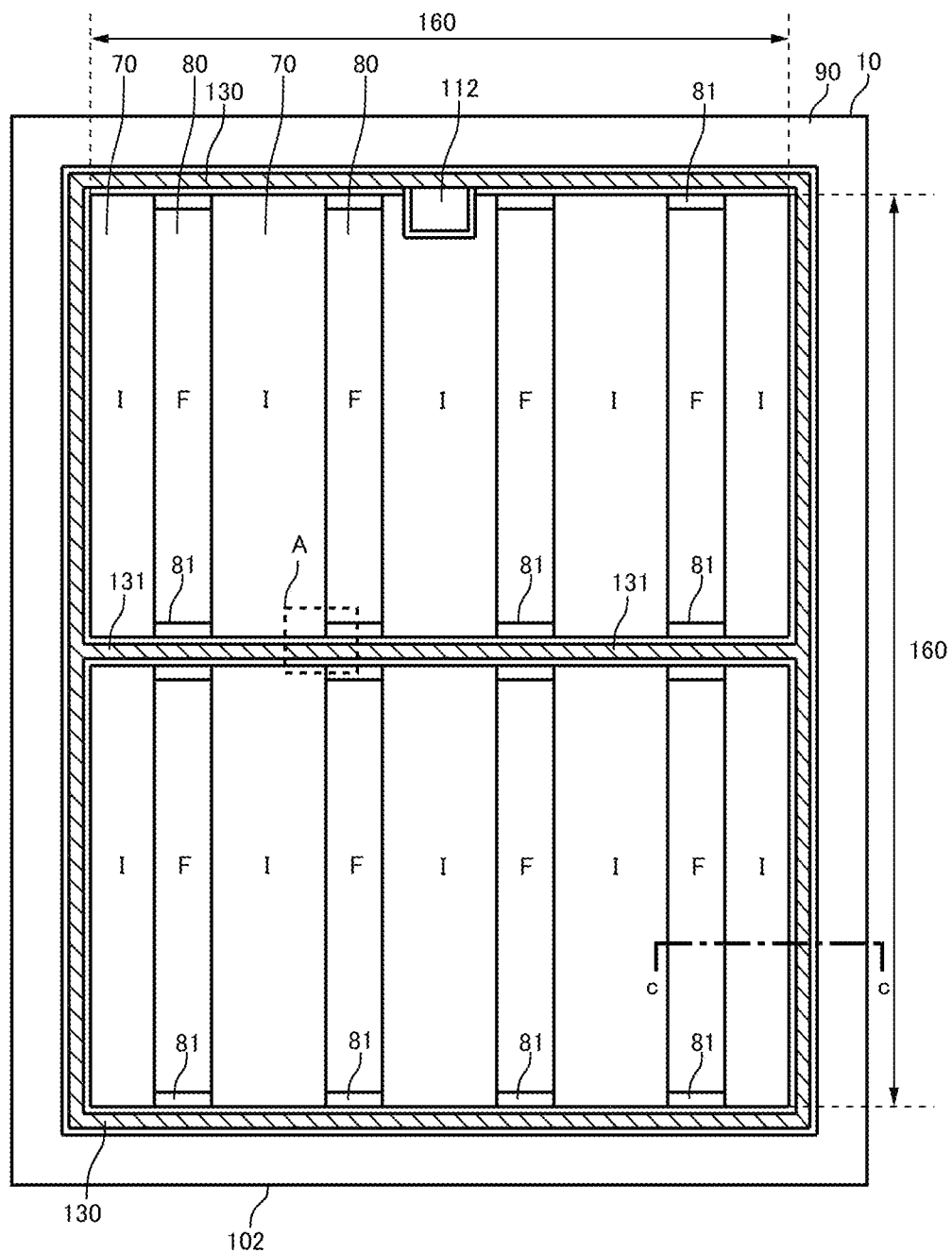
FIG. 1 is a top view which illustrates an example of a semiconductor device 100 according to an embodiment of the present invention.

Hereinafter, the present invention will be described through embodiments of the invention. However, the following embodiments do not limit the invention defined in the claims. In addition, all combinations of the features described in the embodiments are not necessarily required for the solution of the invention.

As used herein, one side is referred to as an 'upper' side and the other side is referred to as a 'lower' side in a direction parallel to a depth direction of a semiconductor substrate. One surface is referred to as an 'upper surface', and the other surface is referred to as a 'lower surface' of two principal surfaces of a substrate, a layer or other members. The 'upper' and 'lower' directions are not limited to the gravity direction or a direction when implemented on a semiconductor device.

As used herein, the technical matters may be described using the orthogonal coordinate axes of the X axis, the Y axis and the Z axis. The orthogonal coordinate axes merely locate a relative position of a component, but not limit a specific direction. For example, the Z axis does not necessarily indicate a height direction with respect to the ground. Note that the +Z axis direction and the −Z axis direction are opposite to each other. When the Z axis direction is referred to without indicating positive or negative, it represents a direction parallel to the +Z axis and the −Z axis.

As used herein, the orthogonal axes parallel to the upper surface and the lower surface of the semiconductor substrate are referred to as the X axis and the Y axis. In addition, the axis perpendicular to the upper surface and the lower surface of the semiconductor substrate is referred to as the Z axis. As used herein, the direction of the Z axis may be referred to as a depth direction. In addition, as used herein, a direction parallel to the upper surface and the lower surface of the semiconductor substrate may be referred to as a horizontal direction, including the X axis direction and the Y axis direction.

As used herein, even if elements are "the same" or "equal", there may be an error due to a variation in manufacturing or the like. Such an error is within 10%, for example.

As used herein, a conductivity type of a doping region doped with impurities is described as the P type or an the N type. As used herein, the impurities may particularly represent either a donor of the N type or an acceptor of the P type, and may be described as a dopant. As used herein, doping represents implanting a donor or an acceptor into the semiconductor substrate to obtain a semiconductor presenting a conductivity type of the N type or a semiconductor presenting a conductivity type of the P type.

As used herein, a doping concentration represents a concentration of the donor or a concentration of the acceptor in a thermal equilibrium state. As used herein, a net doping concentration represents a net concentration obtained by adding the donor concentration as a concentration of positive ions to the acceptor concentration as a concentration of negative ions, taking into account the polarities of the charges. As an example, the net doping concentration at any position is given as $N_D-N_A$, where the donor concentration is $N_D$ and the acceptor concentration is $N_A$.

The donor has a function of supplying electrons to a semiconductor. The acceptor has a function of receiving electrons from a semiconductor. The donor and the acceptor are not limited to the impurities per se. For example, a VOH defect which is a combination of a vacancy (V), an oxygen (O), and a hydrogen (H) existing in a semiconductor functions as the donor that supplies electrons.

As used herein, a description of the P+ type or the N+ type represents a higher doping concentration than that of the P type or the N type, and a description of the P− type or N− type represents a lower doping concentration than that of the P type or the N type. In addition, as used herein, a description of the P++ type or the N++ type represents a higher doping concentration than that of the P+ type or the N+ type.

As used herein, a chemical concentration refers to a concentration of impurities, which is measured regardless of the state of electrical activation. The chemical concentration can be measured by way of, for example, the secondary ion mass spectrometry (SIMS). The net doping concentration mentioned above can be measured by way of the voltage-capacitance profiling (CV profiling). In addition, a carrier concentration measured by way of the spreading resistance profiling (SR profiling) may be treated as the net doping concentration. The carrier concentration measured by way of the CV profiling or the SR profiling may be treated as a value in the thermal equilibrium state. In addition, in a region of the N type, the donor concentration is sufficiently higher than the acceptor concentration, and thus the carrier concentration of said region may be treated as the donor concentration. Similarly, in a region of the P type, the carrier concentration of said region may be treated as the acceptor concentration.

In addition, when a concentration distribution of the donor, the acceptor, or the net doping has a peak in a region, a value of the peak may be treated as the concentration of the donor, the acceptor, or the net doping in said region. If the concentration of the donor, the acceptor, or the net doping is approximately constant in a region, for example, an average value of the concentration of the donor, the acceptor, or the net doping in said region may be treated as the concentration of the donor, the acceptor, or the net doping.

The carrier concentration measured by way of the SR profiling may be lower than the concentration of the donor or the acceptor. When a spreading resistance is measured, the carrier mobility of the semiconductor substrate may be lower in an area where a current flows than a value in the crystal state. The carrier mobility is lowered when carriers are scattered due to a disorder of the crystal structure caused by a lattice defect or the like.

The concentration of the donor or the acceptor calculated from the carrier concentration measured by way of the CV profiling or the SR profiling may be lower than a chemical concentration of an element indicating the donor or the acceptor. As an example, in a silicon semiconductor, a donor concentration of phosphorus or arsenic serving as a donor, or an acceptor concentration of boron serving as an acceptor is approximately 99% of the chemical concentrations of these elements. On the other hand, in a silicon semiconductor, a donor concentration of hydrogen serving as a donor is approximately 0.1% to 10% of a chemical concentration of hydrogen.

FIG. 1 is a top view which illustrates an example of a semiconductor device 100 according to an embodiment of the present invention. FIG. 1 illustrates a position on an upper surface of a semiconductor substrate 10 onto which each member is projected. FIG. 1 illustrates only some members of the semiconductor device 100 and omits some members.

The semiconductor device 100 includes the semiconductor substrate 10. The semiconductor substrate 10 includes an end side 102 in a top view. As used herein, when merely referred to as a top view, it represents a view from the side of the upper surface of the semiconductor substrate 10. The semiconductor substrate 10 of the present example includes two pairs of the end sides 102 each of which opposes to each other in a top view. In FIG. 1, the X axis and the Y axis are parallel to any of the end sides 102. In addition, the Z axis is perpendicular to the upper surface of the semiconductor substrate 10.

The semiconductor substrate 10 is provided with an active portion 160. The active portion 160 is a region where a main current flows between the upper surface and a lower surface of the semiconductor substrate 10 in the depth direction when the semiconductor device 100 operates. An emitter electrode is provided above the active portion 160, although it is omitted in FIG. 1.

The active portion 160 is provided at least one of a transistor portion 70 including a transistor device such as an IGBT and a diode portion 80 including a diode device such as a free wheel diode (FWD). In the example of FIG. 1, the transistor portions 70 and the diode portions 80 are arranged alternately along a predetermined arrangement direction (the X axis direction in the present example) on the upper surface of the semiconductor substrate 10. In another example, the active portion 160 may be provided with either the transistor portion 70 or the diode portion 80.

In FIG. 1, a region of the transistor portion 70 is indicated by a symbol "I" and a region of the diode portion 80 is indicated by a symbol "F". As used herein, a direction perpendicular to the arrangement direction in a top view may be referred to as an extending direction (the Y axis direction in FIG. 1). The transistor portion 70 and the diode portion 80 may have a longitudinal side in the extending direction, respectively. That is, the length of the transistor portion 70 in the Y axis direction is greater than the width thereof in the X axis direction. Similarly, the length of the diode portion 80 in the Y axis direction is greater than the width thereof in the X axis direction. The extending direction of the transistor portion 70 and the diode portion 80 may be the same as a longitudinal direction of each trench portion which will be described below.

The diode portion 80 includes a cathode region of the N+ type in a region in contact with the lower surface of the semiconductor substrate 10. As used herein, the region provided with the cathode region is referred to as the diode portion 80. That is, the diode portion 80 is a region which overlaps with the cathode region in a top view. The lower surface of the semiconductor substrate 10 may be provided with a collector region of the P+ type in a region not provided with the cathode region. As used herein, an extended region 81 in which the diode portion 80 is extended in the Y axis direction to a gate runner described below may be included in the diode portion 80. The extended region 81 is provided with the collector region at its lower surface.

The transistor portion 70 includes the collector region of the P+ type in a region in contact with the lower surface of the semiconductor substrate 10. In addition, the transistor portion 70 includes an emitter region of the N type, a base region of the P type, and a gate structure including a gate conductive portion and a gate insulating film at the side of the upper surface of the semiconductor substrate 10, which are arranged in a periodic manner.

The semiconductor device 100 may include one or more pads above the semiconductor substrate 10. The semiconductor device 100 of the present example includes a gate pad 112. The semiconductor device 100 may include pads such as an anode pad, a cathode pad and a current sensing pad. Each pad is arranged in the vicinity of the end side 102. The vicinity of the end side 102 refers to a region between the end side 102 and the emitter electrode in a top view. When the semiconductor device 100 is implemented, each pad may be connected to an external circuit via a wiring such as a wire.

The gate pad 112 is a pad to which a gate potential is applied. The gate pad 112 is electrically connected to a conductive portion of a gate trench portion of the active portion 160. The semiconductor device 100 includes the gate runner to connect the gate pad 112 with the gate trench portion. In FIG. 1, the gate runner is hatched with inclined lines.

The gate runner of the present example includes an outer peripheral gate runner 130 and an active side gate runner 131. The outer peripheral gate runner 130 is arranged between the active portion 160 and the end sides 102 of the semiconductor substrate 10 in a top view. The outer peripheral gate runner 130 of the present example surrounds the active portion 160 in a top view. A region surrounded by the outer peripheral gate runner 130 in a top view may be referred to as the active portion 160. In addition, the outer peripheral gate runner 130 is connected to the gate pad 112. The outer peripheral gate runner 130 is arranged above the semiconductor substrate 10. The outer peripheral gate runner 130 may be a metal wiring containing aluminum or the like.

The active side gate runner 131 is provided in the active portion 160. Providing the active side gate runner 131 in the active portion 160 can reduce a variation in length of the wiring from the gate pad 112 for each region of the semiconductor substrate 10.

The active side gate runner 131 is connected to the gate trench portion in the active portion 160. The active side gate runner 131 is arranged above the semiconductor substrate 10. The active side gate runner 131 may be a wiring formed of a semiconductor such as polysilicon doped with impurities. The active side gate runner 131 may be formed of the same material as that of the outer peripheral gate runner 130.

The active side gate runner 131 may be connected to the outer peripheral gate runner 130. The active side gate runner 131 of the present example is provided to extend in the X axis direction so as to cross the active portion 160 at substantially the center in the Y axis direction, from one outer peripheral gate runner 130 to the other outer peripheral gate runner 130. If the active portion 160 is divided by the active side gate runner 131, the transistor portions 70 and the diode portions 80 may be alternately arranged in the X axis direction in each divided region.

In addition, the semiconductor device 100 may also include a temperature sensing portion (not shown) which is a PN junction diode formed of polysilicon or the like, and a current sensing portion (not shown) which simulates an operation of the transistor portion provided in the active portion 160.

The semiconductor device 100 of the present example includes an edge termination structure portion 90 between the active portion 160 and the end sides 102. The edge termination structure portion 90 of the present example is arranged between the outer peripheral gate runner 130 and the end sides 102. The edge termination structure portion 90 reduces an electric field concentration at the side of the upper surface of the semiconductor substrate 10. The edge termination structure portion 90 may include a plurality of guard rings. The guard ring is a region of the P type in contact with the upper surface of the semiconductor substrate 10. Providing a plurality of guard rings can extend a depletion layer at the upper surface side of the active portion 160 to the outside so as to improve the breakdown voltage of the semiconductor device 100. The edge termination structure portion 90 may further include at least one of a field plate and an RESURF provided in a circular form surrounding the active portion 160.

Figure 2:
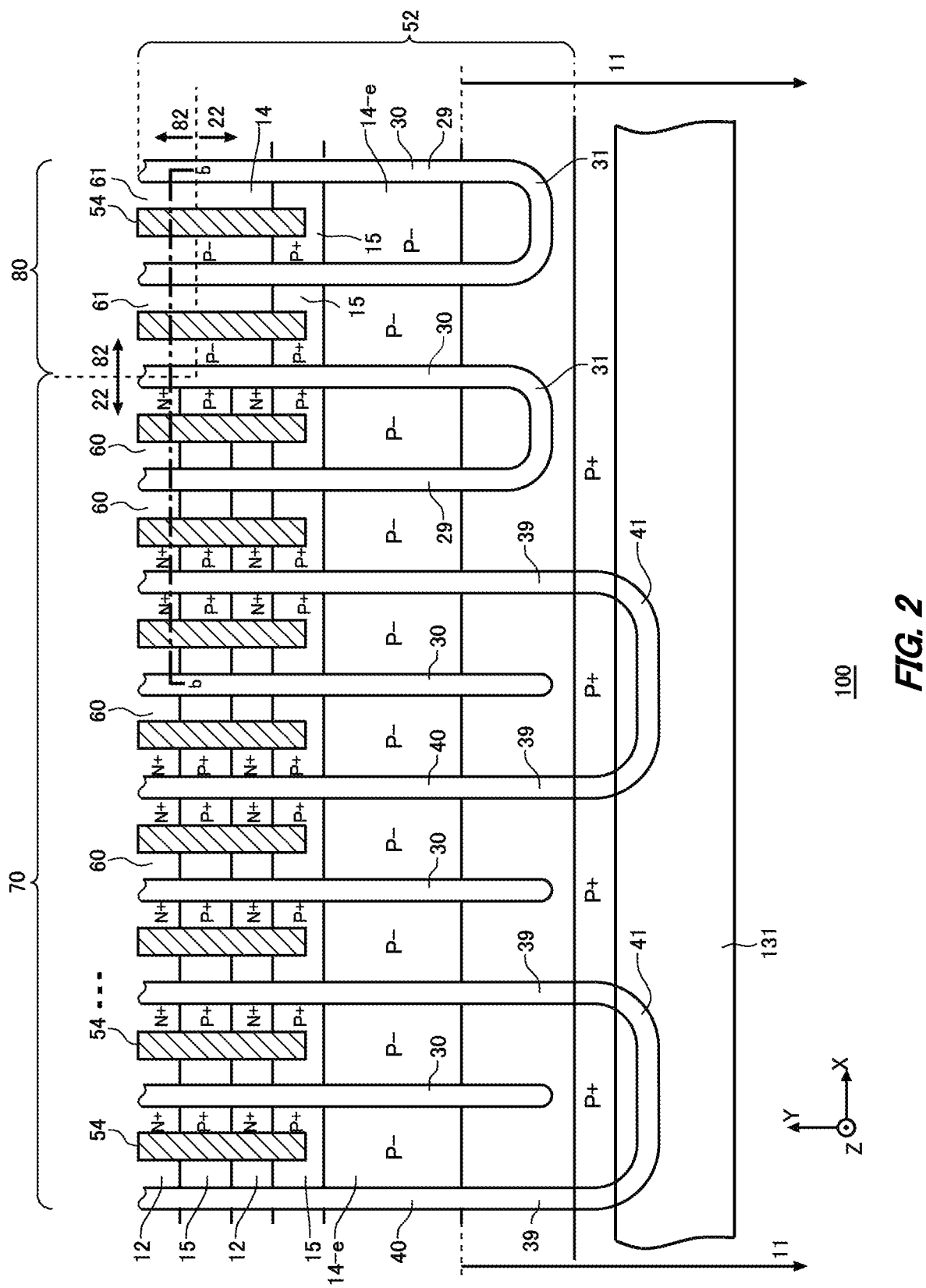
FIG. 2 is an enlarged view of the region A in FIG. 1.

FIG. 2 is an enlarged view of the region A in FIG. 1. The region A is a region including the transistor portion 70, the diode portion 80, and the active side gate runner 131. The semiconductor device 100 of the present example includes a gate trench portion 40, a dummy trench portion 30, a well region 11, an emitter region 12, a base region 14, and a contact region 15 that are provided inside the semiconductor substrate 10 at the upper surface side thereof. The gate trench portion 40 and the dummy trench portion 30 are an example of a trench portion, respectively. In addition, the semiconductor device 100 of the present example includes an emitter electrode 52 and the active side gate runner 131 provided above the upper surface of the semiconductor substrate 10. The emitter electrode 52 and the active side gate runner 131 are provided to be separated from each other.

An interlayer dielectric film is provided between the emitter electrode 52 and the active side gate runner 131 and the upper surface of the semiconductor substrate 10, although it is omitted in FIG. 1. In the interlayer dielectric film of the present example, a contact hole 54 is provided to extend through said interlayer dielectric film. In FIG. 2, the respective contact holes 54 are hatched with inclined lines.

The emitter electrode 52 is provided above the gate trench portion 40, the dummy trench portion 30, the well region 11, the emitter region 12, the base region 14 and the contact region 15. The emitter electrode 52 is in contact with the emitter region 12, the contact region 15 and the base region 14 at the upper surface of the semiconductor substrate 10, through the contact hole 54. In addition, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction.

The active side gate runner 131 is connected to the gate trench portion 40 through the contact hole provided in the interlayer dielectric film. The active side gate runner 131 may be connected to a gate conductive portion of the gate trench portion 40 at an edge portion 41 of the gate trench portion 40 in the Y axis direction. The active side gate runner 131 is not connected to the dummy conductive portion in the dummy trench portion 30.

The emitter electrode 52 is formed of a material containing metal. FIG. 2 illustrates an area where the emitter electrode 52 is provided. For example, at least a part of regions of the emitter electrode 52 is formed of aluminum or an aluminum-silicon alloy. The emitter electrode 52 may include a barrier metal formed of titanium, a titanium compound or the like, underlying a region formed of aluminum or the like. Further, a plug may be included in the contact hole, where the plug is formed of tungsten or the like embedded to be in contact with the barrier metal and aluminum or the like.

The well region 11 is provided to overlap the active side gate runner 131. The well region 11 is also provided to extend in an area which does not overlap the active side gate runner 131 for a predetermined width. The well region 11 of the present example is provided to extend away from an end of the contact hole 54 in the Y axis direction to the active side gate runner 131 side. The well region 11 is a region of a second conductivity type having a higher doping concentration than the base region 14. The base region 14 of the present example is P− type and the well region 11 is the P+ type. In addition, the well region 11 is formed from the upper surface of the semiconductor substrate 10 to a depth position greater than the lower end of the base region 14.

Each of the transistor portion 70 and the diode portion 80 includes a plurality of trench portions arranged in the arrangement direction. The transistor portion 70 of the present example includes one or more gate trench portions 40 and one or more dummy trench portions 30 alternately provided along the arrangement direction. The diode portion 80 of the present example includes a plurality of dummy trench portions 30 provided along the arrangement direction. The diode portion 80 of the present example is not provided with the gate trench portion 40.

The gate trench portion 40 of the present example may include two linear portions 39 extending along the extending direction perpendicular to the arrangement direction (portions of a trench that are linear along the extending direction), and the edge portion 41 connecting the two linear portions 39. The extending direction in FIG. 2 is the Y axis direction.

Preferably, at least a part of the edge portion 41 is provided in a curved shape in a top view. The edge portion 41 connects the end portions of the two linear portions 39 in the Y axis direction with each other such that the electric field concentration at the end portions of the linear portions 39 can be reduced.

In the transistor portion 70, the dummy trench portion 30 is provided between the respective linear portions 39 of the gate trench portion 40. Between the respective linear portions 39, one dummy trench portion 30 may be provided, or a plurality of dummy trench portions 30 may be provided.

The dummy trench portion 30 may have a linear shape which extends in the extending direction, and may include a linear portion 29 and an edge portion 31, in the similar manner to the gate trench portion 40. The semiconductor device 100 illustrated in FIG. 2 includes both of the dummy trench portion 30 of a linear shape without the edge portion 31 and the dummy trench portion 30 having the edge portion 31.

A diffusion depth of the well region 11 may be greater than the depth of the gate trench portion 40 and the dummy trench portion 30. The gate trench portion 40 and the dummy trench portion 30 include the end portions in the Y axis direction provided in the well region 11 in a top view. That is, at the end portion of each trench portion in the Y axis direction, a bottom portion of each trench portion in the depth direction is covered with the well region 11. This can reduce the electric field concentration at said bottom portion of each trench portion.

In the arrangement direction, a mesa portion is provided between the respective trench portions. The mesa portion refers to a region inside the semiconductor substrate 10 and interposed between the trench portions. As an example, an upper end of the mesa portion is the upper surface of the semiconductor substrate 10. A depth position of a lower end of the mesa portion is the same as a depth position of the lower end of the trench portion. The mesa portion of the present example is interposed between the trench portions adjacent in the X axis direction, and is provided to extend in the extending direction (the Y axis direction) along the trench at the upper surface of the semiconductor substrate 10. In the present example, the transistor portion 70 is provided with a mesa portion 60 and the diode portion 80 is provided with a mesa portion 61. As used herein, when merely referred to as a mesa portion, it refers to each of the mesa portion 60 and the mesa portion 61.

Each mesa portion is provided with the base region 14. In the base region 14 exposed to the upper surface of the semiconductor substrate 10 in the mesa portion, a region arranged closest to the active side gate runner 131 is referred to as a base region 14-e. While FIG. 2 illustrates the base region 14-e arranged at one end portion of each mesa portion in the extending direction, the base region 14-e is also arranged at the other end portion of each mesa portion. Each mesa portion may be provided with at least one of the emitter region 12 of a first conductivity type, and the contact region 15 of the second conductivity type in a region interposed between the base regions 14-e in a top view. In the present example, the emitter region 12 is the N+ type and the contact region 15 is the P+ type. The emitter region 12 and the contact region 15 may be provided between the base region 14 and the upper surface of the semiconductor substrate 10 in the depth direction.

The mesa portion 60 of the transistor portion 70 includes the emitter region 12 exposed to the upper surface of the semiconductor substrate 10. The emitter region 12 is provided in contact with the gate trench portion 40. The mesa portion 60 in contact with the gate trench portion 40 may be provided with the contact region 15 exposed to the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extending direction of the trench portion (the Y axis direction).

In another example, the contact region 15 and the emitter region 12 in the mesa portion 60 may be provided in a striped pattern along the extending direction of the trench portion (the Y axis direction). For example, the emitter region 12 is provided in a region in contact with the trench portion, and the contact region 15 is provided in a region interposed between the emitter regions 12.

The mesa portion 61 of the diode portion 80 is not provided with the emitter region 12. The mesa portion 61 may be provided with the base region 14 and the contact region 15 at the upper surface thereof. In the region interposed between the base regions 14-e at the upper surface of the mesa portion 61, the contact region 15 may be provided in contact with each base region 14-e. At the upper surface of the mesa portion 61, the base region 14 may be provided in a region interposed between the contact regions 15. The base region 14 may be arranged in the entire region interposed between the contact regions 15.

The contact hole 54 is provided above each mesa portion. The contact hole 54 is arranged in a region interposed between the base regions 14-e. The contact hole 54 of the present example is provided above the respective regions of the contact region 15, the base region 14 and the emitter region 12. The contact hole 54 is not provided in a region corresponding to the base region 14-e and the well region 11. The contact hole 54 may be arranged at the center of the mesa portion 60 in the arrangement direction (the X axis direction).

In the diode portion 80, the cathode region 82 of the N+ type is provided in a region adjacent to the lower surface of the semiconductor substrate 10. The lower surface of the semiconductor substrate 10 may be provided with the collector region 22 of the P+ type in a region not provided with the cathode region 82. FIG. 2 illustrates a boundary between the cathode region 82 and the collector region 22 by dot lines.

The cathode region 82 is arranged distant from the well region 11 in the Y axis direction. This can secure a distance between a region of the P type having a relatively high doping concentration and formed to a lower position (the well region 11) and the cathode region 82, thereby improving the breakdown voltage. In the present example, an end portion of the cathode region 82 in the Y axis direction is arranged more distant from the well region 11 than an end portion of the contact hole 54 in the Y axis direction. In another example, the end portion of the cathode region 82 in the Y axis direction may be arranged between the well region 11 and the contact hole 54.

Figure 3:
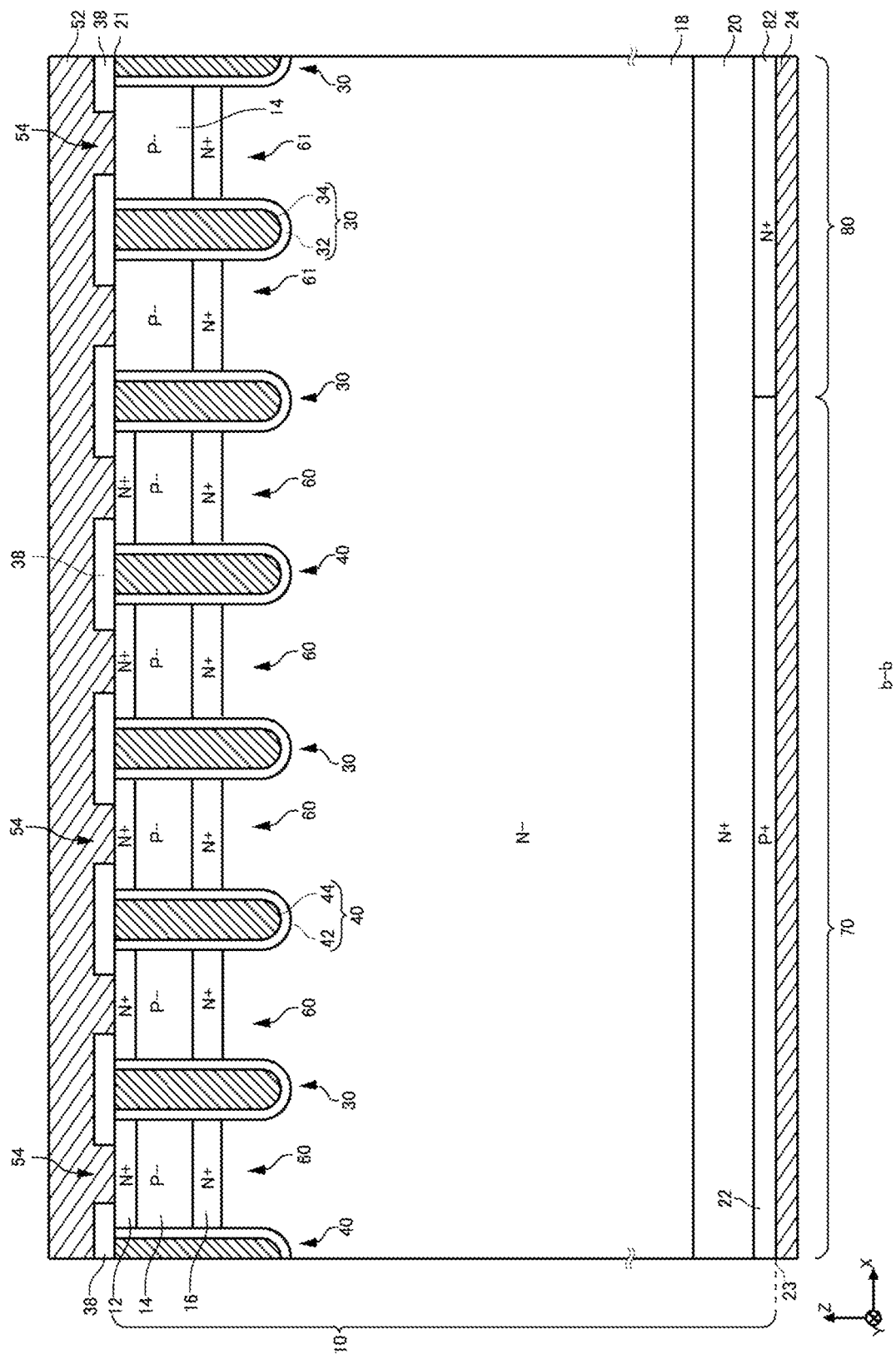
FIG. 3 is a diagram which illustrates an example of a cross section b-b in FIG. 2.

FIG. 3 is a diagram which illustrates an example of a cross section b-b in FIG. 2. The cross section b-b is an XZ plane which extends through the emitter region 12 and the cathode region 82. The semiconductor device 100 of the present example includes the semiconductor substrate 10, the interlayer dielectric film 38, the emitter electrode 52 and the collector electrode 24, in said cross section. The interlayer dielectric film 38 is provided on the upper surface of the semiconductor substrate 10. The interlayer dielectric film 38 is a film including at least one layer of an insulating film of silicate glass or the like to which impurities such as boron or phosphorus are added, a thermal oxide film, and other insulating films. The interlayer dielectric film 38 is provided with the contact hole 54 illustrated in FIG. 2.

The emitter electrode 52 is provided above the interlayer dielectric film 38. The emitter electrode 52 contacts the upper surface 21 of the semiconductor substrate 10 through the contact hole 54 of the interlayer dielectric film 38. The collector electrode 24 is provided at a lower surface 23 of the semiconductor substrate 10. The emitter electrode 52 and the collector electrode 24 are formed of a metal material such as aluminum. As used herein, the direction connecting the emitter electrode 52 to the collector electrode 24 is referred to as the depth direction (the Z axis direction).

The semiconductor substrate 10 includes a drift region 18 of the N− type. The drift region 18 is provided in each of the transistor portion 70 and the diode portion 80.

The mesa portion 60 of the transistor portion 70 is provided with the emitter region 12 of the N+ type and the base region 14 of the P− type in sequence from the side of the upper surface 21 of the semiconductor substrate 10. The drift region 18 is provided below the base region 14. The mesa portion 60 may also be provided with an accumulation region 16 of the N+ type. The accumulation region 16 is arranged between the base region 14 and the drift region 18.

The emitter region 12 is exposed to the upper surface 21 of the semiconductor substrate 10 and provided in contact with the gate trench portion 40. The emitter region 12 may be in contact with the trench portions at both sides of the mesa portion 60. The emitter region 12 has a higher doping concentration than the drift region 18.

The base region 14 is provided below the emitter region 12. The base region 14 of the present example is provided in contact with the emitter region 12. The base region 14 may be in contact with the trench portions at both sides of the mesa portion 60.

The accumulation region 16 is provided below the base region 14. The accumulation region 16 is a region of the N+ type having a higher doping concentration than the drift region 18. Providing the accumulation region 16 of the high concentration between the drift region 18 and the base region 14 can increase a carrier injection enhancement effect (IE effect), thereby reducing an ON voltage. The accumulation region 16 may be provided to cover the entire lower surface of the base region 14 in the mesa portion 60.

The mesa portion 61 of the diode portion 80 is provided with the base region 14 of the P− type in contact with the upper surface 21 of the semiconductor substrate 10. The drift region 18 is provided below the base region 14. In the mesa portion 61, the accumulation region 16 may be provided below the base region 14. Providing the accumulation region 16 in the diode portion 80 can suppress injection of holes from the base region 14 to the drift region 18 when the diode portion 80 is conducting. This can improve the switching characteristics.

In each of the transistor portion 70 and the diode portion 80, a buffer region 20 of the N+ type may be provided below the drift region 18. The buffer region 20 has a higher doping concentration than the doping concentration of the drift region 18. The buffer region 20 has one or more peaks of the donor concentration which are higher than the donor concentration of the drift region 18. A plurality of peaks of the donor concentration are arranged in different positions in the depth direction of the semiconductor substrate 10. The peaks of the donor concentration of the buffer region 20 may be peaks of the hydrogen (proton) or phosphorus concentration, for example. The buffer region 20 may function as a field stop layer which prevents a depletion layer extending from a lower end of the base region 14 from reaching the collector region 22 of the P+ type and the cathode region 82 of the N+ type.

In the transistor portion 70, the collector region 22 of the P+ type is provided below the buffer region 20. The collector region 22 has a higher acceptor concentration than an acceptor concentration of the base region 14. The collector region 22 may include an acceptor of the same kind as the base region 14 or may include an acceptor of a different kind. The collector region 22 includes an acceptor of boron, for example.

In the diode portion 80, the cathode region 82 of the N+ type is provided below the buffer region 20. The cathode region 82 has a higher donor concentration than a donor concentration of the drift region 18. The cathode region 82 includes a donor of hydrogen or phosphorus, for example. Note that elements of a donor and an acceptor in each region are not limited to the examples mentioned above. The collector region 22 and the cathode region 82 are exposed to the lower surface 23 of the semiconductor substrate 10 and connected to the collector electrode 24. The collector electrode 24 may contact the entire lower surface 23 of the semiconductor substrate 10. The emitter electrode 52 and the collector electrode 24 are formed of a metal material such as aluminum.

One or more gate trench portions 40 and one or more dummy trench portions 30 are provided at the side of the upper surface 21 of the semiconductor substrate 10. Each trench portion extends through the base region 14 from the upper surface 21 of the semiconductor substrate 10 to reach the drift region 18. In a region where at least any of the emitter region 12, the contact region 15 and the accumulation region 16 is provided, each trench portion also extends through these doping regions to reach the drift region 18. A structure including the trench portion which extends through the doping region is not limited to a structure manufactured by forming the trench portion after forming the doping region. A structure manufactured by forming the doping region between the trench portions after forming the trench portions is also included in the structure in which the trench portion extends through the doping region.

As mentioned above, the transistor portion 70 is provided with the gate trench portion 40 and the dummy trench portion 30. The diode portion 80 is provided with the dummy trench portion 30 and not provided with the gate trench portion 40. In the present example, the boundary between the diode portion 80 and the transistor portion 70 in the X axis direction is the boundary between the cathode region 82 and the collector region 22.

The gate trench portion 40 include a gate trench provided at the upper surface 21 of the semiconductor substrate 10, a gate insulating film 42 and a gate conductive portion 44. The gate insulating film 42 is provided to cover an inner wall of the gate trench. The gate insulating film 42 may be formed by oxidizing or nitriding a semiconductor of the inner wall of the gate trench. The gate conductive portion 44 is provided inside the gate insulating film 42 in the gate trench. That is, the gate insulating film 42 insulates the gate conductive portion 44 from the semiconductor substrate 10. The gate conductive portion 44 is formed of a conductive material such as polysilicon.

The gate conductive portion 44 may be provided to be longer than the base region 14 in the depth direction. The gate trench portion 40 in said cross section is covered with the interlayer dielectric film 38 on the upper surface 21 of the semiconductor substrate 10. The gate conductive portion 44 is electrically connected to a gate runner. When a predetermined gate voltage is applied to the gate conductive portion 44, a channel is formed by an inversion layer with electrons on a surface layer in the base region 14 at an interface in contact with the gate trench portion 40.

The dummy trench portion 30 may have the same structure as the gate trench portion 40 in said cross section. The dummy trench portion 30 includes a dummy trench provided at the upper surface 21 of the semiconductor substrate 10, a dummy insulating film 32 and a dummy conductive portion 34. The dummy conductive portion 34 is electrically connected to the emitter electrode 52. The dummy insulating film 32 is provided to cover an inner wall of the dummy trench. The dummy conductive portion 34 is provided in the dummy trench and provided inside the dummy insulating film 32. The dummy insulating film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction. The dummy conductive portion 34 is electrically connected to the emitter electrode 52. That is, an emitter voltage is applied to the dummy conductive portion 34.

The gate trench portion 40 and the dummy trench portion 30 of the present example are covered with the interlayer dielectric film 38 at the upper surface 21 of the semiconductor substrate 10. Note that bottom portions of the dummy trench portion 30 and the gate trench portion 40 may have curved surface shapes which are convex downwardly (curved line shapes in the cross section).

Figure 4:
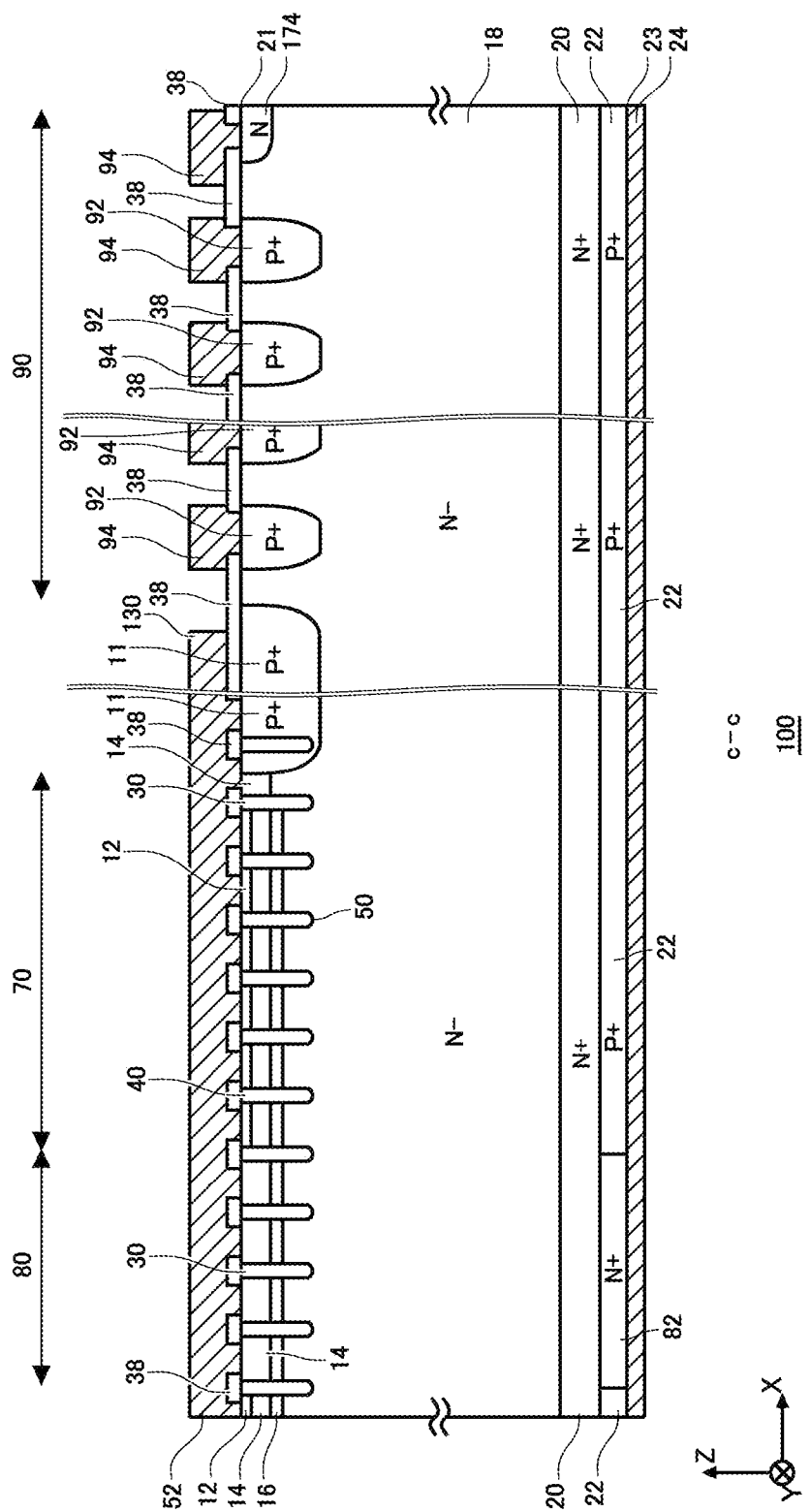
FIG. 4 is a diagram which illustrates an example of a cross section c-c in FIG. 1.

FIG. 4 is a diagram which illustrates an example of a cross section c-c in FIG. 1. The cross section c-c is the XZ plane which extends through the edge termination structure portion 90, the transistor portion 70 and the diode portion 80. The structures of the transistor portion 70 and the diode portion 80 are the same as the transistor portion 70 and the diode portion 80 illustrated in FIG. 2 and FIG. 3. FIG. 4 illustrates simplified structures of the gate trench portion 40 and the dummy trench portion 30.

The semiconductor substrate 10 is provided with the well region 11 between the edge termination structure portion 90 and the transistor portion 70. The well region 11 is a region of the P+ type in contact with the upper surface 21 of the semiconductor substrate 10. The well region 11 may be provided to extend to a depth position greater than the lower ends of the gate trench portion 40 and the dummy trench portion 30. A part of the gate trench portion 40 and the dummy trench portion 30 may be arranged inside the well region 11.

The interlayer dielectric film 38 may be provided on the upper surface 21 of the semiconductor substrate 10 to cover the well region 11. Electrodes and wirings such as the emitter electrode 52 and the outer peripheral gate runner 130 are provided above the interlayer dielectric film 38. The emitter electrode 52 is provided to extend from the active portion 160 to the well region 11 in the upward regions thereof. The emitter electrode 52 may be connected to the well region 11 via the contact hole provided in the interlayer dielectric film 38.

The outer peripheral gate runner 130 is arranged between the emitter electrode 52 and the edge termination structure portion 90. The emitter electrode 52 and the outer peripheral gate runner 130 are arranged to be separated from each other, although a spacing between the emitter electrode 52 and the outer peripheral gate runner 130 is omitted in FIG. 4. The outer peripheral gate runner 130 is electrically insulated from the well region 11 by the interlayer dielectric film 38.

The edge termination structure portion 90 is provided with a plurality of guard rings 92, a plurality of field plates 94 and a channel stopper 174. In the edge termination structure portion 90, the collector region 22 may be provided in a region in contact with the lower surface 23. Each guard ring 92 may be provided to surround the active portion 160 at the upper surface 21. A plurality of guard rings 92 may have a function to extend the depletion layer generated in the active portion 160 to the outside of the semiconductor substrate 10. This can prevent the electric field concentration inside the semiconductor substrate 10, thereby improving the breakdown voltage of the semiconductor device 100.

The guard ring 92 of the present example is a semiconductor region of the P+ type formed by implanting ions in the vicinity of the upper surface 21. A depth of a bottom portion of the guard ring 92 may be greater than the depth of the bottom portions of the gate trench portion 40 and the dummy trench portion 30. The depth of the bottom portion of the guard ring 92 may be the same as or may be different from a depth of the bottom portion of the well region 11.

An upper surface of the guard ring 92 is covered with the interlayer dielectric film 38. The field plate 94 is formed of a conductive material such as a metal such as aluminum or polysilicon. The field plate 94 may be formed of a metal alloy of AlSi, AlSiCu or the like. The field plate 94 may be formed of the same material as the outer peripheral gate runner 130 or the emitter electrode 52. The field plate 94 is provided above the interlayer dielectric film 38. The field plate 94 of the present example is connected to the guard ring 92 through a through hole provided in the interlayer dielectric film 38.

The channel stopper 174 is provided to be exposed to the upper surface 21 and a side wall in the vicinity of the end side 102 of the semiconductor substrate 10. The channel stopper 174 is a region of the N type having a higher doping concentration than the drift region 18. The channel stopper 174 has a function to terminate the depletion layer generated in the active portion 160 in the vicinity of the end side 102 of the semiconductor substrate 10. Note that at least a part of the field plate 94, the outer peripheral gate runner 130 and the emitter electrode 52 is covered with a protective film such as a polyimide or nitride film, although the protective film may be omitted in the drawings herein.

Figure 5:
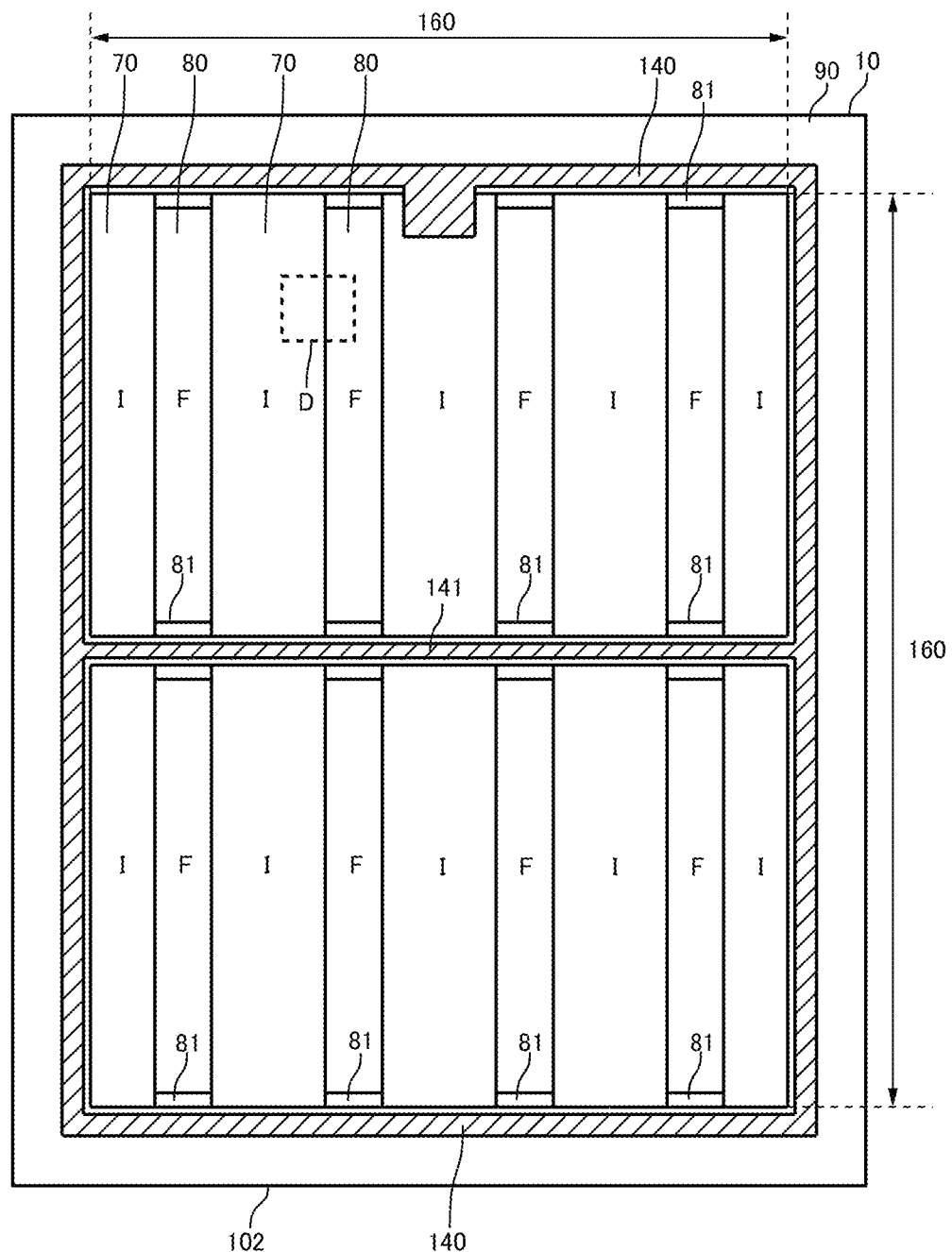
FIG. 5 is a diagram which illustrates an exemplary arrangement of the well region 11 at the upper surface 21 of the semiconductor substrate 10.

FIG. 5 is a diagram which illustrates an exemplary arrangement of the well region 11 at the upper surface 21 of the semiconductor substrate 10. The gate runner is omitted in FIG. 5. The well region 11 of the present example includes an outer peripheral well region 140 and an active side well region 141. The outer peripheral well region 140 is arranged between the active portion 160 and the end side 102 of the semiconductor substrate 10 in a top view. The outer peripheral well region 140 of the present example surrounds the active portion 160 in a top view. A region surrounded by the outer peripheral well region 140 in a top view may be referred to as the active portion 160. In addition, a region between the outer peripheral well region 140 and the end side 102 may be referred to as the edge termination structure portion 90.

The outer peripheral well region 140 may overlap the outer peripheral gate runner 130 illustrated in FIG. 1 in the Z axis direction. The outer peripheral well region 140 of the present example is provided along the outer peripheral gate runner 130. The outer peripheral well region 140 may be provided in a broader area than the outer peripheral gate runner 130 in a top view. That is, the entire outer peripheral gate runner 130 may overlap the outer peripheral well region 140 in a top view. The outer peripheral well region 140 may overlap each pad such as the gate pad 112 in the Z axis direction. The outer peripheral well region 140 may be provided in a broader area than the gate pad 112 in a top view. That is, the entire area of each pad may overlap the outer peripheral well region 140 in a top view.

The active side well region 141 is provided in the active portion 160. The active side well region 141 may overlap the active side gate runner 131 in the Z axis direction. The active side well region 141 of the present example is provided along the active side gate runner 131. The active side well region 141 may be provided in a broader area than the active side gate runner 131 in a top view. That is, the entire active side gate runner 131 may overlap the active side well region 141 in a top view. The active side well region 141 may have the same doping concentration as the doping concentration of the outer peripheral well region 140. A depth position of a lower end of the active side well region 141 may be the same as a depth position of a lower end of the outer peripheral well region 140.

The active side well region 141 may be connected to the outer peripheral well region 140. The active side well region 141 of the present example is provided to extend in the X axis direction so as to cross the active portion 160 at substantially the center of the active portion 160 in the Y axis direction, from one outer peripheral well region 140 to the other outer peripheral well region 140.

As used herein, a region interposed between the well regions 11 (including the outer peripheral well region 140 and the active side well region 141 in the present example) in a top view is referred to as an inner region. That is, a point interposed between the well regions 11 in any direction in a top view is included in the inner region. Note that the inner region does not include the well region 11 per se. That is, if the well region 11 is interposed between the well regions 11 in a top view, said well region 11 is not included in the inner region. In the example of FIG. 5, in the active portion 160, a region not provided with the active side well region 141 corresponds to the inner region.

Figure 6:
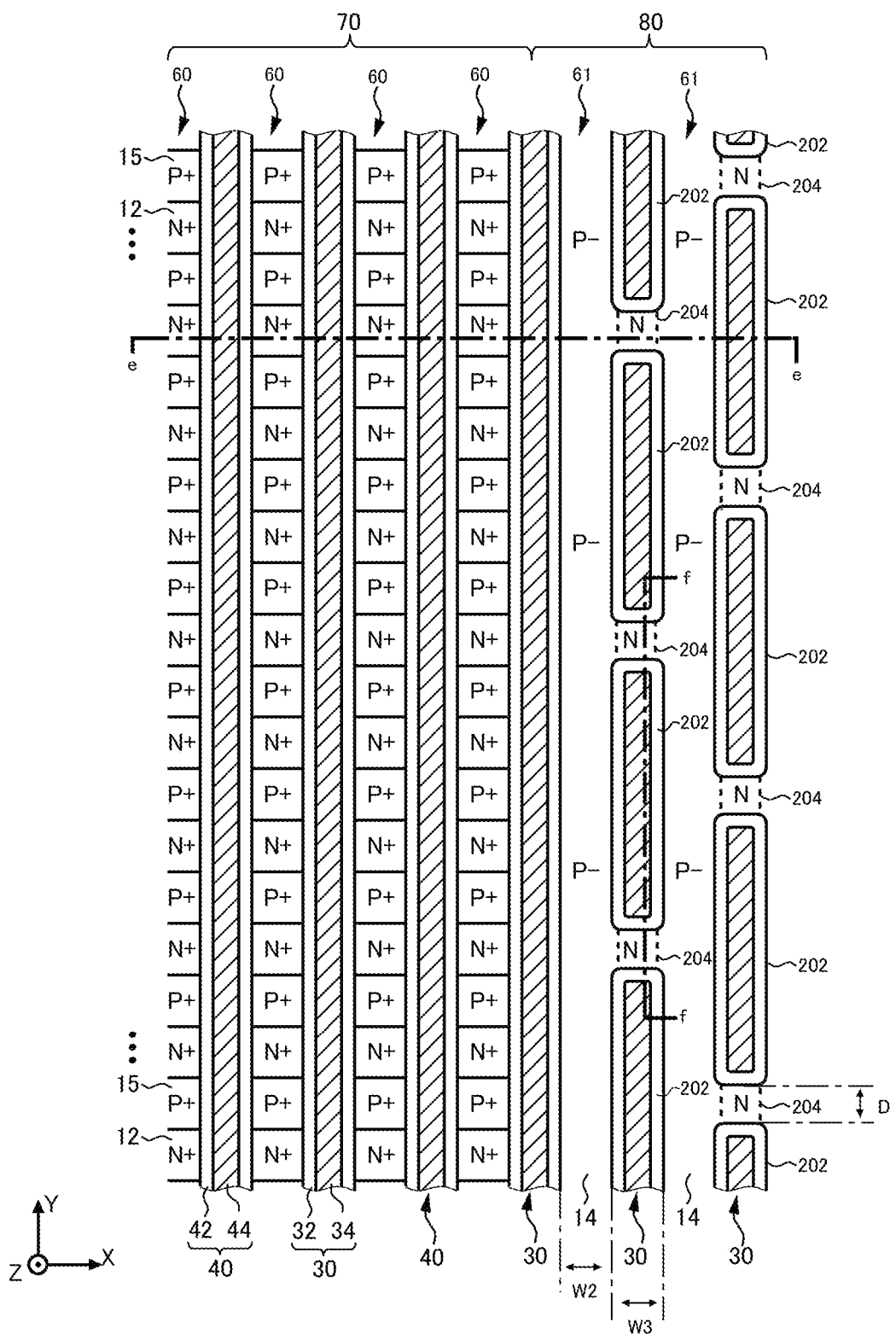
FIG. 6 is an enlarged top view of the region D in FIG. 5.

FIG. 6 is an enlarged top view of the region D in FIG. 5. The region D is a part of the inner region. The region D of the present example includes the transistor portion 70 and the diode portion 80. As mentioned above, the inner region includes a plurality of trench portions having a longitudinal side in the predetermined longitudinal direction (the Y axis direction in FIG. 6) and extending from the upper surface 21 of the semiconductor substrate 10 to the drift region 18. The gate trench portion 40 and the dummy trench portion 30 illustrated in FIG. 2 or the like are an example of the trench portions.

At least one trench portion is separated into two or more partial trenches in the Y axis direction in the inner region which does not overlap the well region 11. In the example of FIG. 6, the dummy trench portion 30 in the diode portion 80 is separated into the partial trenches 202. The partial trench 202 is a trench in which said partial trench 202 and another partial trench 202 are arranged in a line parallel to the Y axis. Both of said partial trench 202 and another partial trench 202 may have longitudinal sides in the Y axis direction. Some dummy trench portions 30 in the diode portion 80 may be separated into the partial trenches 202, or all of the dummy trench portions 30 may be separated into the partial trenches 202. In another example, the dummy trench portion 30 in the transistor portion 70 may be separated into the partial trenches, or the gate trench portion 40 in the transistor portion 70 may be separated into the partial trenches. In addition, two or more types of the trench portions from among the dummy trench portion 30 in the diode portion 80, the gate trench portion 40 in the transistor portion 70, and the dummy trench portion 30 in the transistor portion 70 may be separated into the partial trenches.

In a top view, a region between the partial trenches is referred to as an inter-trench region. The inter-trench region is a region in contact with the upper surface 21 of the semiconductor substrate 10. In the present example, a first inter-trench region 204 is provided between the partial trenches 202. The first inter-trench region 204 is a region of the N type. Both ends of the first inter-trench region 204 in the Y axis direction are in contact with the partial trench 202 and both ends thereof in the X axis direction are in contact with the mesa portion 61. The mesa portion 61 of the present example is provided with the base region 14 at the upper surface thereof. That is, the first inter-trench region 204 is interposed between the base regions 14 at the upper surface 21 of the semiconductor substrate 10. The first inter-trench region 204 has a width in the X axis direction which may be the same as or may be smaller than the width of the dummy trench portion 30 in the X axis direction.

The partial trench 202 of the present example is separated from another partial trench 202 above the cathode region 82 (refer to FIG. 2 and FIG. 3). That is, the first inter-trench region 204 is arranged above the cathode region 82.

Providing the first inter-trench region 204 of the N type in the diode portion 80 can facilitate to extract electrons from the upper surface side of the diode portion 80. When the diode portion 80 is conducting, the minority carriers, or holes, are injected from the base region 14 which functions as an anode region to the drift region 18. In addition, the majority carriers, or electrons, are injected from the cathode region 82 to the drift region 18.

Injected electrons and holes are recombined and extinguished. However, some electrons reach the first inter-trench region 204 and are extracted by the emitter electrode 52. Therefore, the electron concentration of the drift region 18 is lowered to suppress the injection of holes from the base region 14. This can shorten a time period for extracting holes from the drift region 18 during reverse recovery of the diode portion 80, thereby improving the switching characteristics. In addition, electrons can be injected from the first inter-trench region 204 during reverse recovery of the diode portion 80 to reduce sharp changes in the electric fields. Accordingly, providing the first inter-trench region 204 can suppress the loss of reverse recovery, occurrence of surges or the like. Note that if the dummy trench portion 30 in the diode portion 80 is separated into two or more partial trenches 202 in the Y axis direction, as in the present example, said dummy trench portion 30 may be the dummy trench portion 30 of a linear shape without the edge portion 31.

Figure 7:
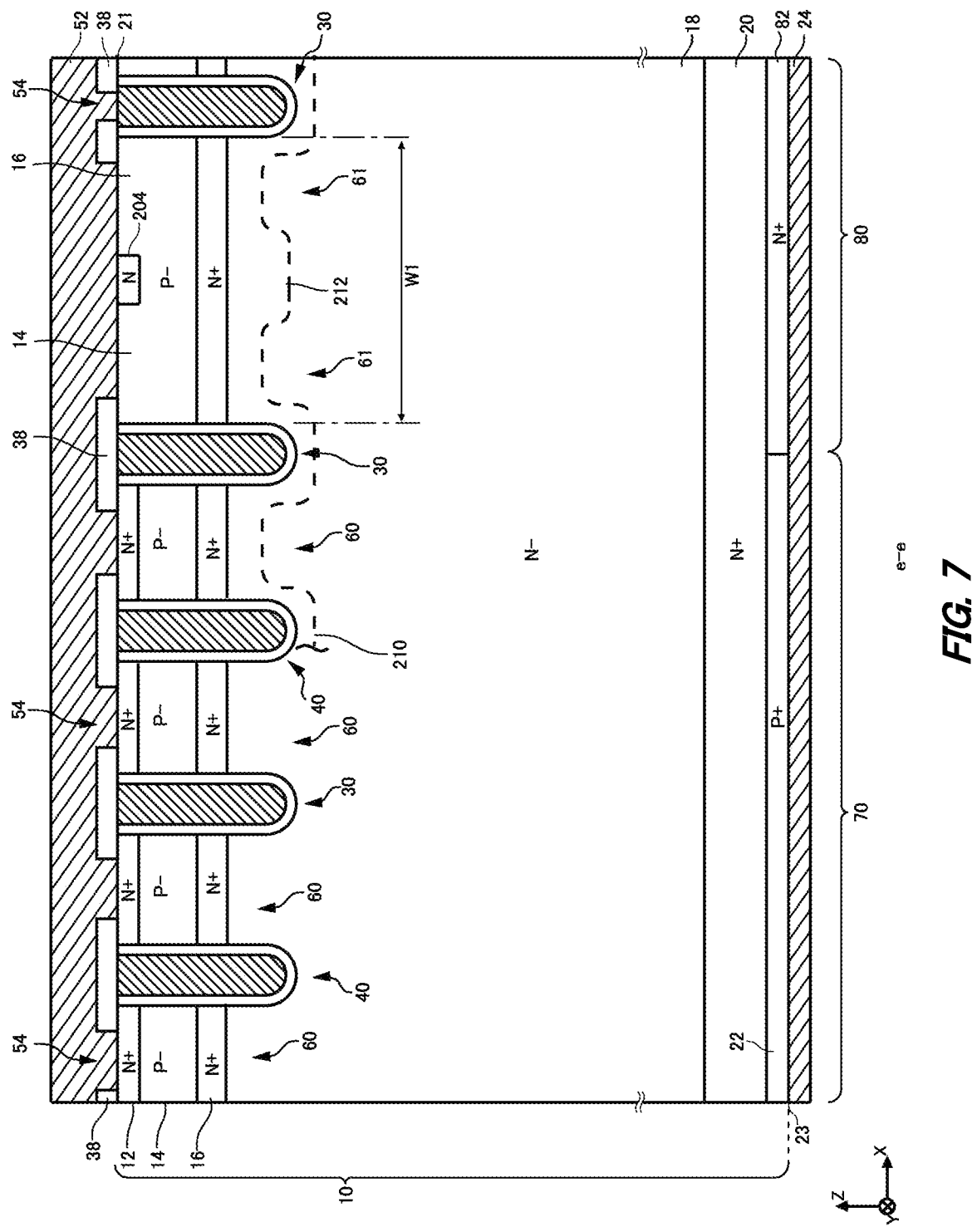
FIG. 7 is a diagram which illustrates an example of a cross section e-e in FIG. 6.

FIG. 7 is a diagram which illustrates an example of a cross section e-e in FIG. 6. The cross section e-e is the XZ plane which extends through the first inter-trench region 204. The first inter-trench region 204 is provided in contact with the upper surface 21 of the semiconductor substrate 10. The first inter-trench region 204 is connected to the emitter electrode 52 on the upper surface 21 of the semiconductor substrate 10. This can extract electrons to the emitter electrode 52 via the first inter-trench region 204.

The first inter-trench region 204 of the present example is surrounded by the base region 14. That is, the base region 14 is provided between the first inter-trench region 204 and the accumulation region 16 and the drift region 18. This can prevent the first inter-trench region 204 to be directly connected to the accumulation region 16 or the drift region 18.

The first inter-trench region 204 may be provided to the same depth as the emitter region 12. This can facilitate to form the emitter region 12 and the first inter-trench region 204 in the same process. In another example, the first inter-trench region 204 may be provided to a smaller depth position than the emitter region 12, or may be provided to a depth position greater than the emitter region 12.

The first inter-trench region 204 may have the same doping concentration as the drift region 18. The first inter-trench region 204 may have a higher or a lower doping concentration than the drift region 18. The first inter-trench region 204 may have the same doping concentration as the emitter region 12. This can facilitate to form the emitter region 12 and the first inter-trench region 204 in the same process. The first inter-trench region 204 may have a higher or a lower doping concentration than the emitter region 12.

FIG. 7 illustrates the equipotential plane 210 of a predetermined voltage by dashed lines. In FIG. 7, the equipotential plane 210 is omitted in some regions of the transistor portion 70. The equipotential plane 210 protrudes toward the side of the lower surface 23 of the semiconductor substrate 10, below the dummy trench portion 30 and the gate trench portion 40. In addition, the equipotential plane 210 protrudes toward the side of the upper surface 21 of the semiconductor substrate 10 in the mesa portion 60 and the mesa portion 61. Therefore, if an interval between the trench portions in the X axis direction is large, the equipotential plane 210 largely protrudes toward the upper surface 21 side, which can cause concentration of the electric fields.

In the cross section e-e, a first interval W1 between two dummy trench portions 30 interposing the first inter-trench region 204 therebetween in the X axis direction is greater. However, as illustrated in FIG. 6, the first inter-trench region 204 is interposed between two partial trenches 202 in the Y axis direction. Preferably, a distance D between the partial trenches 202 in the Y axis direction (refer to FIG. 6) is smaller than the first interval W1. The distance D corresponds to a length of the first inter-trench region 204 in the Y axis direction. The partial trench 202 pushes down the equipotential plane 210 toward the lower surface 23 side. This can provide the equipotential plane 210 with a protruding portion 212 which protrudes toward the side of the lower surface 23 below the first inter-trench region 204. This can reduce the electric field concentration in the vicinity of a downward area of the first inter-trench region 204. Note that a protruding amount of the protruding portion 212 toward the lower surface 23 side may be smaller than a protruding amount of the equipotential plane 210 at a position immediately below the trench portion toward the lower surface 23 side.

As illustrated in FIG. 6, an interval between the trench portion adjacent to the partial trench 202 in the X axis direction and said partial trench 202 is referred to as a second interval W2. The second interval W2 corresponds to a width of the mesa portion 61 in the X axis direction which is adjacent to the first inter-trench region 204 in the X axis direction. The distance D between the partial trenches 202 may be equal to or smaller than twice the second interval W2. The distance D may also be equal to or smaller than the second interval W2. The smaller distance D can increase a protruding width of the protruding portion 212 in the equipotential plane 210. This can move a lowermost position of the protruding portion 212 closer to a depth position of the equipotential plane 210 below the trench portion. This can reduce the electric field concentration caused by providing the first inter-trench region 204.

As illustrated in FIG. 6, a width of the partial trench 202 in the X axis direction is referred to as a width W3. The distance D may be equal to or smaller than twice the width W3 or may be equal to or smaller than the width W3.

Figure 8:
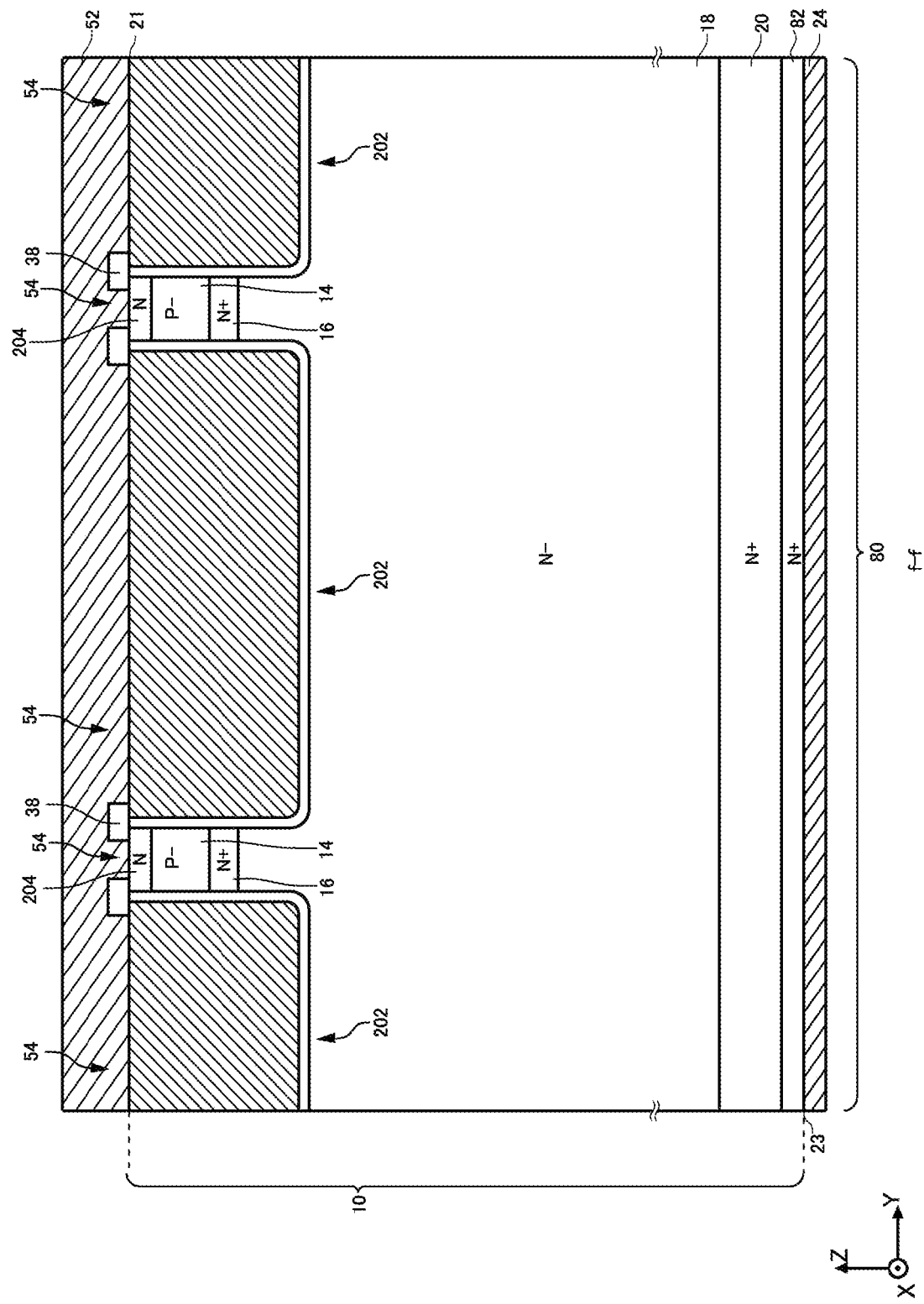
FIG. 8 is a diagram which illustrates an example of a cross section f-f in FIG. 6.

FIG. 8 is a diagram which illustrates an example of a cross section f-f in FIG. 6. The cross section f-f is an YZ plane which extends through the partial trench 202 and the first inter-trench region 204. The first inter-trench region 204 is in contact with the upper surface 21 of the semiconductor substrate 10 above the cathode region 82. The interlayer dielectric film 38 is provided with the contact hole 54 which exposes the dummy conductive portion 34 of each partial trench 202 and the contact hole 54 which exposes each first inter-trench region 204.

In the present example, the interlayer dielectric film 38 is provided to cover the boundary between the partial trench 202 and the first inter-trench region 204. In another example, the contact hole 54 may be provided continuously over the partial trench 202 and the first inter-trench region 204. That is, the interlayer dielectric film 38 may not be provided even on the boundary between the partial trench 202 and the first inter-trench region 204. The emitter electrode 52 is connected to each partial trench 202 and each first inter-trench region 204 through the contact hole 54.

The base region 14 is provided between the first inter-trench region 204 and the drift region 18. In the present example, the accumulation region 16 is provided between the base region 14 and the drift region 18. A depth of a lower end of the partial trench 202 may be the same as the depth of the lower ends of the dummy trench portion 30 and the gate trench portion 40 illustrated in FIG. 7 or the like.

Each trench portion in the semiconductor device 100 of the present example can be formed by providing a mask of a predetermined shape on the upper surface 21 of the semiconductor substrate 10 and performing anisotropic etching on the upper surface 21. Here, a region where the first inter-trench region 204 is to be formed is covered with a mask such that the dummy trench portion 30 can be separated in the Y axis direction.

After the trench is formed by way of anisotropic etching, sides and a bottom thereof are thermal oxidized to form the gate insulating film 42 and the dummy insulating film 32. Then, a conductive material such as polysilicon is deposited in the trench to form the gate conductive portion 44 and the dummy conductive portion 34.

The interlayer dielectric film 38 is formed after unnecessary residues such as a mask, an oxide film and polysilicon are removed from the upper surface 21 of the semiconductor substrate 10. At least a part of the respective doping regions inside the semiconductor substrate 10 may be formed before each trench portion is formed or may be formed after each trench portion is formed.

Then, the contact hole 54 is formed in the interlayer dielectric film 38. Then, the emitter electrode 52 is formed on the interlayer dielectric film 38 and within the contact hole 54. This allows the emitter electrode 52 to contact the base region 14, the emitter region 12, the contact region 15, and the first inter-trench region 204. The inside of the contact hole 54 may be filled with tungsten. This can facilitate to form the emitter electrode 52 inside the fine contact hole 54.

Then, the lower surface 23 side of the semiconductor substrate 10 may be ground to adjust a thickness of the semiconductor substrate 10. After the thickness of the semiconductor substrate 10 is adjusted, doping regions such as the buffer region 20, the collector region 22 and the cathode region 82 may be formed. After the doping regions at the lower surface 23 side are formed, the collector electrode 24 may be formed on the lower surface 23.

In addition, the semiconductor device 100 may include a lifetime adjustment region at the side of the upper surface 21 of the semiconductor substrate 10 to adjust a lifetime of carriers. The side of the upper surface 21 of the semiconductor substrate 10 refers to a region between the center of the semiconductor substrate 10 in the depth direction and the upper surface 21. In addition, the lifetime adjustment region is a region where the lifetime distribution indicates a local minimum value in the depth direction. Vacancy defects in the lifetime adjustment region may be distributed at a higher density than vacancy defects in the other regions. The vacancy defects can be formed by irradiating particles such as helium and proton to the lifetime adjustment region. Recombination of vacancy defects and carriers can shorten the lifetime of carriers.

Providing the lifetime adjustment region can further improve the switching characteristics of the diode portion 80. In another example, the semiconductor device 100 may not include the lifetime adjustment region at the side of the upper surface 21 of the semiconductor substrate 10. Even if the lifetime adjustment region is not provided, providing the first inter-trench region 204 can improve the switching characteristics of the diode portion 80. In addition, not providing the lifetime adjustment region can suppress damages to the insulating film or the base region 14 or the like due to irradiation of helium or the like.

Figure 9:
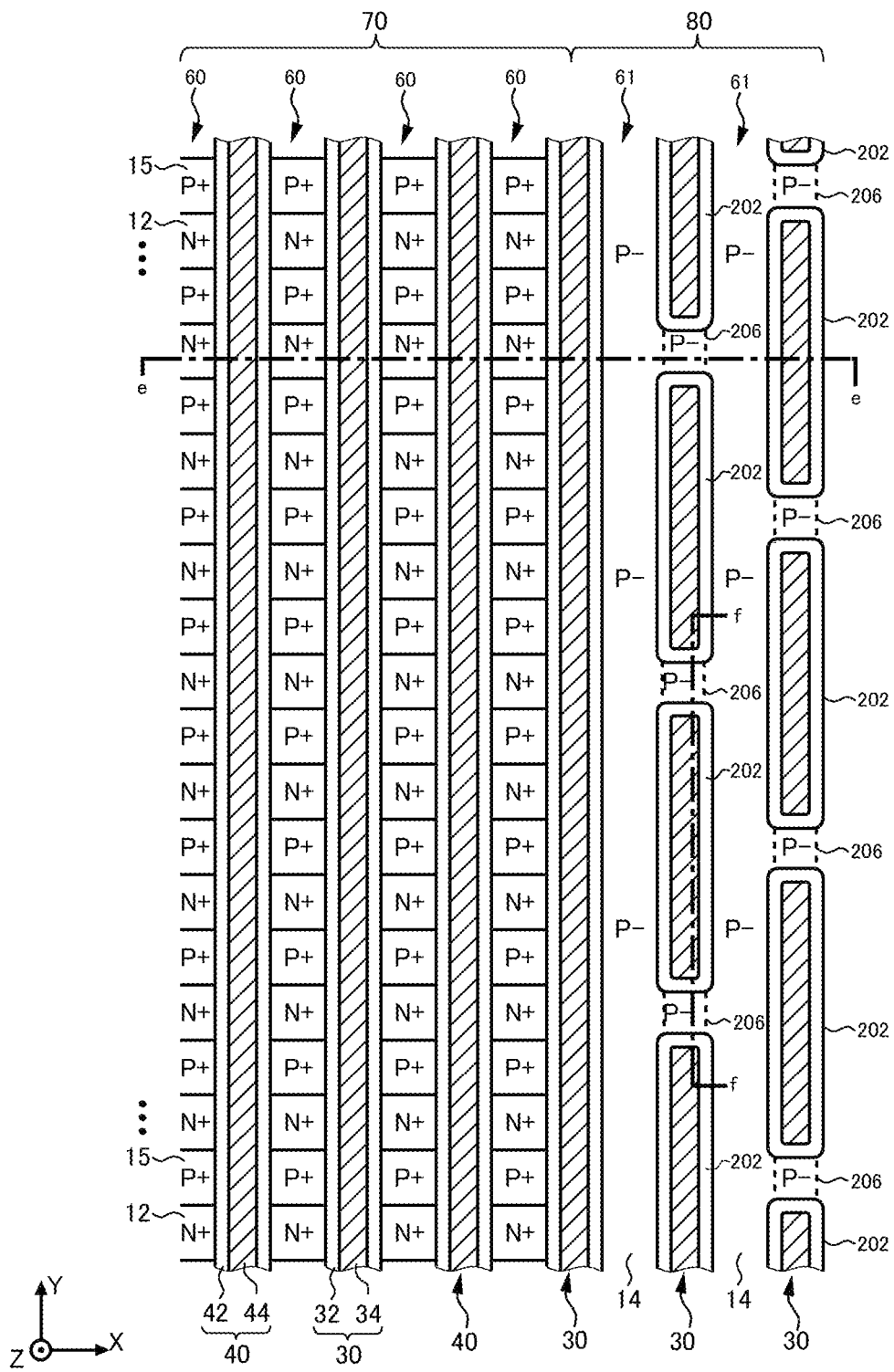
FIG. 9 is a diagram which illustrates another example of the region D.

FIG. 9 is a diagram which illustrates another example of the region D. In the present example, the second inter-trench region 206 of the P type is provided instead of the first inter-trench region 204, which differs from the examples illustrated in FIG. 6 to FIG. 8. The other structures may be the same as the examples illustrated in FIG. 6 to FIG. 8.

The second inter-trench region 206 may be the same as the first inter-trench region 204, aside from the conductivity type and the doping concentration. Providing the second inter-trench region 206 of the P type can increase regions which function as a diode.

The second inter-trench region 206 may have a lower doping concentration than the base region 14. In this case, an amount of holes injected from the second inter-trench region 206 can be suppressed. The second inter-trench region 206 may have the same doping concentration as the base region 14. In this case, the second inter-trench region 206 can be formed easily. The second inter-trench region 206 may have a higher doping concentration than the base region 14.

Figure 10:
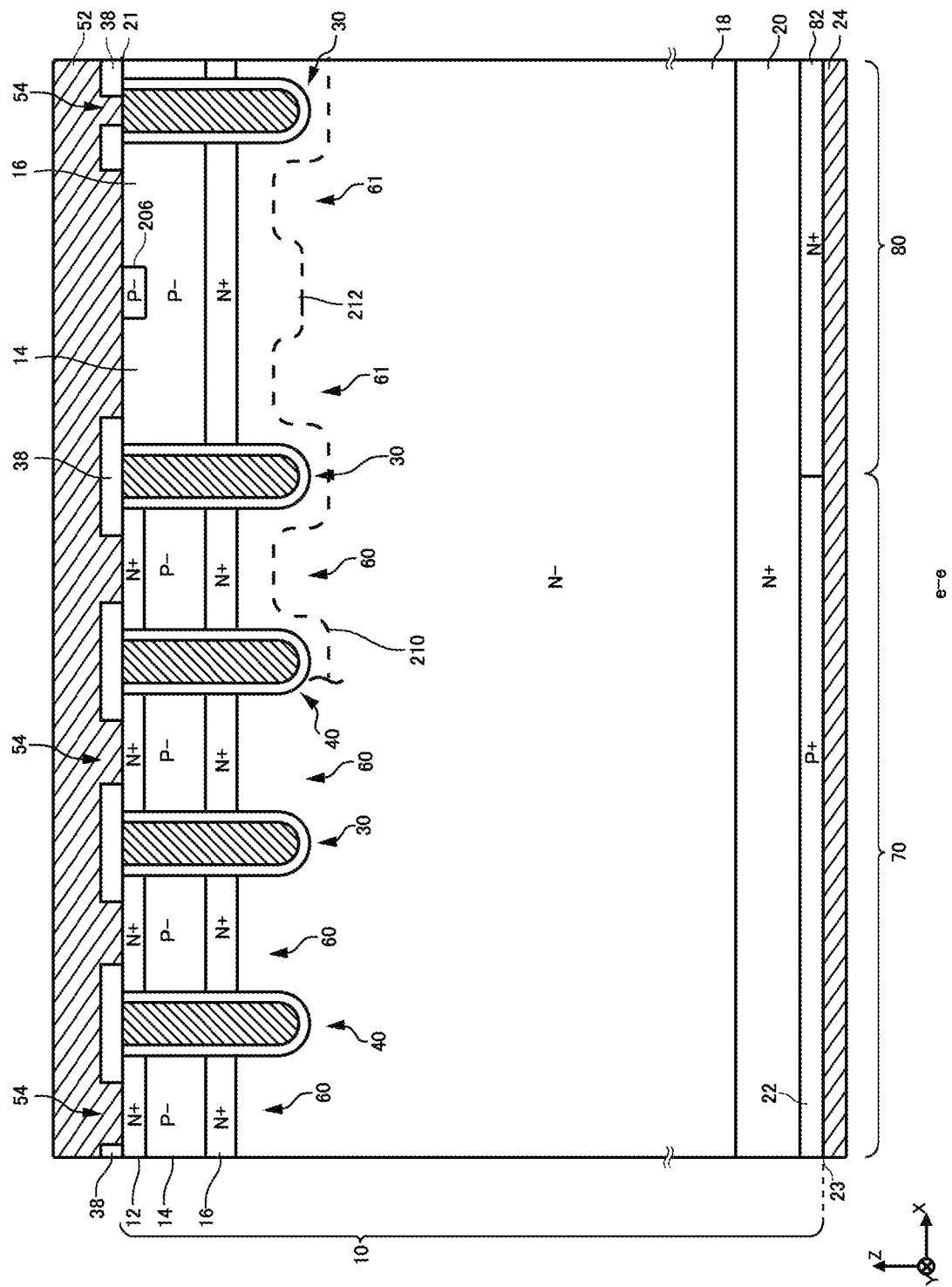
FIG. 10 is an example of a cross section e-e in FIG. 9.

FIG. 10 is an example of a cross section e-e in FIG. 9. The semiconductor device 100 of the present example is different from the example illustrated in FIG. 7 in including the second inter-trench region 206, instead of the first inter-trench region 204. The other structures may be the same as the example of FIG. 7. In the present example, the electric field concentration can also be reduced in the vicinity of a downward area of the second inter-trench region 206.

Figure 11:
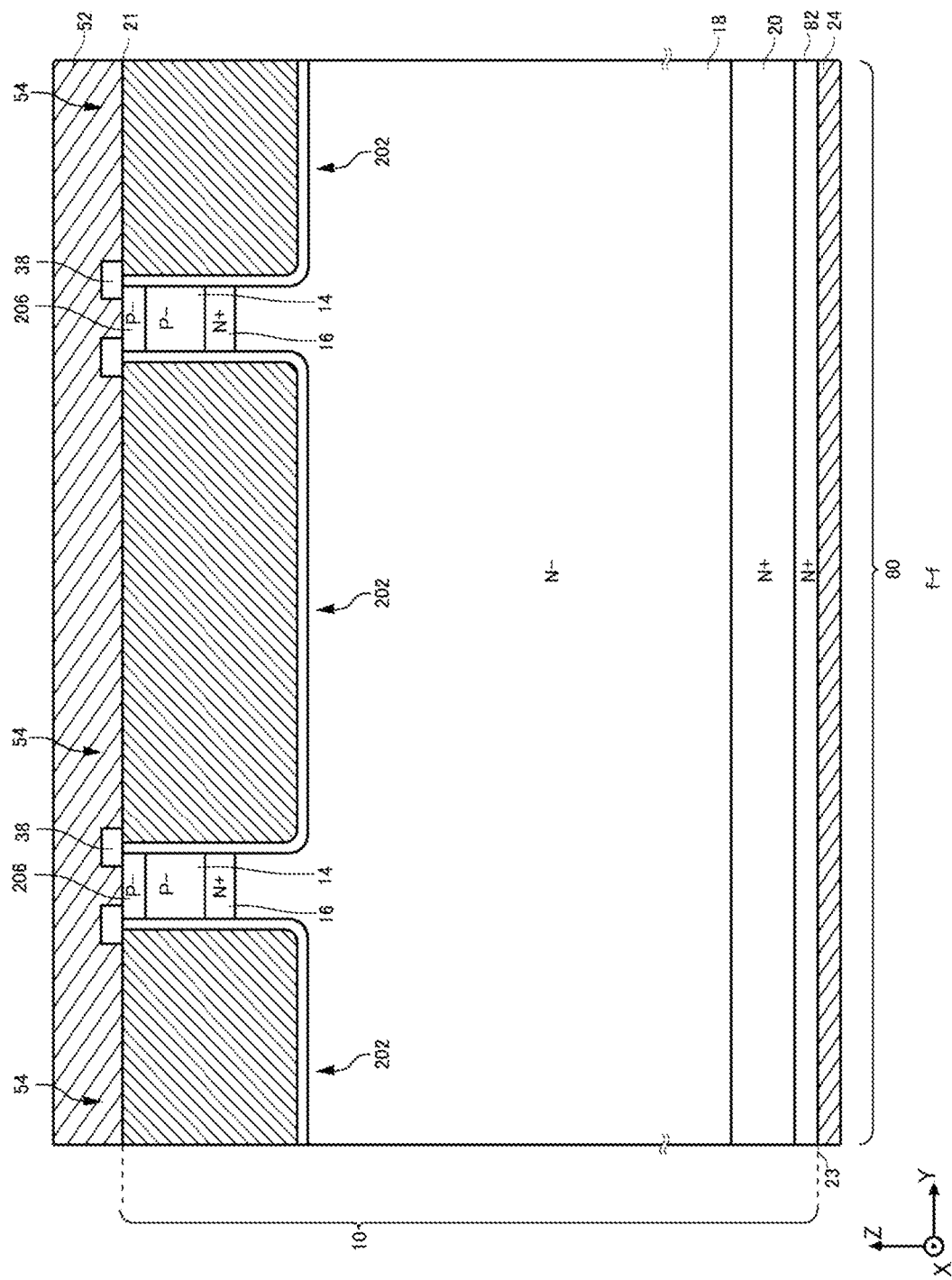
FIG. 11 is an example of a cross section f-f in FIG. 9.

FIG. 11 is an example of a cross section f-f in FIG. 9. The semiconductor device 100 of the present example is different from the example illustrated in FIG. 8 in including the second inter-trench region 206, instead of the first inter-trench region 204. The other structures may be the same as the example of FIG. 8.

Figure 12:
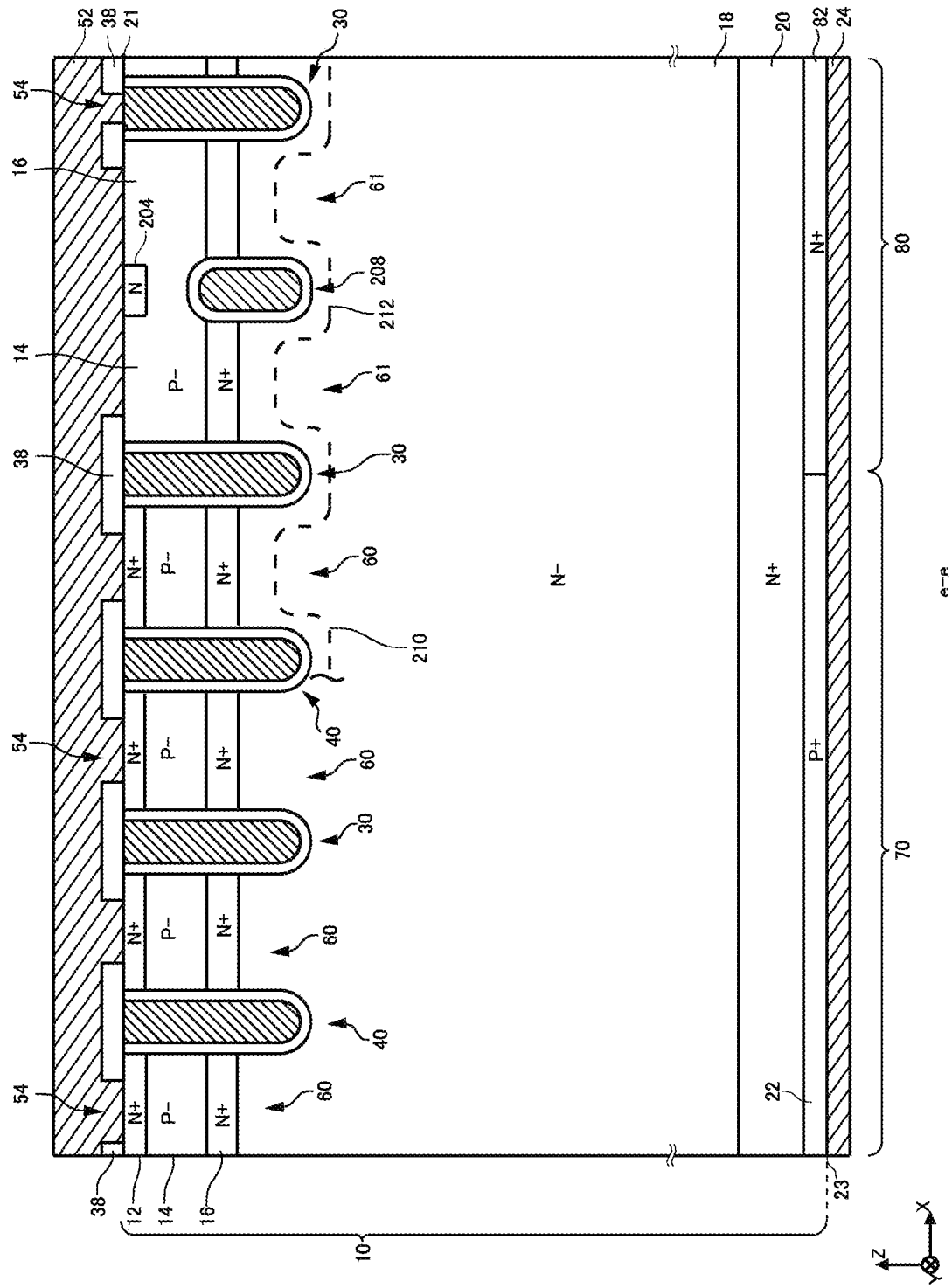
FIG. 12 is a diagram which illustrates another example of the cross section e-e.

FIG. 12 is a diagram which illustrates another example of the cross section e-e. The semiconductor device 100 of the present example is different from the example illustrated in FIG. 7 or FIG. 10 in further including an embedded trench 208. The other structures may be the same as the examples of FIG. 7 or FIG. 10. FIG. 12 illustrates a structure in which the embedded trench 208 is provided in the example of FIG. 7.

The embedded trench 208 is provided below the inter-trench region. In the present example, an example where the first inter-trench region 204 is provided as an inter-trench region will be described. The embedded trench 208 may be provided to the same depth as the dummy trench portion 30 adjacent in the X axis direction. That is, a position of a lower end of the embedded trench 208 in the Z axis direction may be the same as the position of the lower end of the dummy trench portion 30 in the Z axis direction.

Providing the embedded trench 208 allows the protruding portion 212 of the equipotential plane 210 to be positioned at the same level as the other positions of the equipotential plane 210 below the dummy trench portions 30. This can reduce the electric field concentration below the first inter-trench region 204. The embedded trench 208 may be provided to a depth greater or may be provided to a depth smaller than that of the adjacent dummy trench portion 30.

The embedded trench 208 may be arranged away from the first inter-trench region 204. In this case, the base region 14 may be provided between the embedded trench 208 and the first inter-trench region 204. The base region 14 and the accumulation region 16 may be provided between the embedded trench 208 and the first inter-trench region 204. In another example, the embedded trench 208 may be in contact with the first inter-trench region 204. That is, an upper end of the embedded trench 208 may be in contact with the lower end of the first inter-trench region 204.

Figure 13:
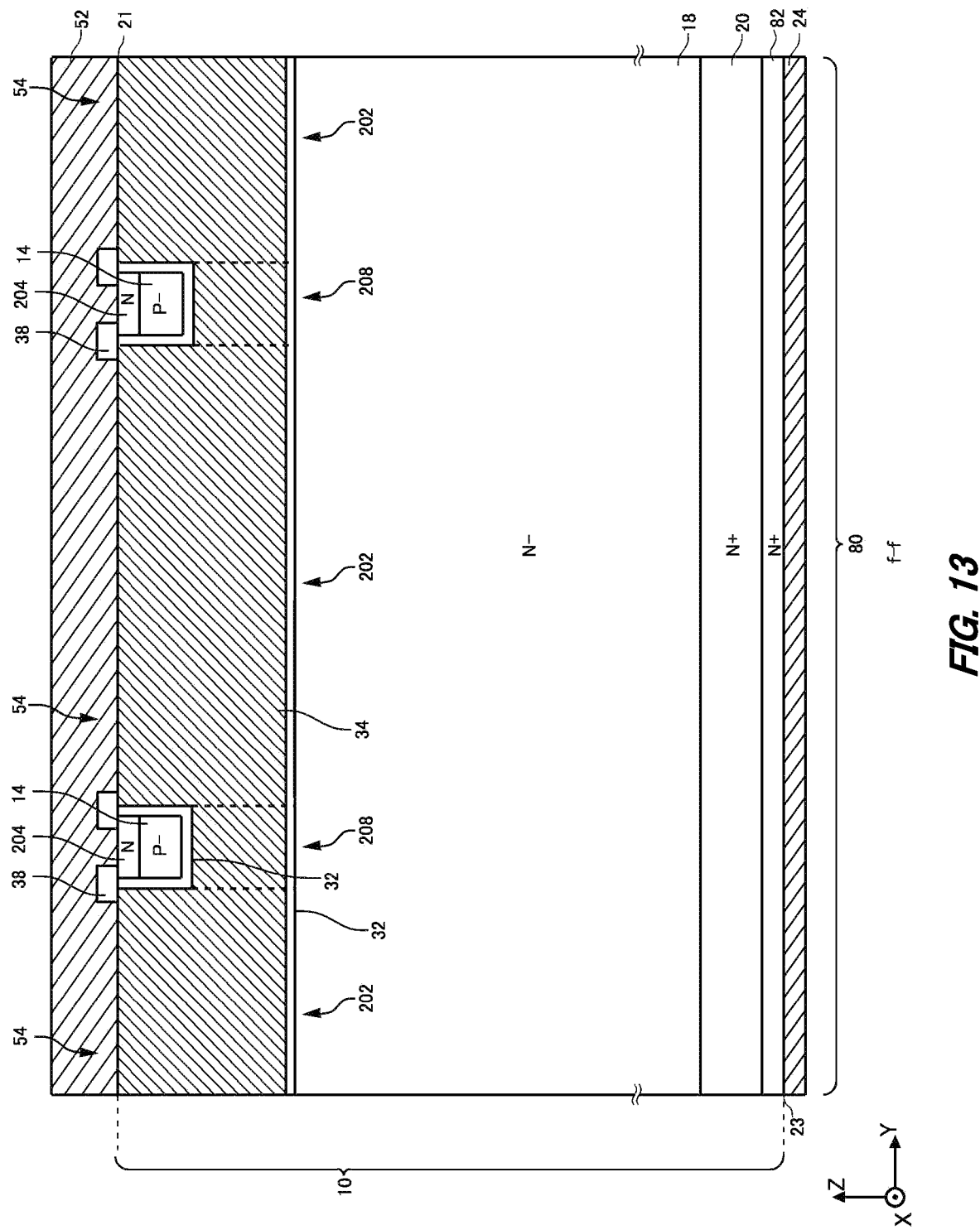
FIG. 13 is a diagram which illustrates another example of the cross section f-f.

FIG. 13 is a diagram which illustrates another example of the cross section f-f. The semiconductor device 100 of the present example is different from the example illustrated in FIG. 8 or FIG. 11 in further including the embedded trench 208. The other structures may be the same as the example of FIG. 8 or FIG. 11. FIG. 13 illustrates a structure in which the embedded trench 208 is provided in the example of FIG. 8.

The embedded trench 208 is provided between two partial trenches 202 adjacent to each other in the Y axis direction. The embedded trench 208 connects the two partial trenches 202. The dummy conductive portion 34 of the embedded trench 208 may be formed of the same material as and provided continuously from the dummy conductive portion 34 of the partial trench 202. The dummy insulating film 32 of the embedded trench 208 may be formed of the same material as and provided continuously from the dummy insulating film 32 of the partial trench 202. FIG. 13 illustrates a boundary between the partial trench 202 and the embedded trench 208 by dashed lines, although the partial trench 202 and the embedded trench 208 may be provided continuously.

Such a structure can improve the switching characteristics while suppressing the electric field concentration. The embedded trench 208 and the partial trench 202 of the present example can be form in the following processes. First, the dummy trench portion 30 is form in the semiconductor substrate 10. Then, an upper portion of the dummy trench portion 30 is removed in a region where the embedded trench 208 is to be formed. In the region where the upper portion of the dummy trench portion 30 is removed, a semiconductor layer such as silicon is formed by way of epitaxial growth or the like. The base region 14 and the first inter-trench region 204 are formed in the formed semiconductor layer. The embedded trench 208 and the partial trench 202 can be formed in this manner.

Figure 14:
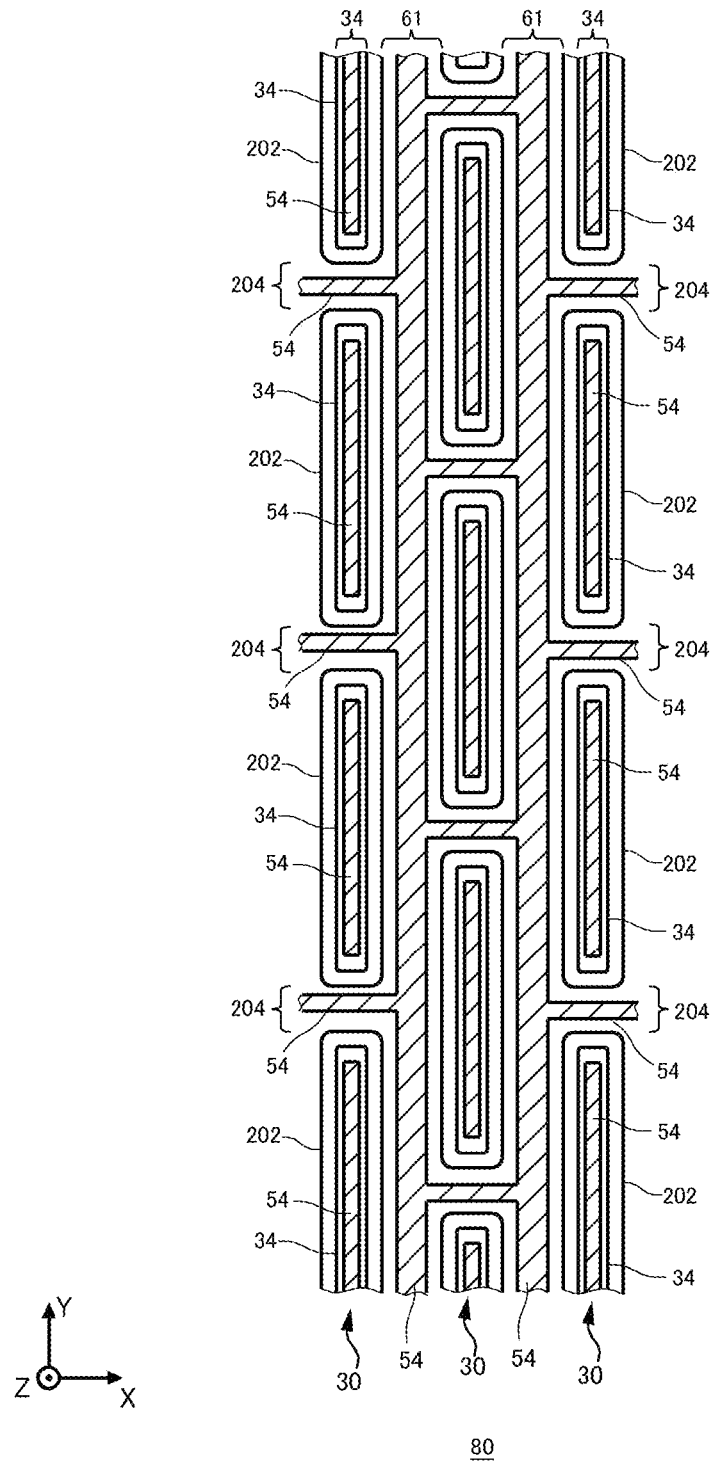
FIG. 14 is a diagram which illustrates an exemplary arrangement of the contact hole 54 in a top view.

FIG. 14 is a diagram which illustrates an exemplary arrangement of the contact hole 54 in a top view. FIG. 14 illustrates a part of the diode portion 80. The contact hole 54 is provided above the mesa portion 61. The contact hole 54 in the mesa portion 61 may have a longitudinal side in the Y axis direction. In addition, the contact hole 54 is also provided above the inter-trench region. In the present example, an example where the first inter-trench region 204 is provided as an inter-trench region will be described.

The contact hole 54 provided in the first inter-trench region 204 may be connected to the contact hole 54 of the mesa portion 61. The contact hole 54 may surround the partial trench 202 in a top view.

In addition, the contact hole 54 is also provided above the dummy conductive portion 34 of the partial trench 202. The emitter electrode 52 is provided above the respective contact holes 54. The emitter electrode 52 contacts the upper surface of the semiconductor substrate 10 through the contact hole 54.

Figure 15:
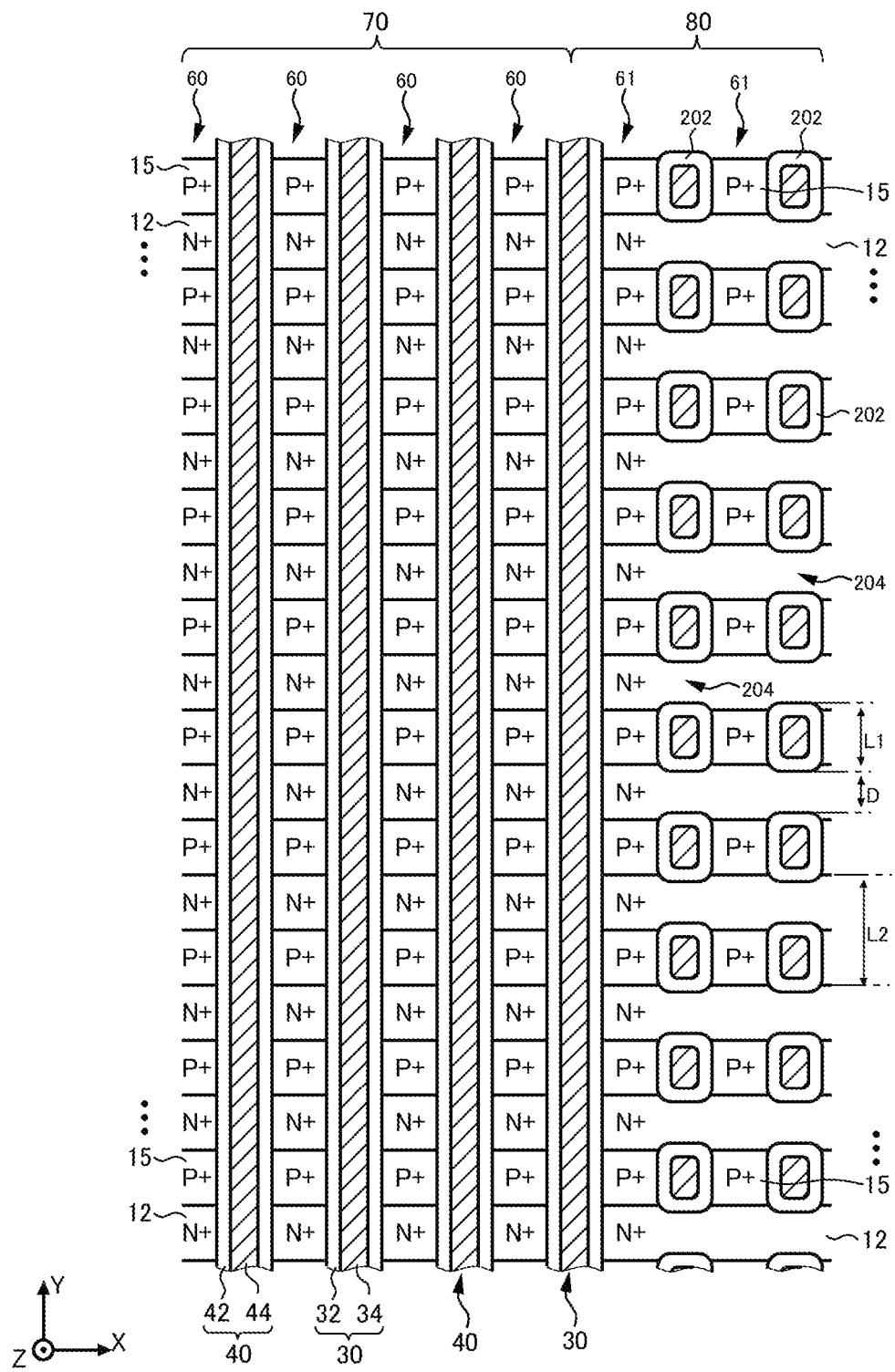
FIG. 15 is a diagram which illustrates another example of the region D.

FIG. 15 is a diagram which illustrates another example of the region D. In the present example, a structure of the diode portion 80 is different from the examples illustrated in FIG. 1 to FIG. 14. A structure of the transistor portion 70 may be the same as the examples illustrated in FIG. 1 to FIG. 14.

In the diode portion 80 of the present example, an arrangement of the partial trench 202 and the inter-trench region is different from the examples illustrated in FIG. 1 to FIG. 14. In the present example, an example where the first inter-trench region 204 is provided as an inter-trench region will be described.

In the example illustrated in FIG. 6 or the like, in the dummy trench portions 30 adjacent to each other in the X axis direction, positions of the first inter-trench regions 204 are different in the Y axis direction. That is, the respective first inter-trench regions 204 are arranged to oppose to the partial trenches 202 in the X axis direction. In the present example, in the dummy trench portion 30 adjacent in the X axis direction, the positions of the first inter-trench regions 204 are the same in the Y axis direction. That is, the respective first inter-trench regions 204 are arranged to oppose to other first inter-trench regions 204 in the X axis direction.

The mesa portion 61 is provided between two first inter-trench regions 204 adjacent to each other in the X axis direction. If the base region 14 is provided in the entire mesa portion 61, the base region 14 is provided between two first inter-trench regions 204 adjacent to each other in the X axis direction.

The mesa portion 61 may include a region other than the base region 14 formed therein. In the example of FIG. 15, the emitter region 12 and the contact region 15 are provided at an upper surface of the mesa portion 61. That is, at the upper surface 21 of the semiconductor substrate 10, an arrangement of doping regions in the mesa portion 61 may be the same as an arrangement of doping regions in the mesa portion 60. The conductivity type of the inter-trench region may be the same the conductivity type of the doping region in the mesa portion 61 adjacent in the X axis direction.

In the example of FIG. 15, the first inter-trench region 204 is interposed between the emitter regions 12 in the X axis direction. In this case, the first inter-trench region 204 may be of the N type. The first inter-trench region 204 may have the same doping concentration as the emitter region 12. That is, the emitter region 12 may be provided in a region between the partial trenches 202.

In another example, the first inter-trench region 204 may be interposed between the contact regions 15 in the X axis direction. In this case, the first inter-trench region 204 may be of the P type. The first inter-trench region 204 may have the same doping concentration as the contact region 15. That is, the contact region 15 may be provided in a region between the partial trenches 202.

The partial trenches 202 may be provided along the Y axis direction in the same periodic manner as the periodic manner of the contact region 15 or the emitter region 12 provided in the Y axis direction. The partial trench 202 may be provided for each contact region 15 or may be provided for each emitter region 12 of the mesa portion 61.

The first inter-trench region 204 may be provided along the Y axis direction in the same periodic manner as the periodic manner of the contact region 15 or the emitter region 12 provided in the Y axis direction. The first inter-trench region 204 may be provided for each contact region 15 or may be provided for each emitter region 12 of the mesa portion 61.

A length L1 of the partial trench 202 in the Y axis direction may be the same as or may be greater than the length D of the first inter-trench region 204 in the Y axis direction. The length L1 may be equal to or greater than the length D and equal to or smaller than twice the length D. A total length of one emitter region 12 and one contact region 15 in the Y axis direction is referred to as a length L2. The sum of the length L1 and the length D may be equal to the length L2.

Here, the first inter-trench region 204 is interposed between the emitter regions 12 in the X axis direction or the first inter-trench region 204 is interposed between the contact regions 15 in the X axis direction. However, the arrangement is not limited to this example. For example, a line of the adjacent partial trenches 202 and a line of the first inter-trench region 204 are aligned in the Y axis direction, or may be offset in the X axis direction. That is, the partial trench may be arranged in a staggered lattice pattern, not in a matrix pattern.

Figure 16:
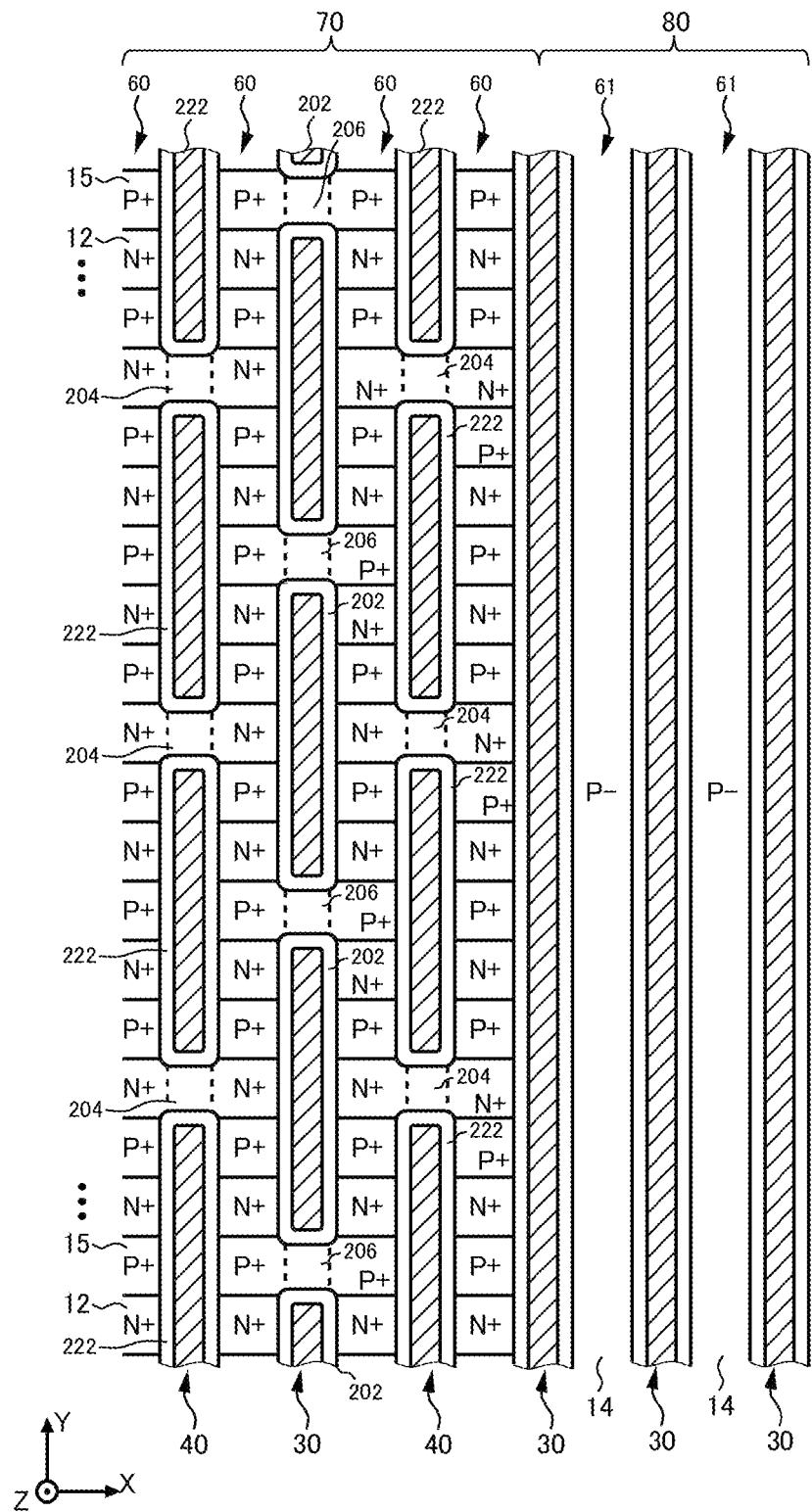
FIG. 16 is a diagram which illustrates another example of the region D.

FIG. 16 is a diagram which illustrates another example of the region D. In the present example, at least one trench portion in the transistor portion 70 is separated into two or more partial trenches in the Y axis direction. That is, at least one gate trench portion 40 may be separated into two or more partial trenches 222. In addition, at least one dummy trench portion 30 of the transistor portion 70 may be separated into two or more partial trenches 202. In addition, at least one gate trench portion 40 may be separated into two or more partial trenches 222 and at least one dummy trench portion 30 may be separated into two or more partial trenches 202. Note that, as in the present example, if the gate trench portion 40 in the transistor portion 70 is separated into two or more partial trenches 222 in the Y axis direction, said gate trench portion 40 may not be provided with the edge portion 41 and may be the gate trench portion 40 of a linear shape. Similarly, if the dummy trench portion 30 in the transistor portion 70 is separated into two or more partial trenches 202 in the Y axis direction, said dummy trench portion 30 may not be provided with the edge portion 31 and may be the dummy trench portion 30 of a linear shape.

The inter-trench region is provided between the partial trenches 222. The inter-trench region between the partial trenches 222 may be the first inter-trench region 204 or may be the second inter-trench region 206. The first inter-trench region 204 may have the same conductivity type and doping concentration as those of the doping region in the mesa portion 60 adjacent in the X axis direction.

The dummy trench portion 30 and the gate trench portion 40 may be provided with the same type of the inter-trench region or may be provided with different types of the inter-trench regions, from among the first inter-trench region 204 and the second inter-trench region 206. The first inter-trench region 204 of the N type may be provided between the partial trenches 222 of the gate trench portion 40. In this case, an area of a channel in a top view can be increased to increase a density of currents.

In addition, if the first inter-trench region 204 is provided between the partial trenches 222, the partial trenches 222 may not be connected by the embedded trench 208 illustrated in FIG. 12 and FIG. 13. This facilitates the base region 14 below the first inter-trench region 204 to function as a channel. On the other hand, the partial trenches 202 may be connected by the embedded trench 208. In another example, the partial trenches 222 may also be connected by the embedded trench 208. In addition, the embedded trench 208 may not be provided in any trench portions.

Figure 17:
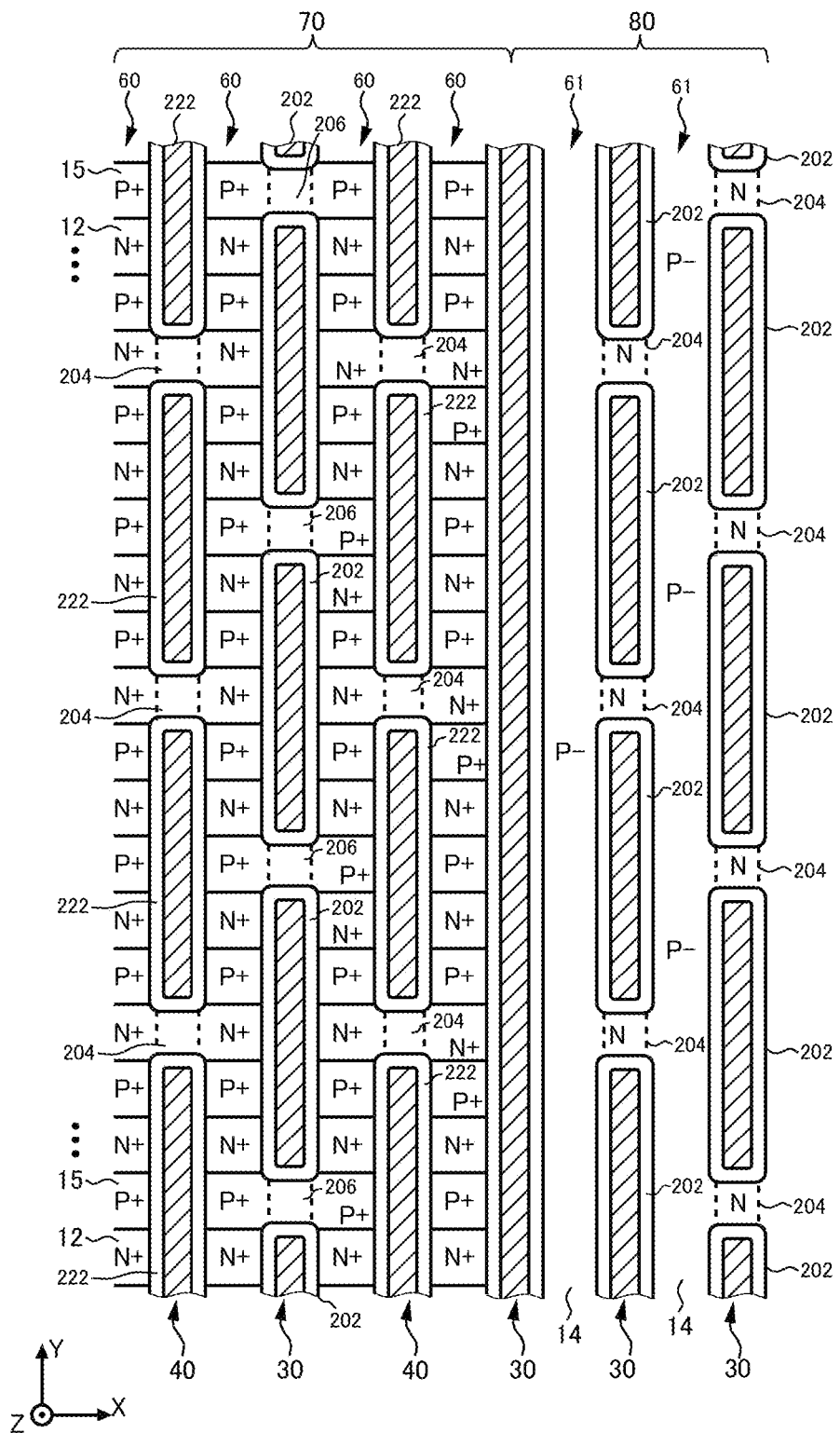
FIG. 17 is a diagram which illustrates another example of the region D.

FIG. 17 is a diagram which illustrates another example of the region D. In the present example, at least one trench portion in each of the transistor portion 70 and the diode portion 80 is separated into two or more partial trenches in the Y axis direction. A structure of the transistor portion 70 may be the same as the example illustrated in FIG. 16. A structure of the diode portion 80 may be the same as that of any examples illustrated in FIG. 6 to FIG. 15.

The trench portion at the boundary between the transistor portion 70 and the diode portion 80 may not be separated into the partial trenches in the Y axis direction. In another example, the trench portion at said boundary may be separated into the partial trenches.

Figure 18A:
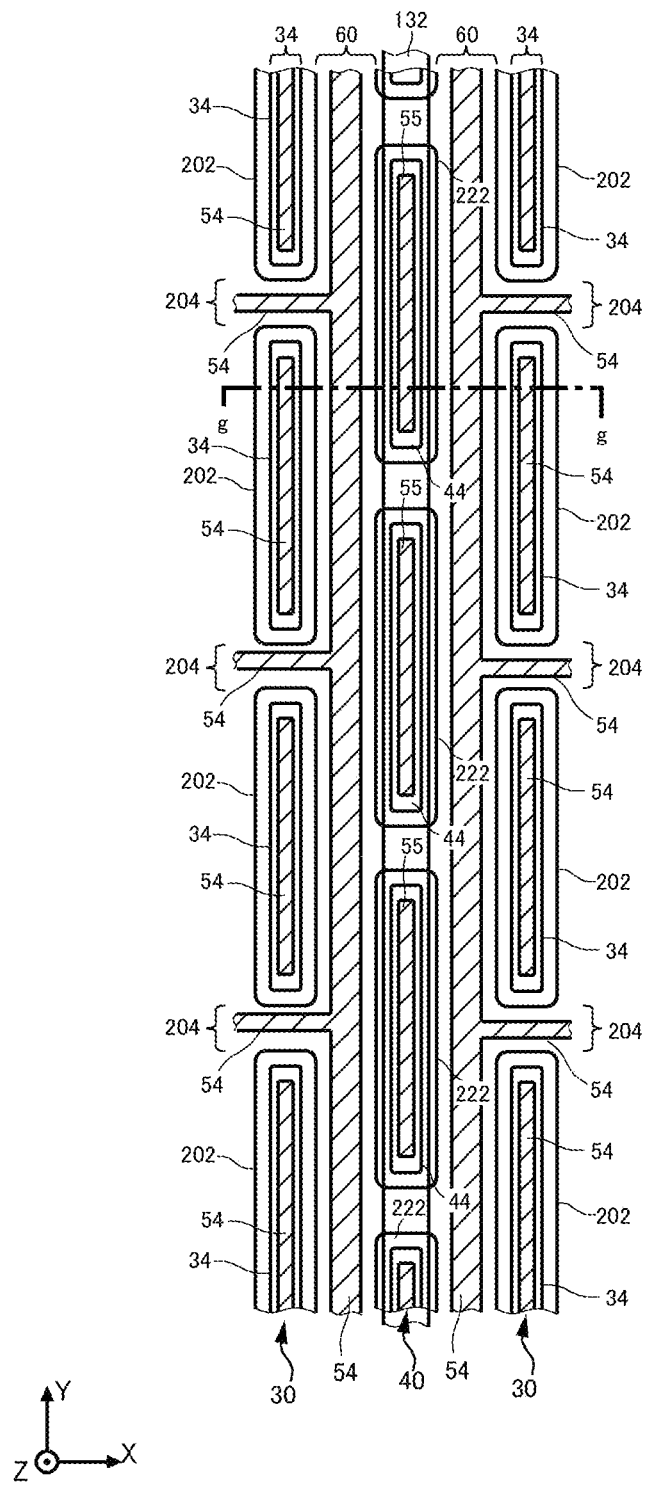
FIG. 18A is a diagram which illustrates an exemplary arrangement of the gate runner if the gate trench portion 40 is separated into the partial trenches 222.

FIG. 18A is a diagram which illustrates an exemplary arrangement of the gate runner if the gate trench portion 40 is separated into the partial trenches 222. Structures other than the gate runner are similar to the examples illustrated in FIG. 1 to FIG. 17.

The gate runner of the present example includes a partial trench wiring 132. The partial trench wiring 132 may be formed of the same material as the outer peripheral gate runner 130 or may be formed of the same material as the active side gate runner 131. The partial trench wiring 132 is connected to the outer peripheral gate runner 130 or the active side gate runner 131 and transmits a gate voltage.

The partial trench wiring 132 of the present example includes a longitudinal side in the Y axis direction along the gate trench portion 40 separated into the partial trenches 222. The partial trench wiring 132 is provided above the partial trench 222 and the inter-trench region. Therefore, the well region 11 is not provided below the partial trench wiring 132. The well region 11 is provided below the outer peripheral gate runner 130 and the active side gate runner 131.

The interlayer dielectric film 38 or the like is provided between the partial trench wiring 132 and the semiconductor substrate 10, although it is omitted in FIG. 18A. In addition, the partial trench wiring 132 is arranged between the emitter electrode 52 and the semiconductor substrate 10. That is, at least a part of the partial trench wiring 132 overlaps the emitter electrode 52 in the Z axis direction. The interlayer dielectric film 38 or the like is also provided between the partial trench wiring 132 and the emitter electrode 52.

The interlayer dielectric film 38 between the partial trench 222 and the partial trench wiring 132 is provided with a contact hole 55. The contact hole 55 is a through hole to connect the gate runner to the semiconductor substrate 10. The contact hole 55 enables the partial trench wiring 132 to connect to the gate conductive portion 44 of each partial trench 222.

The contact hole 55 is not provided above the inter-trench region between the partial trenches 222. An arrangement of the contact hole 54 to connect the emitter electrode 52 to the semiconductor substrate 10 is similar to the example illustrated in FIG. 14. Note that the contact hole 54 is not provided above the inter-trench region between the partial trenches 222 either.

Figure 18B:
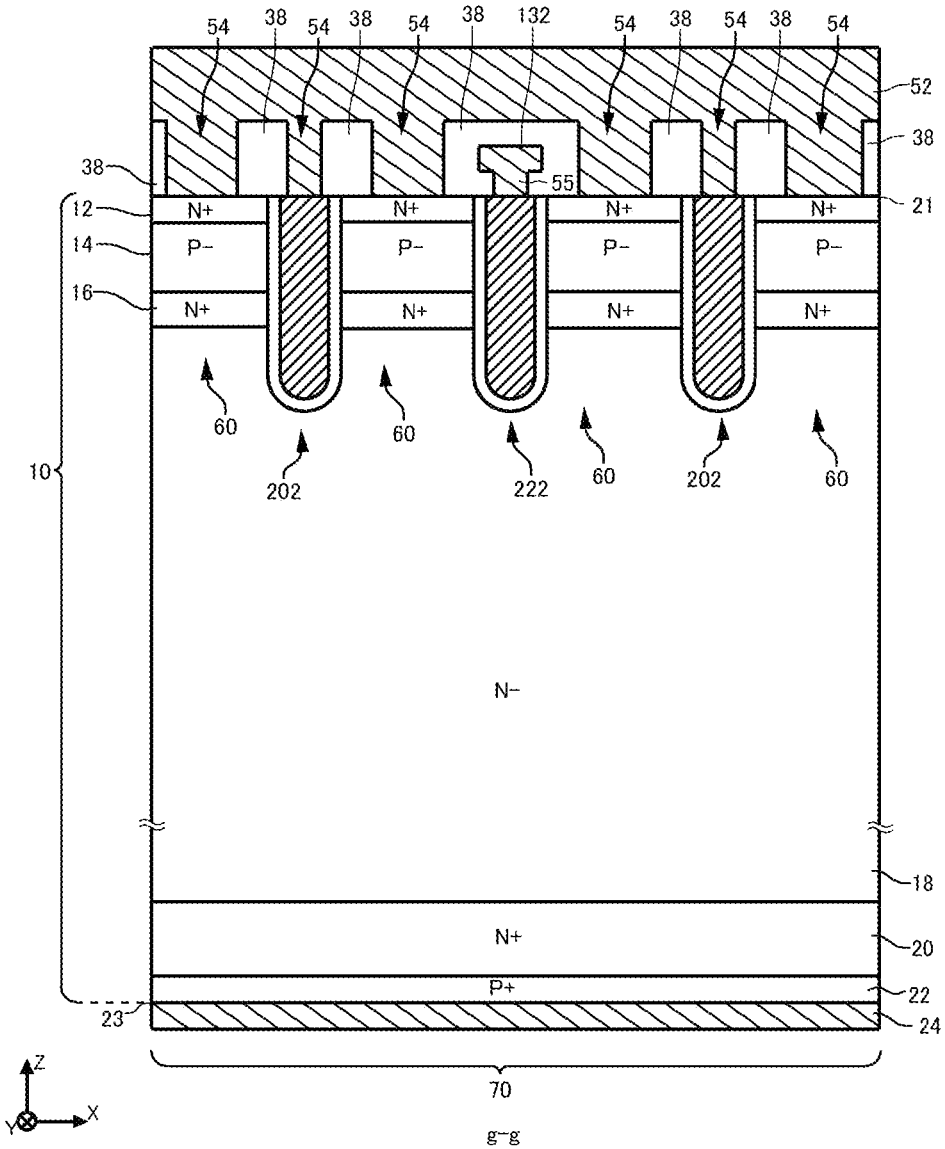
FIG. 18B is an example of a cross section g-g in FIG. 18A.

FIG. 18B is an example of a cross section g-g in FIG. 18A. The cross section g-g is the XZ plane which extends through the partial trench 202 and the partial trench 222. The partial trench wiring 132 is arranged above the partial trench 222. The partial trench wiring 132 connects to the gate conductive portion 44 of the partial trench 222 through the contact hole 55 provided in the interlayer dielectric film 38. The partial trench wiring 132 may be surrounded by the interlayer dielectric film 38.

The emitter electrode 52 includes a portion provided above the partial trench wiring 132. A part of the emitter electrode 52 is arranged to overlap the partial trench wiring 132 in a top view. The emitter electrode 52 and the partial trench wiring 132 are insulated from each other by the interlayer dielectric film 38. A two-layer structure of the partial trench wiring 132 and the emitter electrode 52 can facilitate to transmit the gate voltage to each of the partial trenches 222. The emitter electrode 52 may be connected to an external circuit by way of ultrasonic bonding, soldering or the like of a wire, a lead frame or the like.

The partial trench wiring 132 may be formed of a metal material such as aluminum. This can suppress a delay and an attenuation of the gate voltage applied to the respective partial trenches 222. Note that, while FIG. 18B illustrates the emitter electrode 52 and the semiconductor substrate directly connected by the contact hole 54, a connecting portion between the emitter electrode 52 and the semiconductor substrate may include a metal layer formed during deposition of the partial trench wiring 132.

Figure 19A:
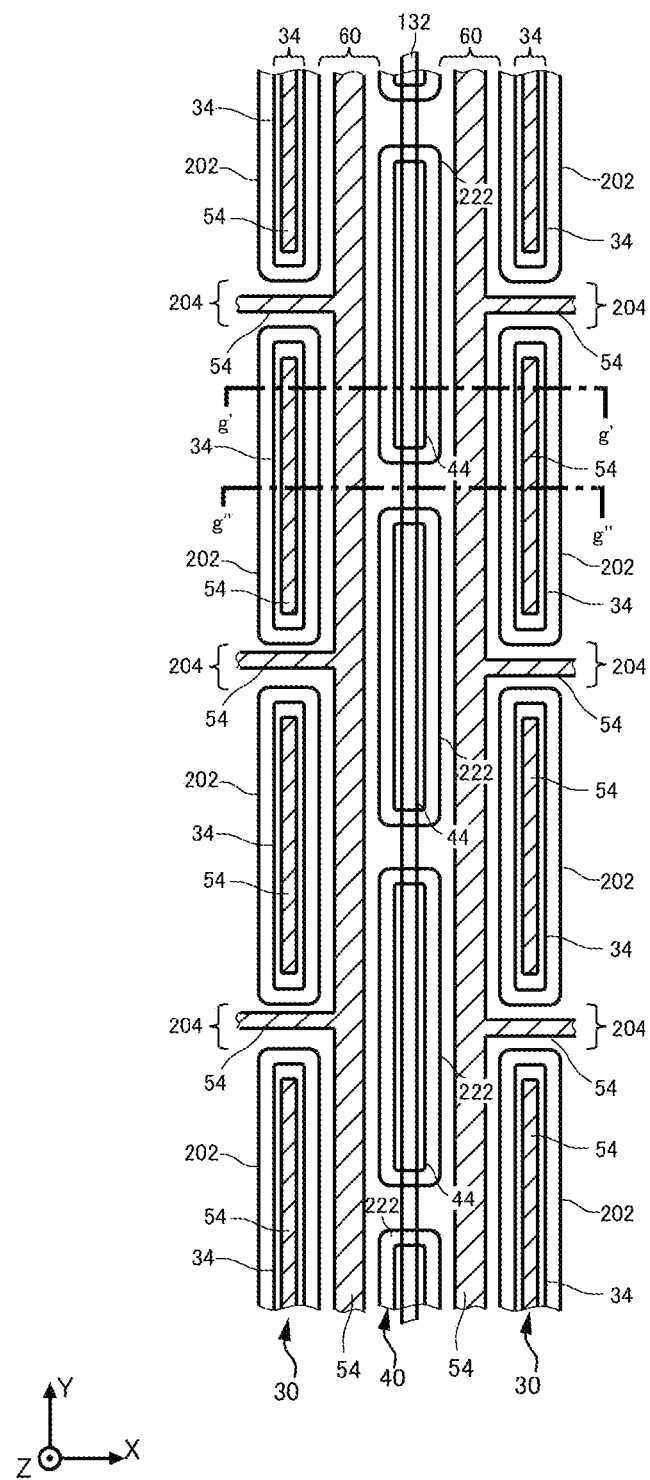
FIG. 19A is a diagram which illustrates another exemplary arrangement of the gate runner if the gate trench portion 40 is separated into the partial trenches 222.

FIG. 19A is a diagram which illustrates another exemplary arrangement of the gate runner if the gate trench portion 40 is separated into the partial trenches 222. The partial trench wiring 132 of the present example is formed of the same material as the gate conductive portion 44. In this case, this can facilitate to form the gate conductive portion 44 and the partial trench wiring 132 in the same process. For example, in the process of filling polysilicon inside the gate trench portion 40 to form the gate conductive portion 44, polysilicon is formed on the upper surface 21 of the semiconductor substrate 10 for the partial trench wiring 132. This allows the gate conductive portion 44 and the partial trench wiring 132 to be formed in the same process. Structures other than the partial trench wiring 132 are similar to the examples illustrated in FIG. 18A and FIG. 18B.

In the present example, the gate conductive portion 44 and the partial trench wiring 132 are formed in the same process. The interlayer dielectric film 38 is formed after the gate conductive portion 44 and the partial trench wiring 132. Therefore, the interlayer dielectric film 38 of the present example is not provided with the contact hole 55 to connect the partial trench wiring 132 to the partial trench 222.

In the present example, the partial trench wiring 132 is provided to extend across a plurality partial trenches 222 in the Y axis direction. The partial trench wiring 132 is not connected to the inter-trench region between the partial trenches 222. An insulating film such as LOCOS may be provided between the partial trench wiring 132 and the inter-trench region. Said insulating film is formed on the upper surface 21 of the semiconductor substrate 10 before the gate conductive portion 44 and the partial trench wiring 132 are formed.

Figure 19B:
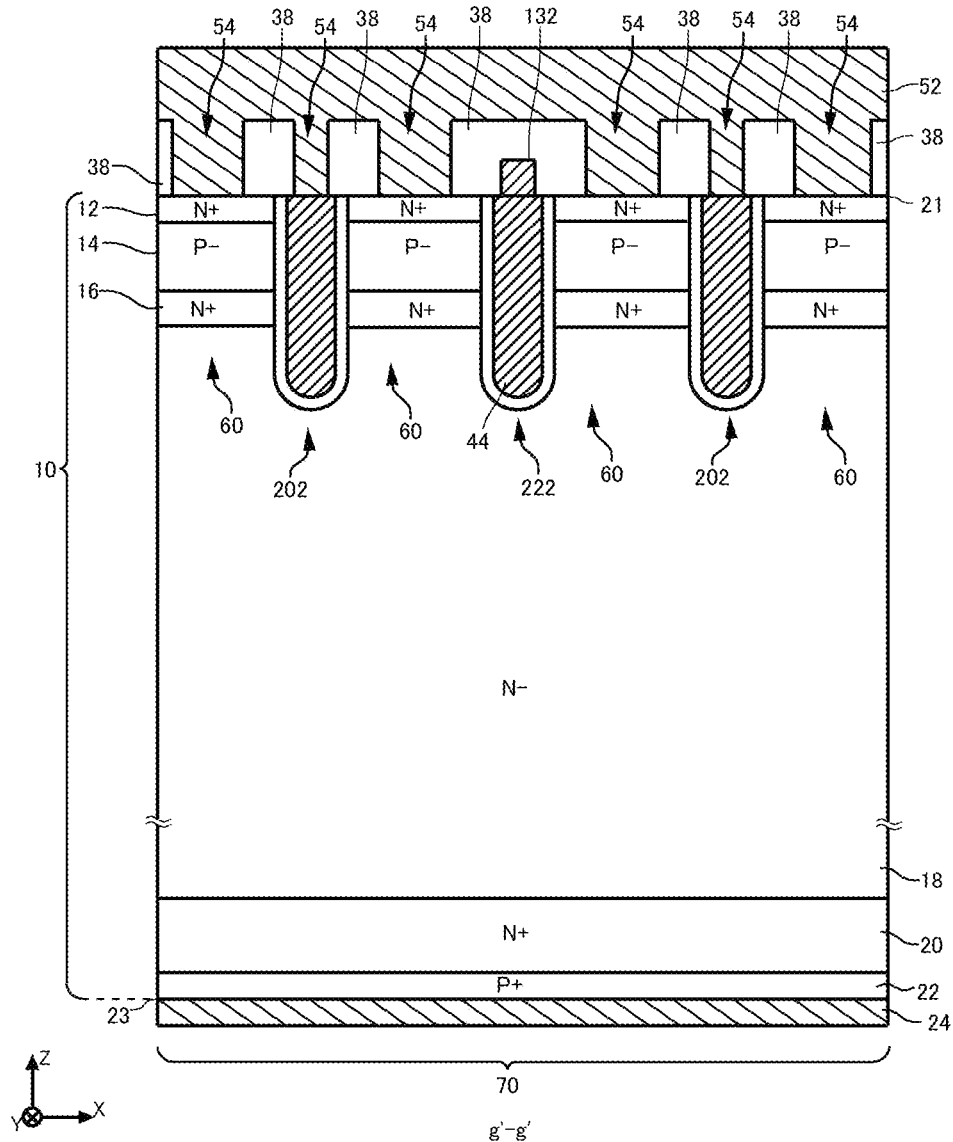
FIG. 19B is an example of a cross section g'-g' in FIG. 19A.

FIG. 19B is an example of a cross section g'-g' in FIG. 19A. The cross section g'-g' is the XZ plane which extends through the partial trench 202 and the partial trench 222. The partial trench wiring 132 is arranged above the upper surface 21 of the semiconductor substrate 10, continuously from the gate conductive portion 44 of the partial trench 222. The partial trench wiring 132 may be surrounded by the inter-layer dielectric film 38. Structures other than the partial trench wiring 132 are similar to the example illustrated in FIG. 18B.

Figure 19C:
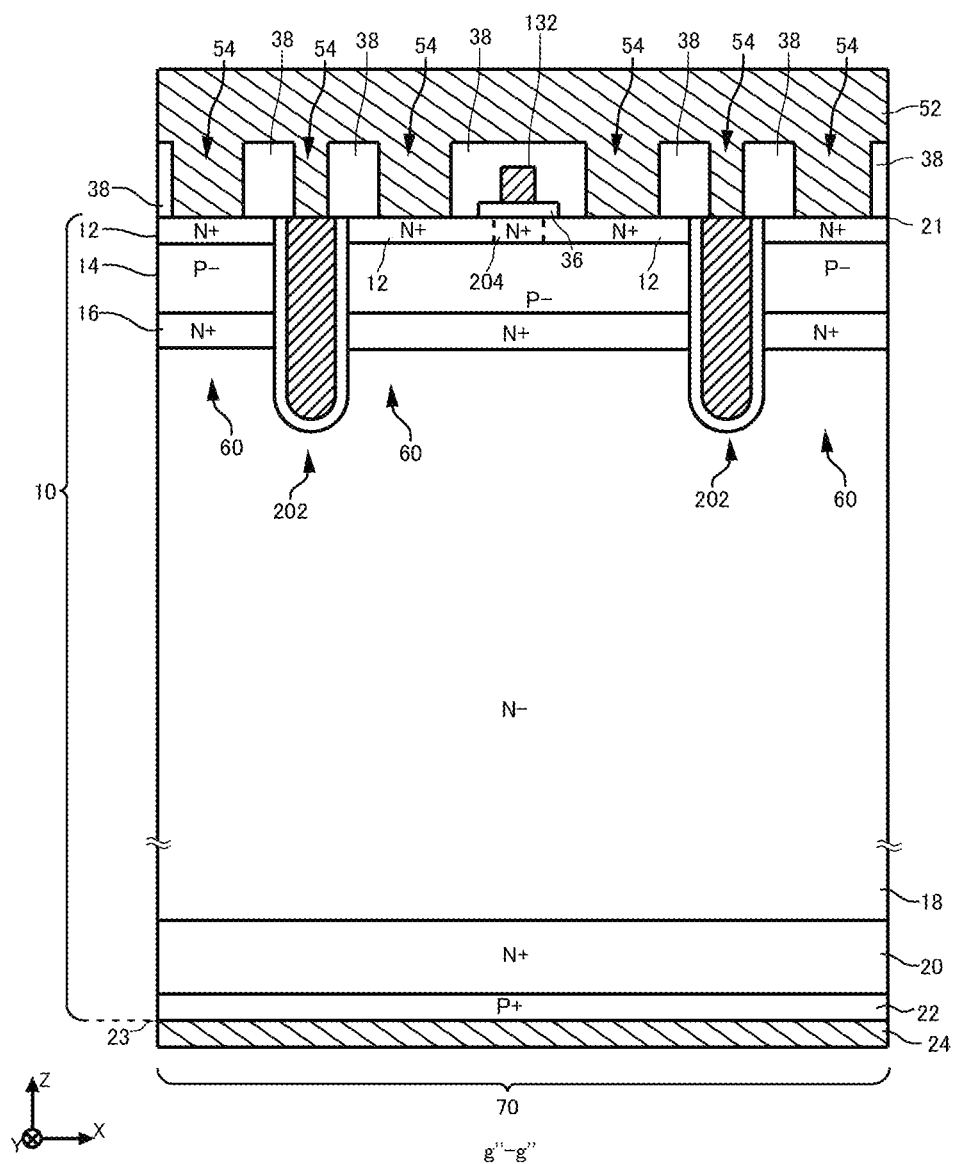
FIG. 19C is an example of a cross section g"-g" in FIG. 19A.

FIG. 19C is an example of a cross section g"-g" in FIG. 19A. The cross section g"-g" is the XZ plane which extends through the partial trench 202 and the inter-trench region between the partial trenches 222 (for example, the first inter-trench region 204). The partial trench wiring 132 is provided above the first inter-trench region 204. Note that an insulating film 36 is provided between the first inter-trench region 204 and the partial trench wiring 132. The insulating film 36 may be a film formed by locally oxidizing the upper surface 21 of the semiconductor substrate 10. Such a structure can also facilitate to transmit the gate voltage to each of the partial trenches 222.

Figure 20:
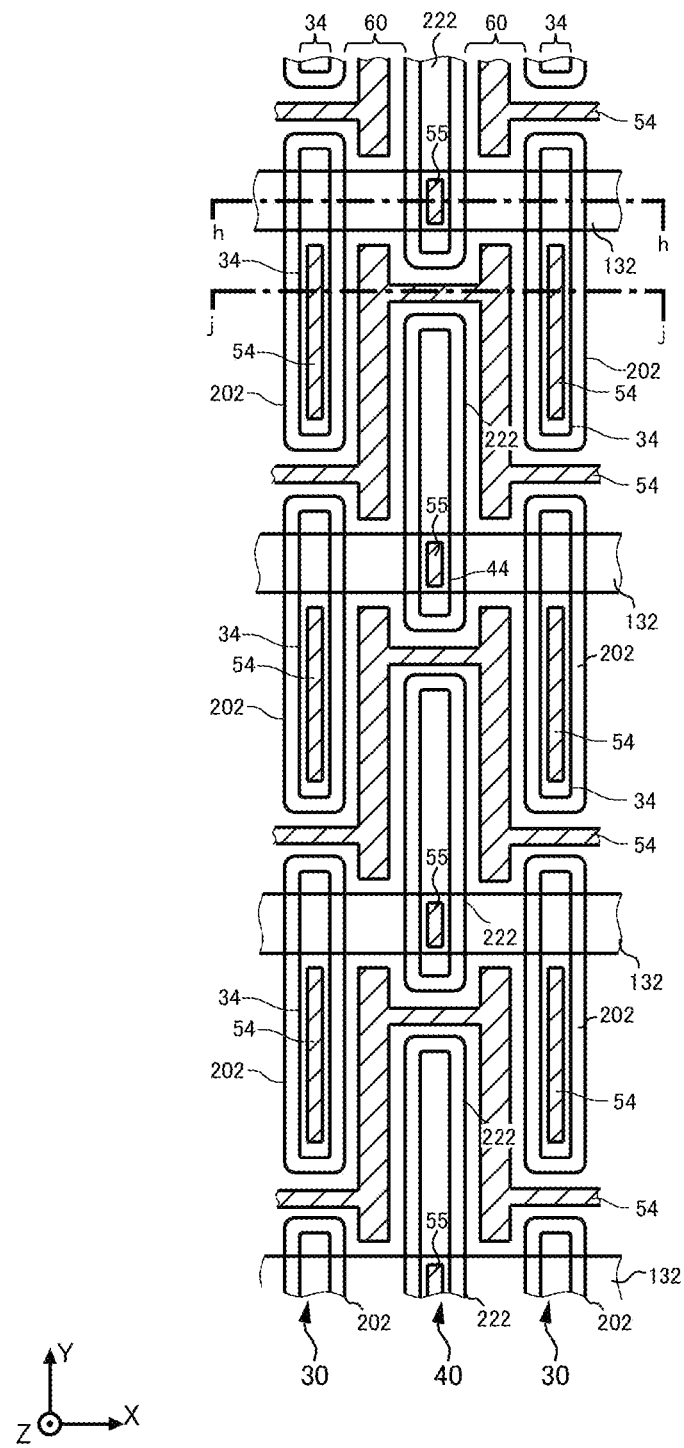
FIG. 20 is a diagram which illustrates another exemplary arrangement of the partial trench wiring 132.

FIG. 20 is a diagram which illustrates another exemplary arrangement of the partial trench wiring 132. While the partial trench wiring 132 illustrated in FIG. 18A or FIG. 19A include a longitudinal side in the Y axis direction, the partial trench wiring 132 of the present example includes a longitudinal side in the X axis direction. Structures other than the partial trench wiring 132 are similar to the examples illustrated in FIG. 1 to FIG. 19C.

A plurality of partial trench wirings 132 of the present example are arranged in the Y axis direction each of which is for each partial trench 222 arranged in the Y axis direction. End portions of each partial trench wiring 132 in the X axis direction may be connected to the outer peripheral gate runner 130.

Each partial trench wiring 132 includes a portion which overlaps the partial trench 222. The contact hole 55 is provided in the interlayer dielectric film 38 between the partial trench wiring 132 and the partial trench 222.

The partial trench wiring 132 may include a portion which overlaps the partial trench 202. The interlayer dielectric film 38 between the partial trench wiring 132 and the partial trench 202 is not provided with a contact hole.

The partial trench wiring 132 may include a portion which overlaps the mesa portion 60. The interlayer dielectric film 38 between the partial trench wiring 132 and the mesa portion 60 is not provided with a contact hole.

The partial trench wiring 132 may include a portion which overlaps the diode portion 80. The interlayer dielectric film 38 between the partial trench wiring 132 and the diode portion 80 is not provided with a contact hole.

In addition, the contact hole 54 is not provided in a position which overlaps the partial trench wiring 132. For example, the contact hole 54 of the mesa portion 60 is separated by the partial trench wiring 132. In addition, the contact hole 54 of the partial trench 202 is provided in an area which does not overlap the partial trench wiring 132.

Figure 21:
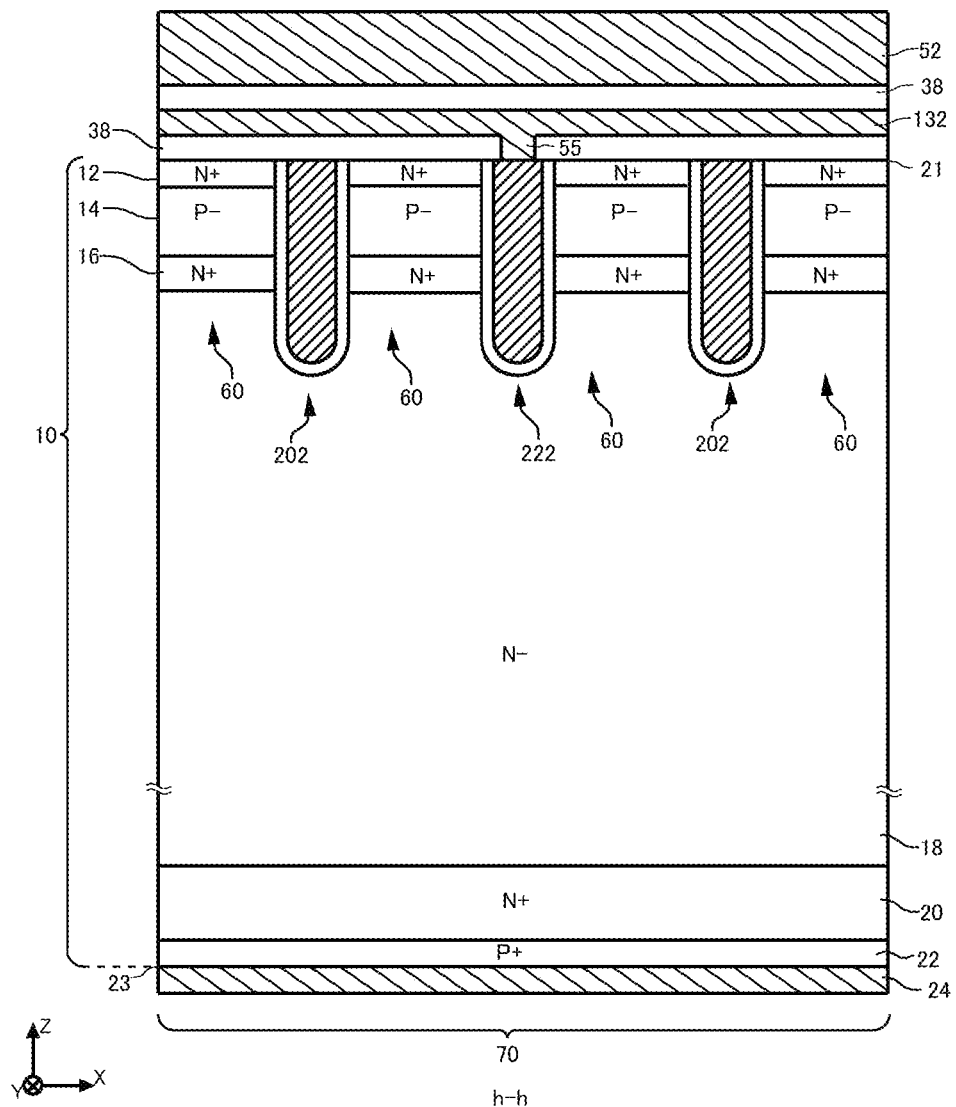
FIG. 21 is a diagram which illustrates an example of a cross section h-h in FIG. 20.

FIG. 21 is a diagram which illustrates an example of a cross section h-h in FIG. 20. The cross section h-h is the XZ plane which extends through the partial trench wiring 132. The partial trench wiring 132 connects to the gate conductive portion 44 of the partial trench 222 through the contact hole 55 provided in the interlayer dielectric film 38.

The emitter electrode 52 is arranged above the partial trench wiring 132. The emitter electrode 52 and the partial trench wiring 132 are insulated from each other by the interlayer dielectric film 38 or the like.

Figure 22:
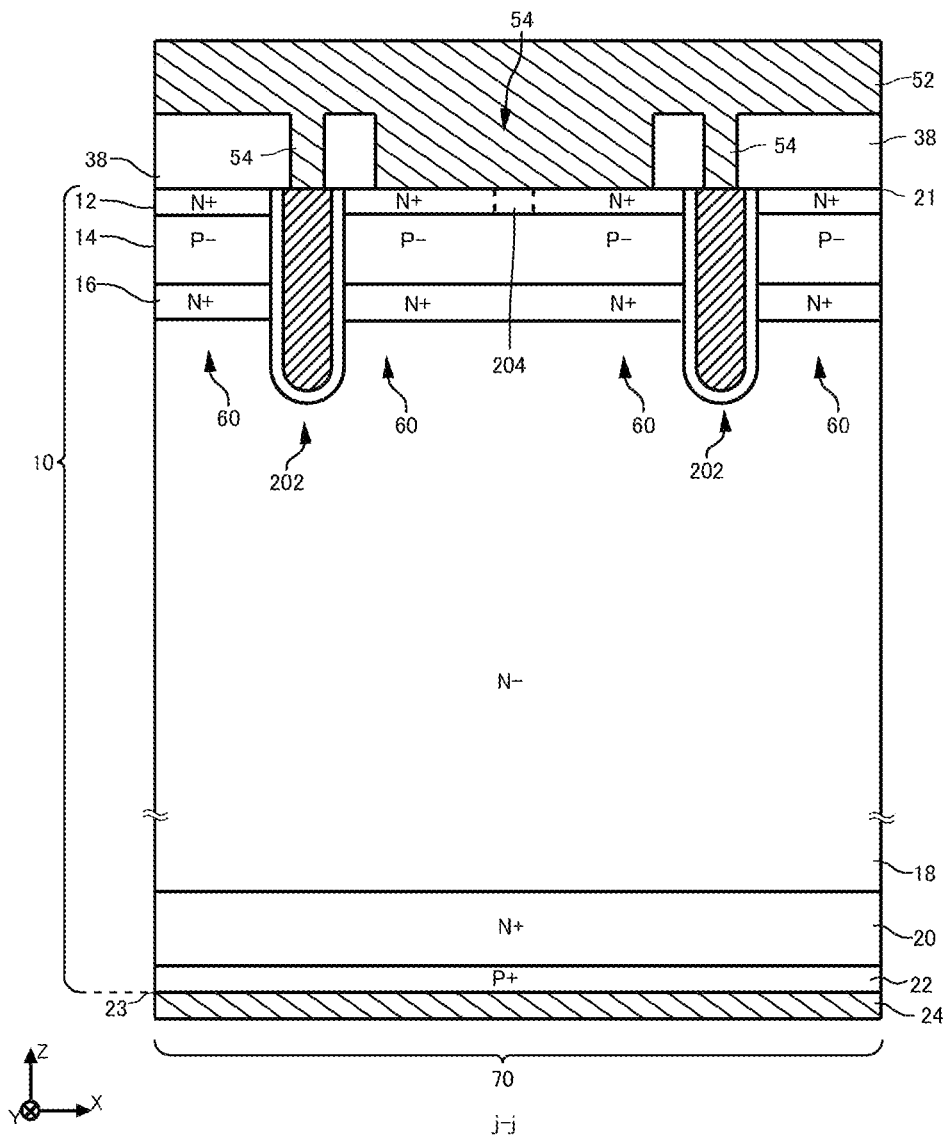
FIG. 22 is a diagram which illustrates an example of a cross section j-j in FIG. 20.

FIG. 22 is a diagram which illustrates an example of a cross section j-j in FIG. 20. The cross section j-j is the XZ plane which extends through the partial trench 202 and the first inter-trench region 204. The emitter electrode 52 connects to the dummy conductive portion 34 of the partial trench 202 through the contact hole 54. In addition, the emitter electrode 52 connects to the emitter region 12 of the mesa portion 60 and the first inter-trench region 204 through the contact hole 54.

Figure 23:
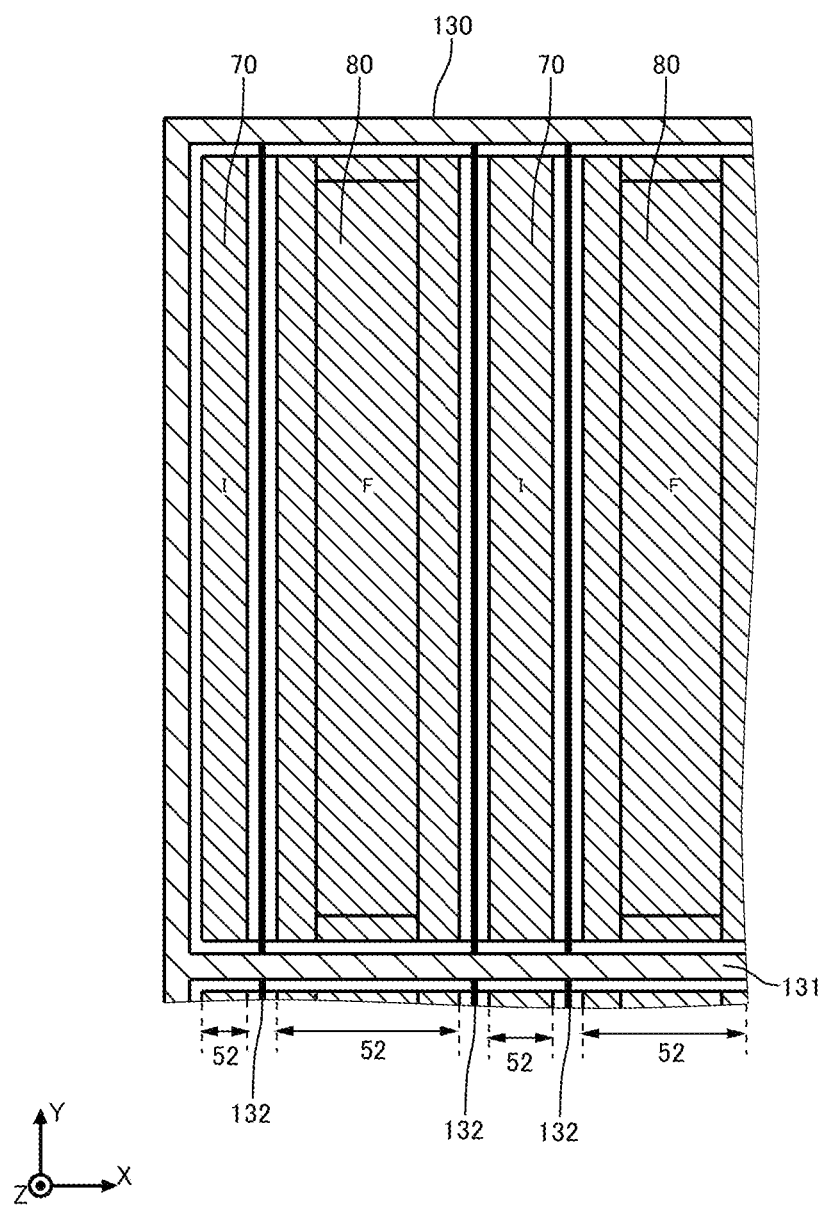
FIG. 23 is a diagram which illustrates another exemplary arrangement of the partial trench wiring 132 and the emitter electrode 52.

FIG. 23 is a diagram which illustrates another exemplary arrangement of the partial trench wiring 132 and the emitter electrode 52. FIG. 23 is an enlarged top view of a part of the active portion 160. In the present example, the partial trench wiring 132 and the emitter electrode 52 are arranged not to overlap each other in a top view. FIG. 23 illustrates the partial trench wiring 132 by thick solid lines and the emitter electrode 52 hatched with finer inclined lines than those of the gate runner. FIG. 23 schematically illustrates a part of the partial trench wiring 132.

The partial trench wiring 132 of the present example includes a longitudinal side in the Y axis direction in the similar manner to the example illustrated in FIG. 18A or FIG. 19A. End portions of the partial trench wiring 132 in the Y axis direction are connected to the outer peripheral gate runner 130 or the active side gate runner 131. The partial trench wiring 132 is provided for each gate trench portion 40 divided into the partial trenches 222.

The emitter electrode 52 is provided in a region above the active portion 160 which is not provided with the partial trench wiring 132. The emitter electrode 52 does not overlap or contact the partial trench wiring 132 in a top view. That is, the emitter electrode 52 is arranged distant from the partial trench wiring 132 in a top view. The interlayer dielectric film 38 may be provided between the emitter electrode 52 and the partial trench wiring 132.

Figure 24:
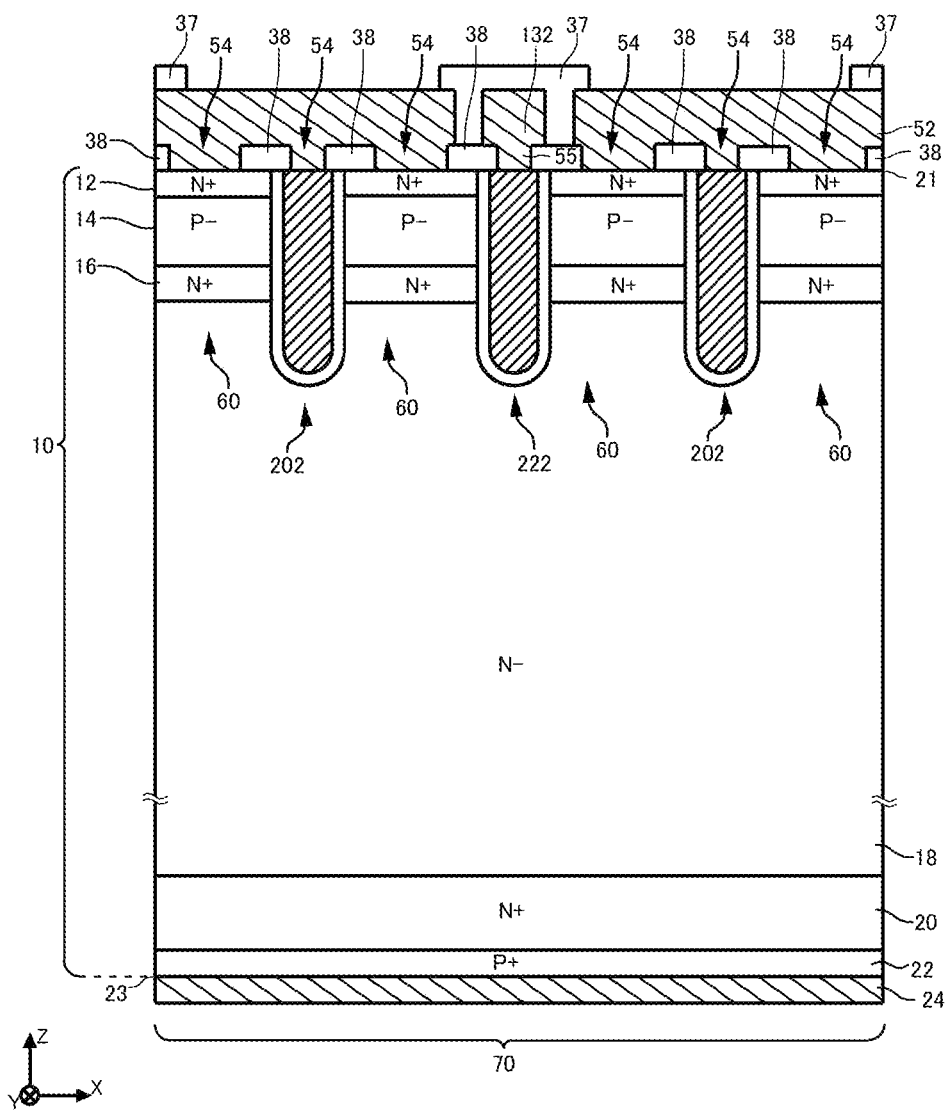
FIG. 24 illustrates an example of the XZ cross section in the example of FIG. 23.

FIG. 24 illustrates an example of the XZ cross section in the example of FIG. 23. Said cross section extends through the partial trench 202 and the partial trench 222. The partial trench wiring 132 is provided above the partial trench 222. The partial trench wiring 132 connects to the partial trench 222 through the contact hole 55 provided in the interlayer dielectric film 38.

The emitter electrode 52 is provided in an area which does not overlap the partial trench wiring 132. The emitter electrode 52 includes a portion provided in the same position as the partial trench wiring 132 in the Z axis direction. That is, the emitter electrode 52 and the partial trench wiring 132 are provided in the same layer. The emitter electrode 52 connects to the semiconductor substrate 10 through the contact hole 54 provided in the interlayer dielectric film 38. The interlayer dielectric film 38 is also provided between the emitter electrode 52 and the partial trench wiring 132.

An upper surface of the partial trench wiring 132 may be covered with the interlayer dielectric film 38. In addition, a protective film 37 such as polyimide may be provided above the partial trench wiring 132. The protective film 37 may be provided up to an area above the upper surface of the emitter electrode 52. All of the respective emitter electrodes 52 separated by the partial trench wiring 132 may be connected to an external circuit.

Figure 25A:
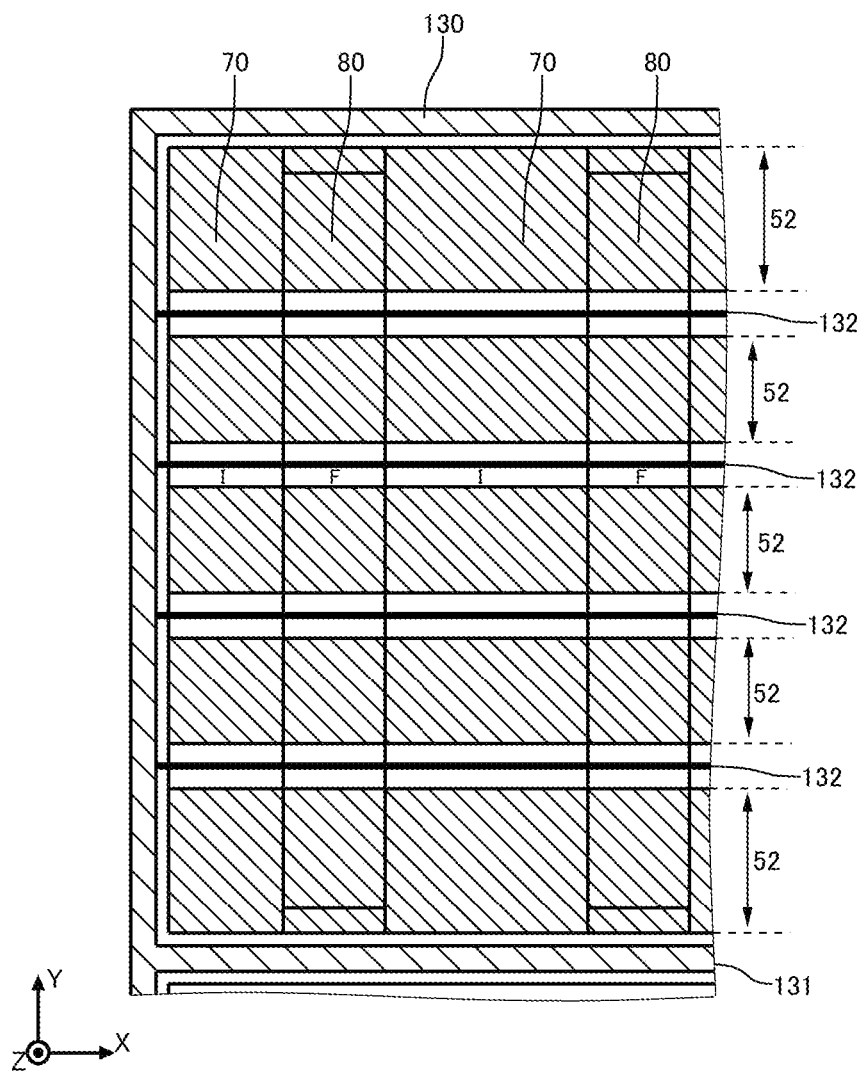
FIG. 25A is a diagram which illustrates another exemplary arrangement of the partial trench wiring 132 and the emitter electrode 52.

FIG. 25A is a diagram which illustrates another exemplary arrangement of the partial trench wiring 132 and the emitter electrode 52. In the present example, the partial trench wiring 132 is different from the examples of FIG. 23 and FIG. 24 in including a longitudinal side in the X axis direction. The other structures are similar to the examples of FIG. 23 and FIG. 24.

End portions of the partial trench wiring 132 of the present example in the X axis direction are connected to the outer peripheral gate runner 130. The partial trench wiring 132 may be provided for each of the partial trenches 222 arranged in the Y axis direction. FIG. 25A schematically illustrates a part of the partial trench wiring 132.

The emitter electrode 52 is provided in a region above the active portion 160 which is not provided with the partial trench wiring 132. The emitter electrode 52 does not overlap or contact the partial trench wiring 132 in a top view. That is, the emitter electrode 52 is arranged distant from the partial trench wiring 132 in a top view. The interlayer dielectric film 38 may be provided between the emitter electrode 52 and the partial trench wiring 132. All of the respective emitter electrodes 52 separated by the partial trench wiring 132 may be connected to an external circuit.

Figure 25B:
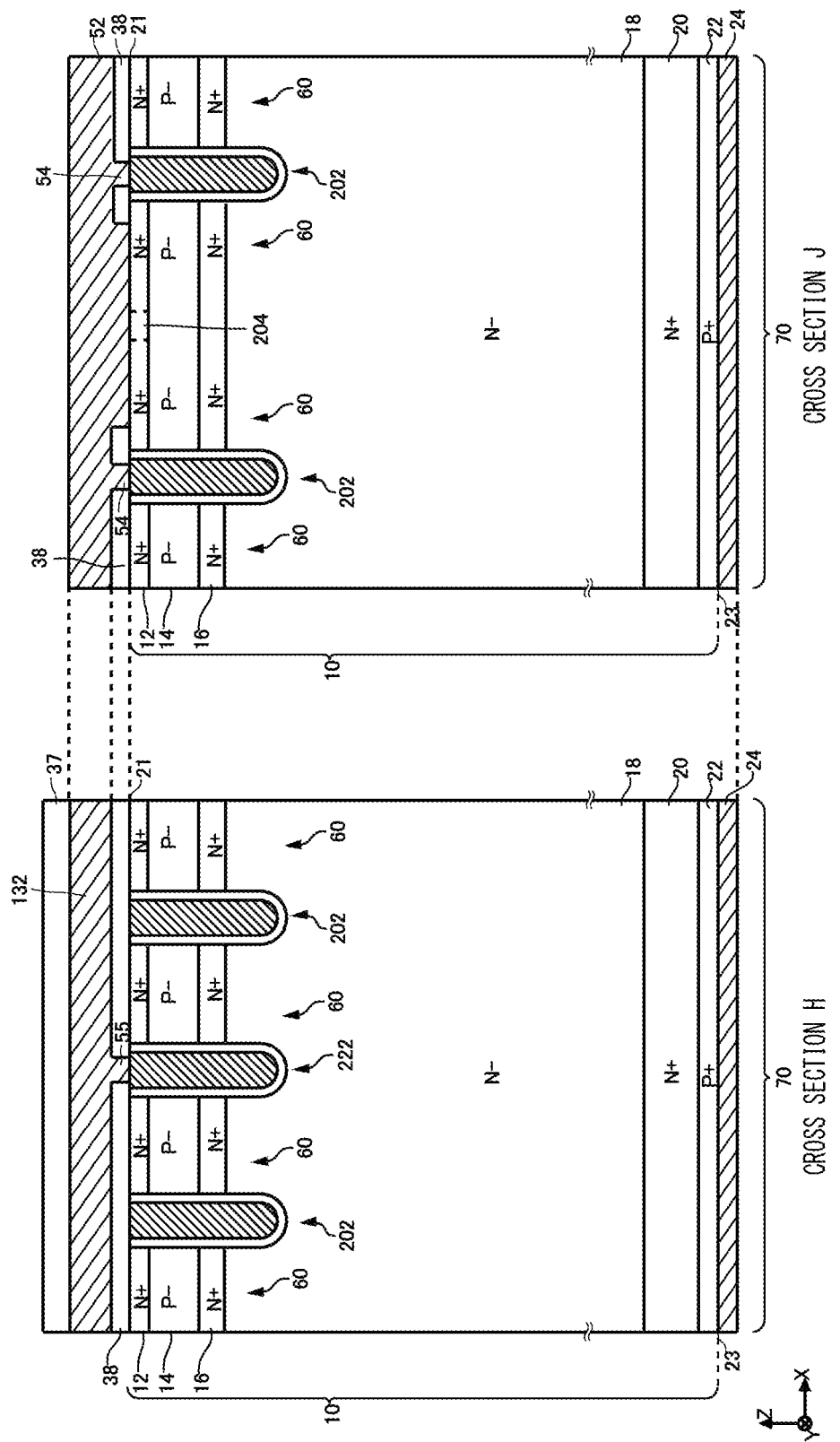
FIG. 25B illustrates an example of the XZ cross section of the semiconductor device 100 in the example of FIG. 25A.

FIG. 25B illustrates an example of the XZ cross section of the semiconductor device 100 in the example of FIG. 25A. In FIG. 25B, a cross section H is a cross section which extends through the partial trench wiring 132 in FIG. 25A and a cross section J is a cross section which extends through the emitter electrode 52 in FIG. 25A. The cross section H extends through the partial trench 222 and the partial trench 202 in the similar manner to the cross section h-h illustrated in FIG. 21. In addition, the cross section J extends through the first inter-trench region 204 in the similar manner to the cross section j-j illustrated in FIG. 22.

In the present example, in the similar manner to the example of FIG. 24, the partial trench wiring 132 and the emitter electrode 52 are provided in the same layer. Note that, as illustrated in FIG. 25A, the partial trench wiring 132 and the emitter electrode 52 are provided to be separated from each other in the Y axis direction. The upper surface of the partial trench wiring 132 may be covered with the protective film 37.

Figure 26:
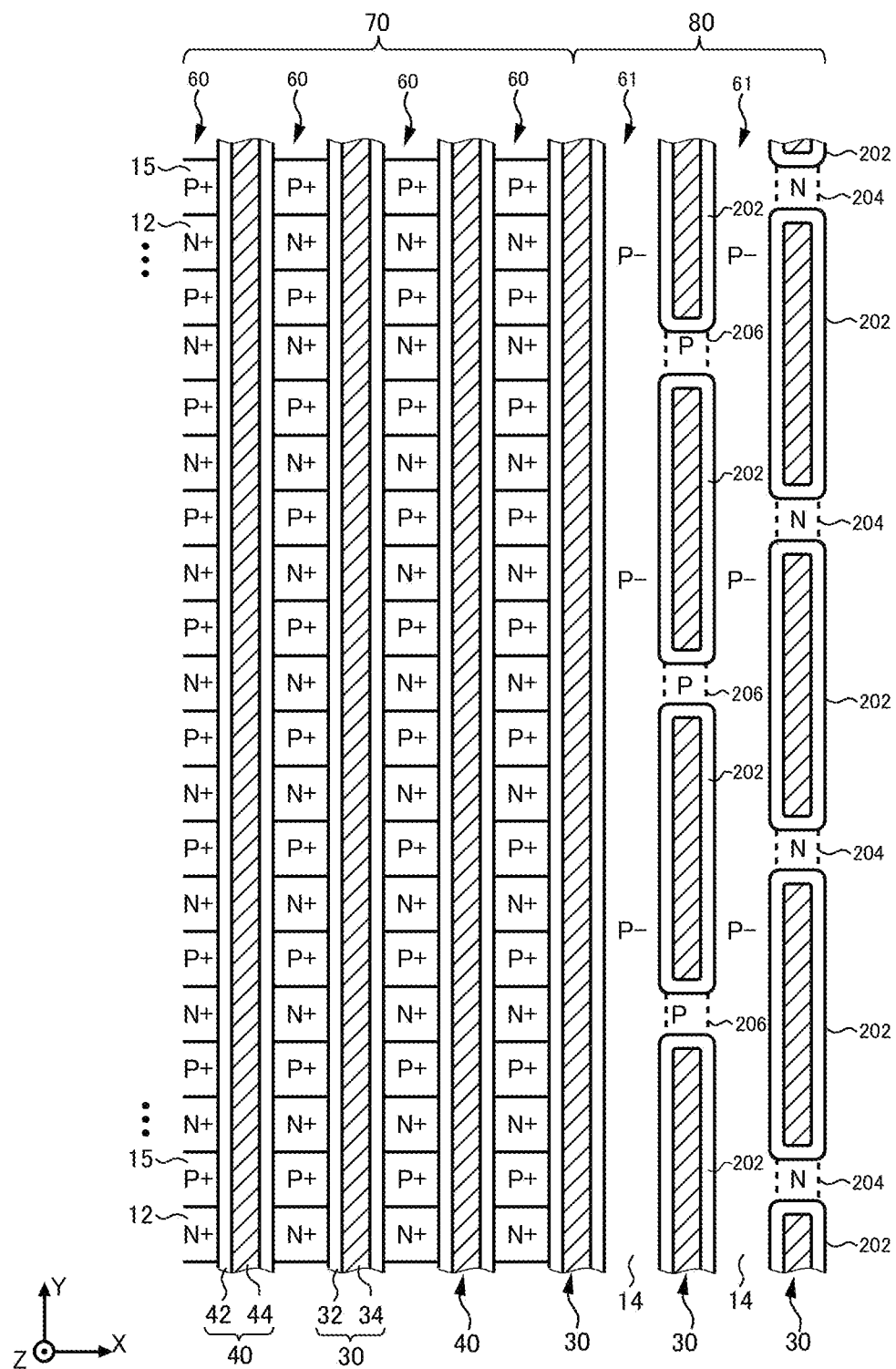
FIG. 26 is a diagram which illustrates another exemplary structure of the region D.

FIG. 26 is a diagram which illustrates another exemplary structure of the region D. In the present example, the conductivity type of the inter-trench region in the diode portion 80 is different from the examples illustrated in FIG. 1 to FIG. 25B. The other structures are similar to the examples illustrated in FIG. 1 to FIG. 25B.

The diode portion 80 of the present example includes both of the first inter-trench region 204 and the second inter-trench region 206. As an example, some dummy trench portions 30 are provided with the first inter-trench region 204 while other dummy trench portions 30 are provided with the second inter-trench region 206.

The first inter-trench region 204 may be arranged distant from the transistor portion 70 than the second inter-trench region 206 in the X axis direction. The second inter-trench region 206 of the P type is arranged in the vicinity of the transistor portion 70 such that holes flowing from the transistor portion 70 to the diode portion 80 are easily extracted at the second inter-trench region 206. This can improve the switching characteristics of the diode portion 80 in the vicinity of the boundary with respect to the transistor portion 70.

Figure 27A:
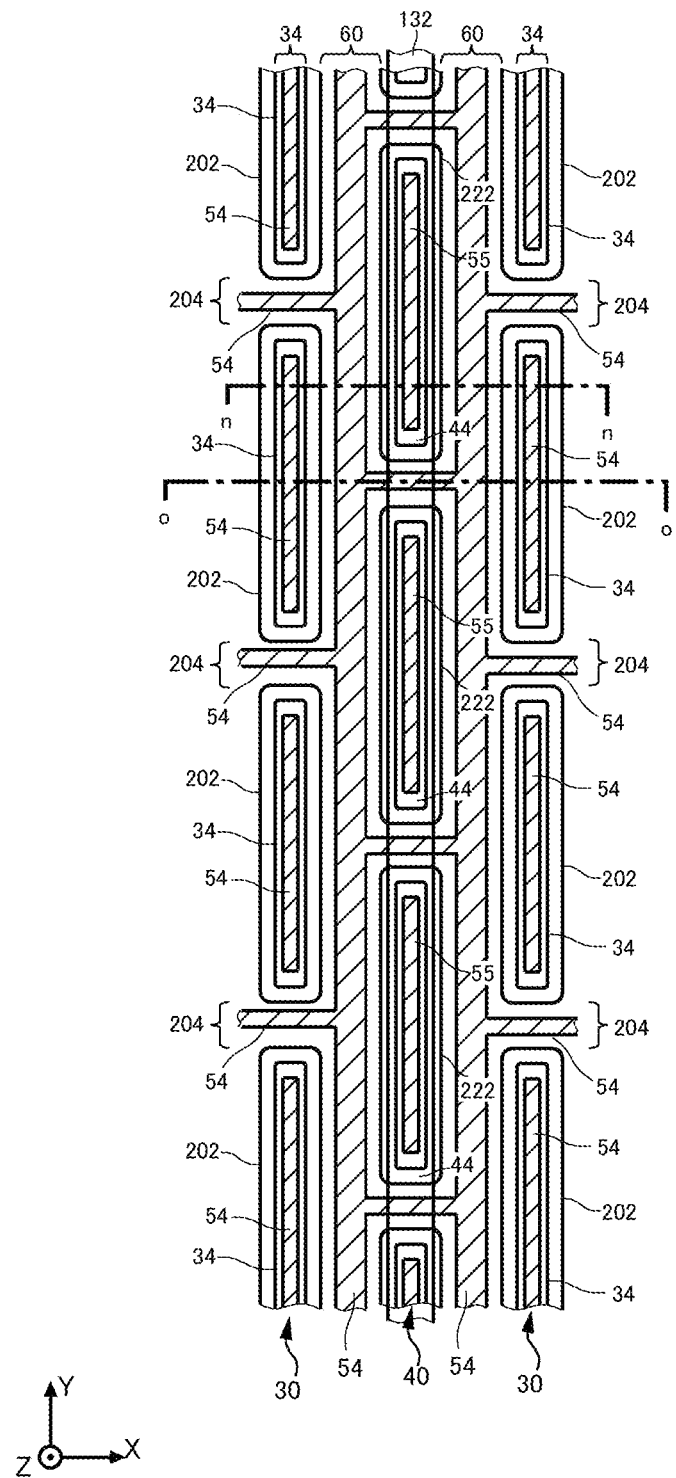
FIG. 27A illustrates a top view of the semiconductor device 100.
Figure 27B:
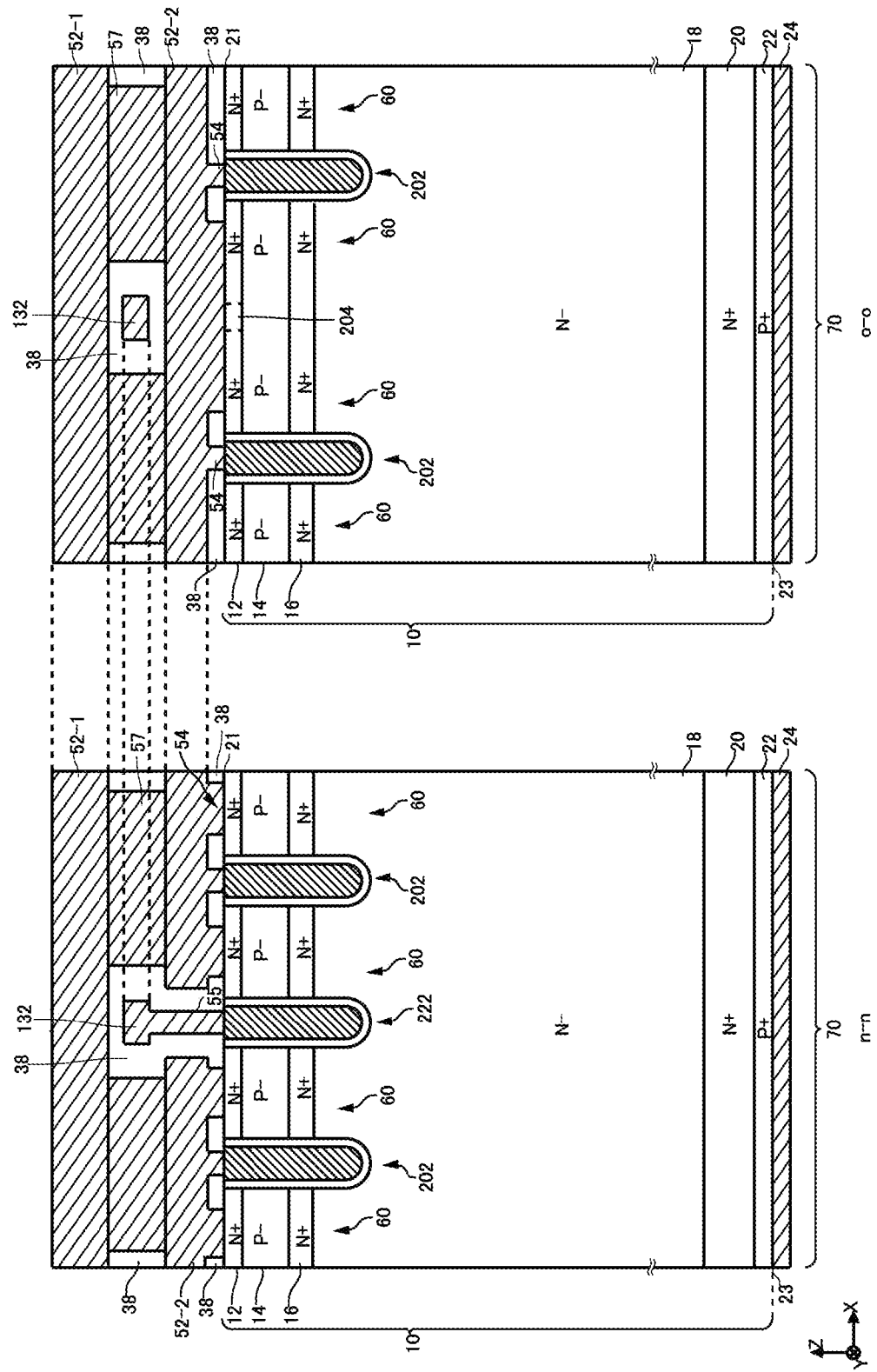
FIG. 27B is a diagram which illustrates a cross section n-n and a cross section o-o in FIG. 27A.

FIG. 27A and FIG. 27B are diagrams which illustrate another exemplary arrangement of the emitter electrode 52 and the partial trench wiring 132 above the upper surface 21 of the semiconductor substrate 10.

FIG. 27A illustrates a top view of the semiconductor device 100. In the semiconductor device 100 of the present example, each trench portion and the partial trench wiring 132 are arranged in the similar manner to the example of FIG. 18A. FIG. 27B is a diagram which illustrates a cross section n-n and a cross section o-o in FIG. 27A. The cross section n-n is the XZ plane which extends through the partial trench 202 and the partial trench 222. The cross section o-o is the XZ plane which extends through the first inter-trench region 204.

The emitter electrode 52 of the present example includes a terminal layer 52-1 and a substrate connection layer 52-2, as illustrated in FIG. 27B. The substrate connection layer 52-2 is the same as the emitter electrode 52 illustrated in FIG. 1 to FIG. 26. The terminal layer 52-1 is arranged above the substrate connection layer 52-2. In addition, an external wiring may be connected to the terminal layer 52-1.

The interlayer dielectric film 38 and the partial trench wiring 132 are provided between the terminal layer 52-1 and the substrate connection layer 52-2. The terminal layer 52-1 connects a plurality of substrate connection layers 52-2 separated by the interlayer dielectric film 38 and the partial trench wiring 132 with one another. The interlayer dielectric film 38 is provided with a contact hole 57 to connect the terminal layer 52-1 to the substrate connection layer 52-2. The emitter electrode 52 also fills the inside of the contact hole 57.

The partial trench wiring 132 is insulated from the emitter electrode 52 by the interlayer dielectric film 38. As illustrated in the cross section n-n, the partial trench wiring 132 is connected to the partial trench 222 through the contact hole 55 provided in the interlayer dielectric film 38. A region through which the contact hole 55 extends is not provided with the substrate connection layer 52-2.

In addition, as illustrated in the cross section o-o, the first inter-trench region 204 connects to the substrate connection layer 52-2. That is, the substrate connection layer 52-2 is provided between the first inter-trench region 204 and the partial trench wiring 132. The partial trench wiring 132 arranged above the first inter-trench region 204 may be interposed between the contact holes 57 in the X axis direction. The interlayer dielectric film 38 is provided between the partial trench wiring 132 and the contact hole 57. In this manner, three layer of the substrate connection layer 52-2, the partial trench wiring 132 and the terminal layer 52-1 are provided such that the first inter-trench region 204 below the partial trench wiring 132 can also connect to the emitter electrode 52. This can enlarge a region through which carriers flow to and from the emitter electrode 52.

The contact hole 55 of the present example may be formed by continuously etching the interlayer dielectric film 38 from the partial trench wiring 132 to the upper surface 21 of the semiconductor substrate 10, or may be formed by etching in a plurality of separate processes. For example, if a plurality of layers of the interlayer dielectric films 38 are stacked, the contact hole 55 may be formed and then the contact hole 55 may be filled with a conductive material therein, in each process of forming each layer of the interlayer dielectric film 38. The contact hole 57 may also be formed by continuously etching the interlayer dielectric film 38 from the terminal layer 52-1 to the substrate connection layer 52-2, or may also be formed by etching in a plurality of separate processes. Note that the structure including the three layers of the substrate connection layer 52-2, the partial trench wiring 132 and the terminal layer 52-1 may be applied to the respective embodiments illustrated in FIG. 1 to FIG. 26 as appropriate.

Figure 27C:
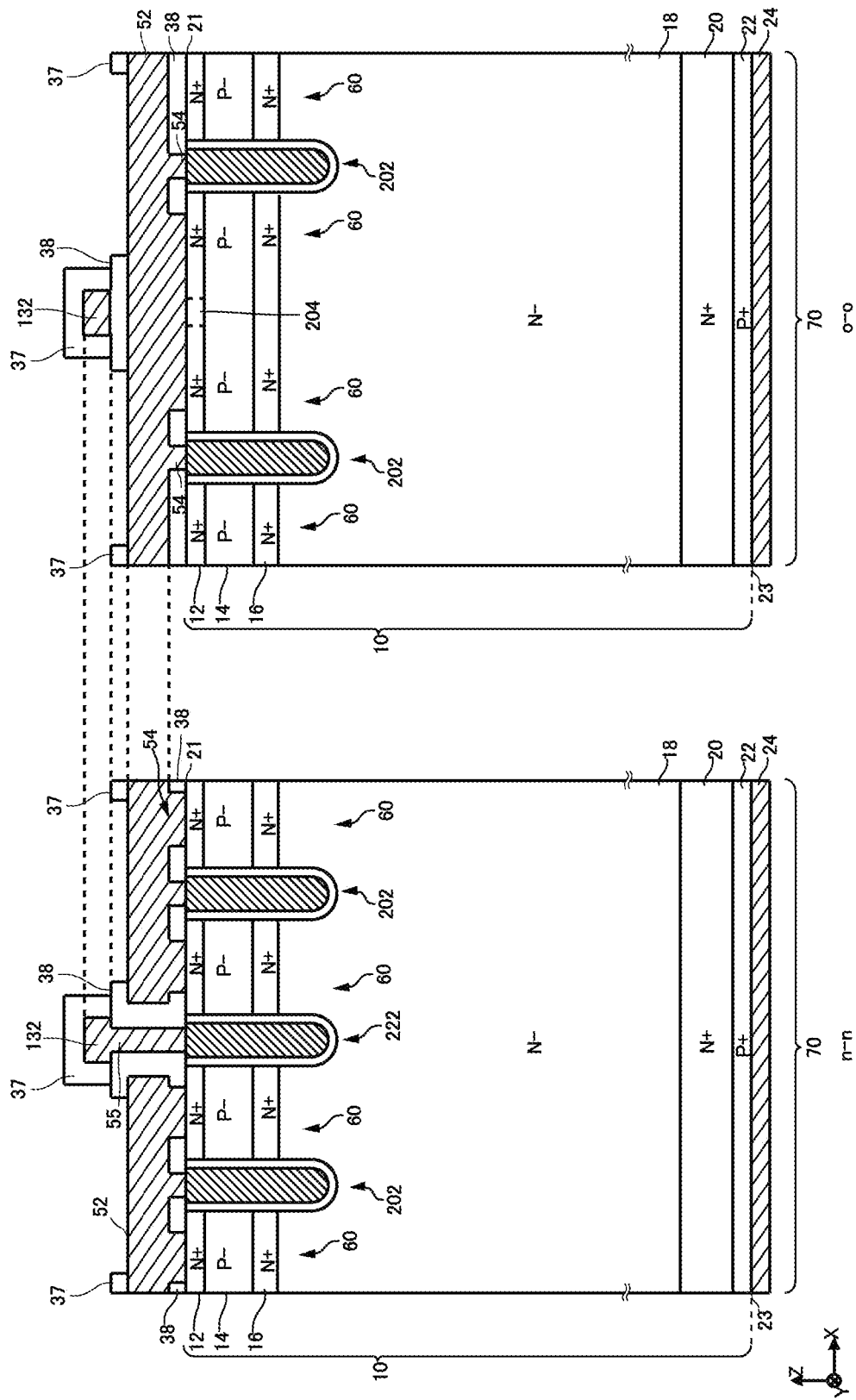
FIG. 27C is a diagram which illustrates another example of the cross section n-n and the cross section o-o in FIG. 27A.

FIG. 27C is a diagram which illustrates another example of the cross section n-n and the cross section o-o in FIG. 27A. The semiconductor device 100 of the present example is different from the example of FIG. 27B in not including the terminal layer 52-1 and the contact hole 57. The other structures are similar to the example of FIG. 27B. In the present example, the substrate connection layer 52-2 in FIG. 27B is referred to as the emitter electrode 52.

The partial trench wiring 132 of the present example is arranged above the emitter electrode 52. The partial trench wiring 132 is insulated from the emitter electrode 52 by the interlayer dielectric film 38. The upper surface and the sides of the partial trench wiring 132 may also be covered with the interlayer dielectric film 38 or the protective film 37.

Figure 28A:
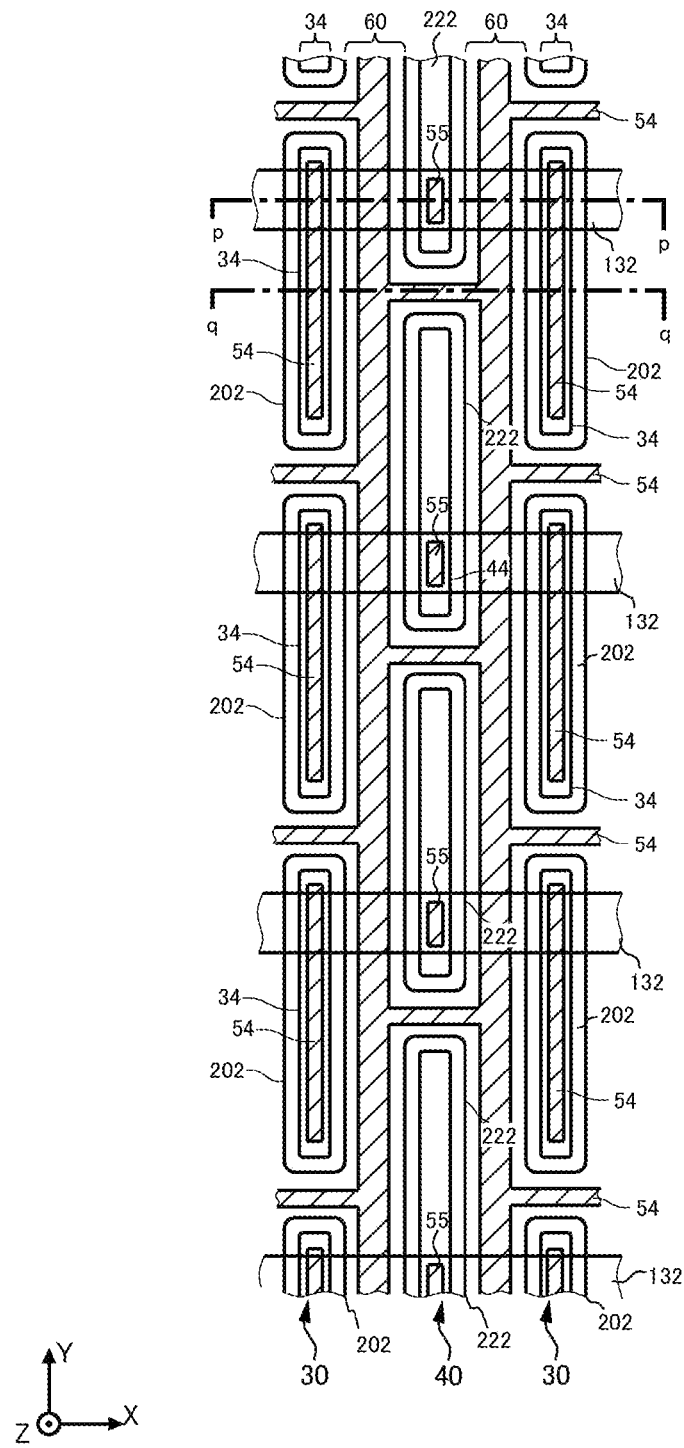
FIG. 28A illustrates a top view of the semiconductor device 100.
Figure 28B:
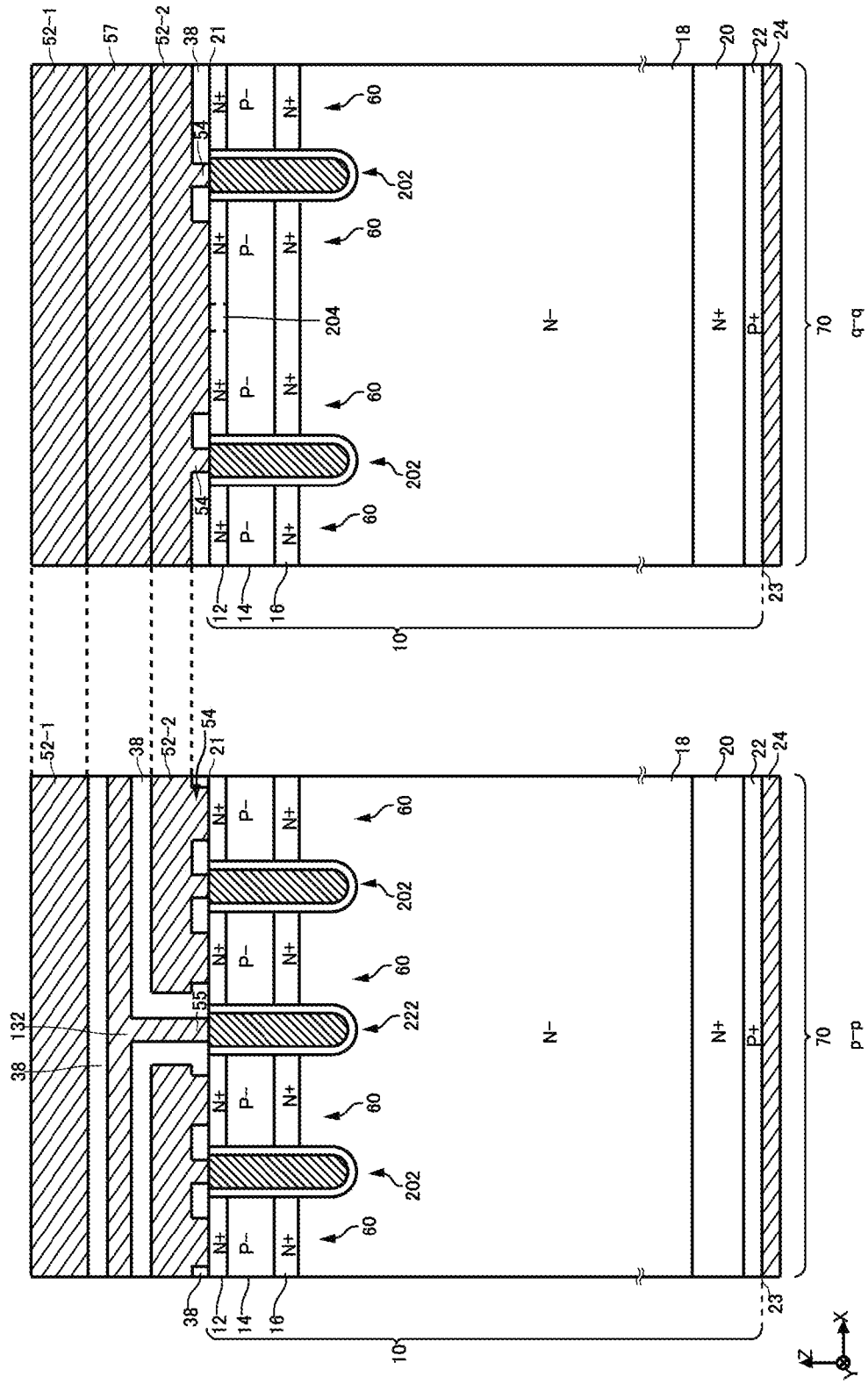
FIG. 28B is a diagram which illustrates a cross section p-p and a cross section q-q in FIG. 28A.

FIG. 28A and FIG. 28B are diagrams which illustrate another exemplary arrangement of the emitter electrode 52 and the partial trench wiring 132 above the upper surface 21 of the semiconductor substrate 10. FIG. 28A illustrates a top view of the semiconductor device 100. In the semiconductor device 100 of the present example, each trench portion and the partial trench wiring 132 are arranged in the similar manner to the example of FIG. 20. FIG. 28B is a diagram which illustrates a cross section p-p and a cross section q-q in FIG. 28A. The cross section p-p is the XZ plane which extends through the partial trench 202 and the partial trench 222. The cross section q-q is the XZ plane which extends through the first inter-trench region 204.

As illustrated in FIG. 28B, the emitter electrode 52 of the present example also includes the terminal layer 52-1 and the substrate connection layer 52-2 in the similar manner to the example of FIG. 27B. The interlayer dielectric film 38 and the partial trench wiring 132 are provided between the terminal layer 52-1 and the substrate connection layer 52-2. The terminal layer 52-1 connects a plurality of substrate connection layers 52-2 separated by the interlayer dielectric film 38 and the partial trench wiring 132 in the Y axis direction with one another. The interlayer dielectric film 38 is provided with a contact hole 57 to connect the terminal layer 52-1 to the substrate connection layer 52-2. The emitter electrode 52 also fills the inside of the contact hole 57.

The partial trench wiring 132 is insulated from the emitter electrode 52 by the interlayer dielectric film 38. As illustrated in the cross section p-p, the partial trench wiring 132 is connected to the partial trench 222 through the contact hole 55 provided in the interlayer dielectric film 38. A region through which the contact hole 55 extends is not provided with the substrate connection layer 52-2.

In addition, as illustrated in the cross section q-q, the first inter-trench region 204 connects to the substrate connection layer 52-2. That is, the substrate connection layer 52-2 is provided between the first inter-trench region 204 and the partial trench wiring 132. In the present example, the partial trench wiring 132 is not provided above the first inter-trench region 204. In this manner, three layer of the substrate connection layer 52-2, the partial trench wiring 132 and the terminal layer 52-1 are provided such that the first inter-trench region 204 can also connect to the emitter electrode 52. This can enlarge a region which functions as a transistor device.

As illustrated in FIG. 28A and FIG. 28B, the contact hole 54 provided in the partial trench 202 of the present example may also be arranged below the partial trench wiring 132. This can increase a connection area between the partial trench 202 and the substrate connection layer 52-2.

In addition, the partial trench wiring 132 may include a branch portion (not shown) which protrudes along the partial trench 222 in the Y axis direction. The contact hole 55 may also be provided between the branch portion and the partial trench 222. The branch portion may connect two partial trench wirings 132 adjacent in the Y axis direction. That is, the partial trench wiring 132 may have a meshed shape such that portions extending in the X axis direction and the branch portions extending in the Y axis direction intersect.

Figure 28C:
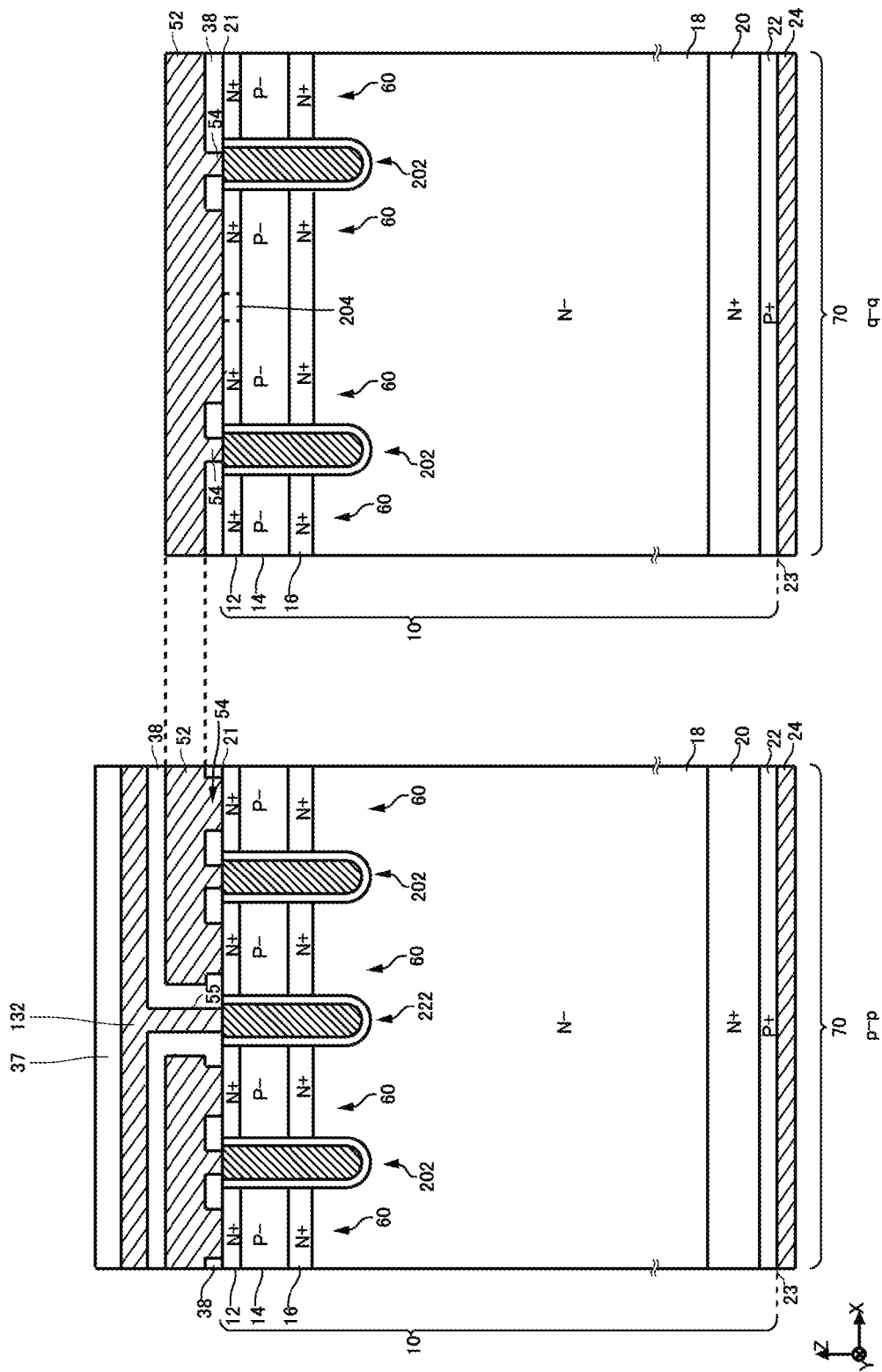
FIG. 28C is a diagram which illustrates another example of the cross section p-p and the cross section q-q in FIG. 28A.

FIG. 28C is a diagram which illustrates another example of the cross section p-p and the cross section q-q in FIG. 28A. The semiconductor device 100 of the present example is different from the example of FIG. 28B in not including the terminal layer 52-1 and the contact hole 57. The other structures are similar to the example of FIG. 28B. In the present example, the substrate connection layer 52-2 in FIG. 28B is referred to as the emitter electrode 52.

The partial trench wiring 132 of the present example is arranged above the emitter electrode 52. The partial trench wiring 132 is insulated from the emitter electrode 52 by the interlayer dielectric film 38. The upper surface and the sides of the partial trench wiring 132 may also be covered with the interlayer dielectric film 38 or the protective film 37.

Note that, while the inter-trench region is described using the first inter-trench region 204 or the second inter-trench region 206 in each example, the first inter-trench region 204 may be replaced with the second inter-trench region 206 and second inter-trench region 206 may be replaced with the first inter-trench region 204.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 11: well region, 12: emitter region, 14: base region, 15: contact region, 16: accumulation region, 18: drift region, 20: buffer region, 21: upper surface, 22: collector region, 23: lower surface, 24: collector electrode, 29: linear portion, 30: dummy trench portion, 31: edge portion, 32: dummy insulating film, 34: dummy conductive portion, 36: insulating film, 37: protective film, 38: interlayer dielectric film, 39: linear portion, 40: gate trench portion, 41: edge portion, 42: gate insulating film, 44: gate conductive portion, 52: emitter electrode, 54, 55, 57: contact hole, 60, 61: mesa portion, 70: transistor portion, 80: diode portion, 81: extended region, 82: cathode region, 90: edge termination structure portion, 92: guard ring, 94: field plate, 100: semiconductor device, 102: end side, 112: gate pad, 130: outer peripheral gate runner, 131: active side gate runner, 132: partial trench wiring, 140: outer peripheral well region, 141: active side well region, 160: active portion, 174: channel stopper, 202: partial trench, 204: first inter-trench region, 206: second inter-trench region, 208: embedded trench, 210: equipotential plane, 212: protruding portion, 222: partial trench

What is claimed is:

1. A semiconductor device comprising:
   a semiconductor substrate including a drift region of a first conductivity type;
   an inner region including a base region of a second conductivity type provided between an upper surface of the semiconductor substrate and the drift region; and
   well regions having a higher doping concentration than that of the base region, provided from the upper surface of the semiconductor substrate to a depth position greater than a lower end of the base region, and arranged with the inner region interposed therebetween at the upper surface of the semiconductor substrate, wherein:
   the inner region includes a longitudinal side in a predetermined longitudinal direction at the upper surface of the semiconductor substrate and includes a plurality of trench portions which extend from the upper surface of the semiconductor substrate to the drift region,
   at least one of the trench portions is separated into two or more partial trenches in the longitudinal direction, in a region which does not overlap the well regions,
   the inner region includes a diode portion,
   the diode portion includes a first inter-trench region of the first conductivity type provided between two of the two or more partial trenches adjacent to each other in the longitudinal direction and in contact with the upper surface of the semiconductor substrate, and
   a distance between two of the two or more partial trenches arranged with the first inter-trench region interposed therebetween in the longitudinal direction is smaller than a distance between two of the partial trenches adjacent to each other in a direction orthogonal to the longitudinal direction.

2. The semiconductor device according to claim 1, wherein:
   the inner region includes a transistor portion including a gate trench portion to which a gate voltage is applied,
   the diode portion includes at least one dummy trench portion to which an emitter voltage is applied, and
   the at least one dummy trench portion in the diode portion includes at least one of the two or more partial trenches.

3. The semiconductor device according to claim 2, wherein the at least one dummy trench portion of the diode portion is separated into the two or more partial trenches in the longitudinal direction.

4. The semiconductor device according to claim 2, wherein
   the diode portion includes a cathode region of the first conductivity type provided in contact with a lower surface of the semiconductor substrate and having a higher doping concentration than that of the drift region, and
   one of the two or more partial trenches is separated from another one of the two or more partial trenches above the cathode region.

5. The semiconductor device according to claim 3, wherein
   the diode portion includes a cathode region of the first conductivity type provided in contact with a lower surface of the semiconductor substrate and having a higher doping concentration than that of the drift region, and
   one of the two or more partial trenches is separated from another one of the two or more partial trenches above the cathode region.

6. The semiconductor device according to claim 1, wherein the diode portion includes regions of the second conductivity type which interpose the first inter-trench region therebetween in a direction orthogonal to the longitudinal direction of the upper surface of the semiconductor substrate.

7. The semiconductor device according to claim 1, wherein the diode portion includes regions of the first conductivity type which interpose the first inter-trench region therebetween in a direction orthogonal to the longitudinal direction of the upper surface of the semiconductor substrate.

8. The semiconductor device according to claim 1, wherein
the diode portion further includes a second inter-trench region of the second conductivity type provided between two of the two or more partial trenches adjacent to each other in the longitudinal direction and in contact with the upper surface of the semiconductor substrate, and
the first inter-trench region is arranged more distant from the transistor portion than the second inter-trench region.

9. The semiconductor device according to claim 1, wherein the diode portion includes a second inter-trench region of the second conductivity type provided between two of the two or more partial trenches adjacent to each other in the longitudinal direction and in contact with the upper surface of the semiconductor substrate.

10. The semiconductor device according to claim 1, wherein the inner region includes:
an embedded trench provided below the first inter-trench region and connecting two of the two or more partial trenches.

11. The semiconductor device according to claim 1, wherein
two of the two or more partial trenches arranged with the first inter-trench region interposed therebetween in a direction orthogonal to the longitudinal direction are arranged at a first interval, and
a distance between two of the two or more partial trenches arranged with the first inter-trench region interposed therebetween in the longitudinal direction is smaller than the first interval.

12. A semiconductor device comprising:
a semiconductor substrate including a drift region of a first conductivity type;
an inner region including a base region of a second conductivity type provided between an upper surface of the semiconductor substrate and the drift region; and
well regions having a higher doping concentration than that of the base region, provided from the upper surface of the semiconductor substrate to a depth position greater than a lower end of the base region, and arranged with the inner region interposed therebetween at the upper surface of the semiconductor substrate, wherein:
the inner region includes a longitudinal side in a predetermined longitudinal direction at the upper surface of the semiconductor substrate and includes a plurality of trench portions which extend from the upper surface of the semiconductor substrate to the drift region,
at least one of the trench portions is separated into two or more partial trenches in the longitudinal direction, in a region which does not overlap the well regions,
the inner region includes a diode portion,
the diode portion includes a first inter-trench region of the first conductivity type provided between two of the two or more partial trenches adjacent to each other in the longitudinal direction and in contact with the upper surface of the semiconductor substrate, and
a distance between two of the two or more partial trenches arranged with the inter-trench region interposed therebetween in the longitudinal direction is smaller than a width of at least one of the two or more partial trenches in a direction orthogonal to the longitudinal direction.

13. The semiconductor device according to claim 1, wherein
the inner region includes a transistor portion including a gate trench portion to which a gate voltage is applied and at least one dummy trench portion to which an emitter voltage is applied, wherein
the at least one dummy trench portion in the transistor portion includes at least one of the two or more partial trenches.

14. The semiconductor device according to claim 13, wherein the at least one dummy trench portion of the transistor portion is separated into the two or more partial trenches in the longitudinal direction.

15. The semiconductor device according to claim 1, wherein
the inner region includes a transistor portion including a gate trench portion to which a gate voltage is applied, and
the at least one gate trench portion in the transistor portion includes the two or more partial trenches.

16. The semiconductor device according to claim 15, wherein the at least one gate trench portion of the transistor portion is separated into the two or more partial trenches in the longitudinal direction.

17. The semiconductor device according to claim 1, wherein
the two or more partial trenches includes at least one conductive portion, and
the at least one conductive portion of the two or more partial trenches adjacent to each other in the longitudinal direction are connected to the same electrode.

18. The semiconductor device according to claim 17, wherein the at least one conductive portion of the two or more partial trenches adjacent to each other in the longitudinal direction have the same potential.

19. The semiconductor device according to claim 12, wherein:
the inner region includes a transistor portion including a gate trench portion to which a gate voltage is applied,
the diode portion includes at least one dummy trench portion to which an emitter voltage is applied, and
the at least one dummy trench portion in the diode portion includes at least one of the two or more partial trenches.

20. The semiconductor device according to claim 19, wherein the at least one dummy trench portion of the diode portion is separated into the two or more partial trenches in the longitudinal direction.

* * * * *